(12) United States Patent
Yamamoto

(10) Patent No.: US 11,741,897 B2
(45) Date of Patent: Aug. 29, 2023

(54) DISPLAY DEVICE AND METHOD FOR DRIVING SAME

(71) Applicant: SHARP KABUSHIKI KAISHA, Sakai (JP)

(72) Inventor: Kaoru Yamamoto, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 48 days.

(21) Appl. No.: 17/603,531

(22) PCT Filed: May 14, 2019

(86) PCT No.: PCT/JP2019/019060
§ 371 (c)(1),
(2) Date: Oct. 13, 2021

(87) PCT Pub. No.: WO2020/230260
PCT Pub. Date: Nov. 19, 2020

(65) Prior Publication Data
US 2022/0148509 A1 May 12, 2022

(51) Int. Cl.
*G09G 3/32* (2016.01)
*G09G 3/3233* (2016.01)

(52) U.S. Cl.
CPC ... *G09G 3/3233* (2013.01); *G09G 2310/0286* (2013.01); *G09G 2310/061* (2013.01); *G09G 2320/0214* (2013.01); *G09G 2320/0295* (2013.01); *G09G 2320/043* (2013.01)

(58) Field of Classification Search
CPC ............... G09G 3/3233; G09G 3/3266; G09G 2320/0242; G09G 2320/0295; G09G 2320/045; G09G 2310/0289; G09G 2300/043; G09G 2310/0202; G09G 2310/0243; G09G 2310/0264; G09G 2310/0278; G09G 3/30
See application file for complete search history.

(56) References Cited

U.S. PATENT DOCUMENTS

| 10,770,007 B2* | 9/2020 | Kim .................. G09G 3/3291 |
| 2008/0079001 A1 | 4/2008 | Umezaki et al. |
| 2017/0186373 A1* | 6/2017 | Nishikawa ........... G09G 3/3258 |

FOREIGN PATENT DOCUMENTS

| JP | 2008-107807 A | 5/2008 |
| WO | 2015/190407 A1 | 12/2015 |

* cited by examiner

*Primary Examiner* — Ricardo Osorio
(74) *Attorney, Agent, or Firm* — ScienBiziP, P.C.

(57) ABSTRACT

With regard to a display device having an external compensation function, the occurrence of operational failure caused by off-leakage at a transistor is suppressed. A unit circuit configuring a gate driver is provided with a stabilization transistor including a control terminal, a first conduction terminal connected to a first internal node, and a second conduction terminal connected to a first control signal line, a stabilization circuit-configured to control a potential of the control terminal of the stabilization transistor-based on a potential of the first internal node, a first reset transistor including a control terminal, a first conduction terminal connected to a second output terminal, and a second conduction terminal connected to a first reference potential line, and a reset circuit configured to control a potential of the control terminal of the first reset transistor based on the potential of the first internal node.

19 Claims, 67 Drawing Sheets

DISPLAY DEVICE AND METHOD FOR DRIVING SAME

TECHNICAL FIELD

The present disclosure relates to a display device and a method for driving the same, and more specifically, relates to a display device provided with a pixel circuit including a display element to be driven by a current of an organic EL element, or the like, and a method for driving the same.

BACKGROUND ART

In recent years, organic ElectroLuminescence (EL) display devices provided with pixel circuits including organic EL elements have been coming into practical use. The organic EL elements are also called Organic Light-Emitting Diodes (OLEDs), each of which is a self-luminous type display element configured to emit light at a luminance depending on a current flowing in itself. Thus, since the organic EL elements are the self-luminous type display elements, the organic EL display devices can be easily thinned, reduced in power consumption, increased in luminance, and the like, as compared with liquid crystal display devices requiring backlights, color filters, and the like.

An active matrix type organic EL display device is formed with a plurality of pixel circuits arranged in a matrix shape. Each pixel circuit includes a drive transistor that controls supplying a current to an organic EL element. A Thin Film Transistor (TFT) is typically used as the drive transistor. However, as for the thin film transistor, a threshold voltage changes due to deterioration. A display portion of the organic EL display device is provided with a large number of drive transistors, and since the deterioration degree is different for each drive transistor, variations in the threshold voltage occur. As a result, variations in luminance occur, and display quality is degraded. Furthermore, with regard to the organic EL element, current efficiency decreases over time. In other words, the luminance gradually decreases over time, even in a case where a constant current is supplied to the organic EL element. As a result, image sticking occurs. As described above, in the active matrix type organic EL display device, processing for compensating for deterioration of the drive transistors or deterioration of the organic EL elements is performed in the related art.

An external compensation method is known as one of the methods of compensation processing. According to the external compensation method, a current flowing through each of the drive transistors or organic EL elements under predetermined conditions is measured by a circuit provided outside the pixel circuits. Then, an input image signal is corrected based on the measurement result. As a result, deterioration of the drive transistors and deterioration of the organic EL elements are compensated.

Note that, in the following, a series of processes in which a current flowing in each of the pixel circuits is measured outside the pixel circuits, in order to compensate for the deterioration of the drive transistors or organic EL elements (display elements), is referred to as "monitoring processing", and a period in which the monitoring processing is performed is referred to as a "monitoring period". In addition, a row that is a target of the monitoring processing during a unit period such as one frame period is referred to as a "monitoring row," and a row other than the monitoring row is referred to as a "non-monitoring row". Furthermore, characteristics of the drive transistor provided in the pixel circuit are referred to as "TFT characteristics", and characteristics of the organic EL element provided in the pixel circuit are referred to as "OLED characteristics". Additionally, charging a holding capacitor (capacitor) in the pixel circuit by applying a desired potential (voltage) to a data signal line is referred to as "writing", and writing to a plurality of pixel circuits included in an i-th row (i is an integer) is simply referred to as "writing to the i-th row".

Note that an invention related to an organic EL display device adopting the external compensation method is disclosed in WO 2015/190407, for example. The active matrix type organic EL display device includes a gate driver (scanning signal line drive circuit) configured to drive a plurality of scanning signal lines disposed in the display portion, and the gate driver is configured of a shift register including a plurality of stages (a plurality of unit circuits) corresponding to the plurality of scanning signal lines in a one-to-one manner. FIG. 63 is a circuit diagram illustrating a configuration of a unit circuit in a known organic EL display device to which the external compensation method is adopted. With regard to the configuration illustrated in FIG. 63, for example, an output signal Q1 output from an output terminal 57 is provided to another unit circuit, and is provided to a scanning signal line as a scanning signal, and an output signal Q2 output from an output terminal 58 is provided to a monitoring control line disposed in a display portion as a monitoring control signal for controlling whether monitoring processing can be performed or not. Additionally, the unit circuit includes a transistor T13 related to controlling the output signal Q1 and a transistor T16 related to controlling the output signal Q2, and is provided with a transistor T15 between a first internal node N1 connected to a control terminal of the transistor T13 and a second internal node N2 connected to a control terminal of the transistor T16. A high-level potential VDD that is a fixed potential is applied to a control terminal of the transistor T15 (see a portion denoted by a reference sign 9 in FIG. 63). This maintains the transistor T15 in an on state except when a potential of the first internal node N1 or the second internal node N2 is higher than a normal high level.

FIG. 64 is a signal waveform diagram for describing an operation of the unit circuit at the i-th stage when writing to the i-th row (writing for image display) is performed. When a set signal S is at a high level in a period P900, a capacitor C11 is charged to increase the potential of the first internal node N1. At this time, since the transistor T15 is in the on state, a capacitor C12 is also charged to increase the potential of the second internal node N2. In a period P901, a first clock CKA changes from a low level to a high level. This causes the first internal node N1 to be in a boost state due to the presence of the capacitor C11, and the potential of the output signal Q1 is sufficiently increased. As a result, writing for the image display is performed by the pixel circuits in the i-th row. Note that, since an enable signal EN is maintained at a low level in the period P901, the output signal Q2 is maintained at a low level. In a period P902, a reset signal R is set to a high level. As a result, the transistor T12 is turned on, and the potential of the first internal node N1 and the potential of the second internal node N2 are set to a low level.

FIG. 65 is a signal waveform diagram for describing an operation of the unit circuit at the i-th stage when the monitoring processing is performed. Note that the i-th row is assumed to be a monitoring row. When the set signal S is at the high level in a period P910, similar to the above-described period P900, the potential of the first internal node N1 and the potential of the second internal node N2 increase. In a period P911, a first clock CKA changes from a low level to a high level. As a result, similar to the above-described period P901, the first internal node N1 becomes in the boost state, and the potential of the output signal Q1 is sufficiently increased. Further, in the period P911, the enable signal EN also changes from the low level to the high level. This causes the second internal node N2 to be in a boost state due to the presence of the capacitor C12, and the potential of the output signal Q2 is sufficiently increased. When a period P912 starts, the enable signal EN changes from the high level to the low level. According to this, the potential of the output signal Q2 and the potential of the second internal node N2 decrease. Note that initialization of the pixel circuit is performed in the period P911, and writing for characteristic detection is performed in the pixel circuit in the i-th row in the period P912. When the period P912 ends, the first clock CKA changes from the high level to the low level. As a result, the potential of the output signal Q1 and the potential of the first internal node N1 are decreased. When a period P913 starts, the enable signal EN changes from the low level to the high level. With this, similar to the period P911, the second internal node N2 becomes in the boost state, and the potential of the output signal Q2 is sufficiently increased. In the period P913, reading the current flowing in the pixel circuit is performed. When the period P913 ends, the enable signal EN changes from the high level to the low level. According to this, the potential of the output signal Q2 and the potential of the second internal node N2 decrease. When a period P914 starts, the first clock CKA changes from the low level to the high level, the first internal node N1 becomes in the boost state, and the potential of the output signal Q1 is sufficiently increased. In the period P914, writing for the image display is performed in the pixel circuit in the i-th row. In a period P915, the reset signal R is set to a high level. As a result, similar to the above-described period P902, the potential of the first internal node N1 and the potential of the second internal node N2 are set to the low level.

In a known organic EL display device, the writing for image display and the monitoring processing are performed as described above, and deterioration of the drive transistor and deterioration of the organic EL element are compensated by correcting an input image signal based on the result of the monitoring processing.

CITATION LIST

Patent Literature

PTL 1: WO 2015/190407

SUMMARY

Technical Problem

However, according to the known configuration, operational failure caused by off-leakage at a transistor in the unit circuit may occur during the monitoring processing. This will be described below.

With regard to the monitoring processing, in order to accurately detect the degree of deterioration of the drive transistor or the organic EL element, a period having a length sufficient to read the current flowing in the pixel circuit (the period P913 in FIG. 65) needs to be provided. However, when the period P913 is long, because of off-leakage at the transistors T11 and T12 (see FIG. 63) in the unit circuit, the potentials of the first internal node N1 and the second internal node N2 decrease in the period P913, as indicated by the thick dotted lines denoted by a reference sign 91 in FIG. 66. Due to this, in the period P913, the potential of the output signal Q2 decreases, as indicated by the thick dotted line denoted by a reference sign 92 in FIG. 66. Thus, reading failure of the current occurs. As a result, a result of the monitoring processing is abnormal, and the operational failure occurs.

In addition, in the above-described period P913, in a unit circuit 94 corresponding to the monitoring row, the potential of the output signal Q2 needs to be maintained at the high level, while in a unit circuit 93 corresponding to the non-monitoring row, the potential of the output signal Q2 needs to be maintained at the low level (see FIG. 67). However, since the enable signal EN is maintained at the high level in the above-described period P913, off-leakage may occur at the transistor T16 in the unit circuit 93 corresponding to the non-monitoring row in the period P913 (see the arrow denoted by a reference sign 95 in FIG. 67). When such off-leakage occurs, as illustrated in FIG. 68, in the period P913, the potential of the output signal Q2 output from the unit circuit 93 corresponding to the non-monitoring row increases. In this way, noise is generated in the monitoring control line corresponding to the non-monitoring row, and misreading of the current occurs. As a result, a result of the monitoring processing is abnormal, and the operational failure occurs.

Thus, the following disclosure relates to a display device having an external compensation function, and an object thereof is to suppress the occurrence of operational failure caused by off-leakage at a transistor.

Solution to Problem

A display device according to some embodiments of the present disclosure includes a pixel circuit including a display element configured to be driven by a current and a drive transistor configured to control a drive current of the display element and has a function of performing monitoring processing being a series of processes of measuring a current flowing in the pixel circuit outside the pixel circuit to compensate for deterioration of the drive transistor or the display element, the display device including a display portion including a pixel matrix including n rows and m columns, the pixel matrix including n×m number of the pixel circuits, where each of n and m is an integer being equal to or larger than two, a scanning signal line provided corresponding to each of the rows of the pixel matrix, and a data signal line provided corresponding to each of the columns of the pixel matrix, a data signal line drive circuit configured to apply a data signal to the data signal line, a scanning signal line drive circuit configured to apply a scanning signal to the scanning signal line, a first control signal line, a control circuit configured to control a potential of the first control signal line, and a first reference potential line configured to supply a first reference potential.

The scanning signal line drive circuit is configured of a shift register including a plurality of unit circuits each connected to the corresponding scanning signal line, and each of the plurality of unit circuits includes a first output control circuit including a first internal node, a first output terminal connected to another unit circuit, and a first output control transistor including a control terminal connected to the first internal node, a first conduction terminal, and a second conduction terminal connected to the first output terminal, a second output control circuit including a second internal node to be applied with a potential having a logical level identical to a logical level of the first internal node, a second output terminal configured to output an on level signal for at least a part of a monitoring period for which the monitoring processing is performed, and a second output control transistor including a control terminal connected to the second internal node, a first conduction terminal, and a second conduction terminal connected to the second output terminal, a first internal node control transistor including a control terminal to be supplied with a signal for causing a potential of the first internal node to be at an off level, a first conduction terminal connected to the first internal node, and a second conduction terminal connected to the first control signal line, a stabilization transistor including a control terminal, a first conduction terminal connected to the first internal node, and a second conduction terminal connected to the first control signal line, a stabilization circuit configured to control a potential of the control terminal of the stabilization transistor, based on the potential of the first internal node, a first reset transistor including a control terminal, a first conduction terminal connected to the second output terminal, and a second conduction terminal connected to the first reference potential line, and a reset circuit connected to the first reference potential line and configured to control a potential of the control terminal of the first reset transistor, based on the potential of the first internal node or a potential of the second internal node.

A display device according to some other embodiments of the present disclosure includes a pixel circuit including a display element configured to be driven by a current and a drive transistor configured to control a drive current of the display element and has a function of performing monitoring processing being a series of processes of measuring a current flowing in the pixel circuit outside the pixel circuit to compensate for deterioration of the drive transistor or the display element, the display device including a display portion including a pixel matrix including n rows and m columns, the pixel matrix including n×m number of the pixel circuits, where each of n and m is an integer being equal to or larger than two, a scanning signal line provided corresponding to each of the rows of the pixel matrix, and a data signal line provided corresponding to each of the columns of the pixel matrix, a data signal line drive circuit configured to apply a data signal to the data signal line, a scanning signal line drive circuit configured to apply a scanning signal to the scanning signal line, a first control signal line, a control circuit configured to control a potential of the first control signal line, and a first reference potential line configured to supply a first reference potential.

The scanning signal line drive circuit is configured of a shift register including a plurality of unit circuits each connected to the corresponding scanning signal line, and each of the plurality of unit circuits includes a first output control circuit including a first internal node, a first output terminal connected to another unit circuit, and a first output control transistor including a control terminal connected to the first internal node, a first conduction terminal, and a second conduction terminal connected to the first output terminal, a second output control circuit including a second internal node to be applied with a potential having a logical level identical to a logical level of the first internal node, a second output terminal configured to output an on level signal for at least a part of a monitoring period for which the monitoring processing is performed, and a second output control transistor including a control terminal connected to the second internal node, a first conduction terminal, and a second conduction terminal connected to the second output terminal, a first internal node control transistor including a control terminal to be supplied with a signal for causing a potential of the first internal node to be at an off level, a first conduction terminal connected to the first internal node, and a second conduction terminal connected to the first control signal line, a stabilization transistor including a control terminal, a first conduction terminal connected to the first internal node, and a second conduction terminal connected to the first control signal line, and a stabilization circuit configured to control a potential of the control terminal of the stabilization transistor, based on the potential of the first internal node.

A display device according to still some other embodiments of the present disclosure includes a pixel circuit including a display element configured to be driven by a current and a drive transistor configured to control a drive current of the display element and has a function of performing monitoring processing being a series of processes of measuring a current flowing in the pixel circuit outside the pixel circuit to compensate for deterioration of the drive transistor or the display element, the display device including a display portion including a pixel matrix including n rows and m columns, the pixel matrix including n–m number of the pixel circuits, where each of n and m is an integer being equal to or larger than two, a scanning signal line provided corresponding to each of the rows of the pixel matrix, and a data signal line provided corresponding to each of the columns of the pixel matrix, a data signal line drive circuit configured to apply a data signal to the data signal line, a scanning signal line drive circuit configured to apply a scanning signal to the scanning signal line, and a first reference potential line configured to supply a first reference potential.

The scanning signal line drive circuit is configured of a shift register including a plurality of unit circuits each connected to the corresponding scanning signal line, and each of the plurality of unit circuits includes a first output control circuit including a first internal node, a first output terminal connected to another unit circuit, and a first output control transistor including a control terminal connected to the first internal node, a first conduction terminal, and a second conduction terminal connected to the first output terminal, a second output control circuit including a second internal node to be applied with a potential having a logical level identical to a logical level of the first internal node, a second output terminal configured to output an on level signal for at least a part of a monitoring period for which the monitoring processing is performed, and a second output control transistor including a control terminal connected to the second internal node, a first conduction terminal, and a second conduction terminal connected to the second output terminal, a first reset transistor including a control terminal, a first conduction terminal connected to the second output terminal, and a second conduction terminal connected to the first reference potential line, and a reset circuit connected to the first reference potential line and configured to control a potential of the control terminal of the first reset transistor, based on the potential of the first internal node or a potential of the second internal node.

A driving method (of a display device) according to some embodiments of the present disclosure is a method for driving a display device including a pixel circuit including a display element configured to be driven by a current and a drive transistor configured to control a drive current of the display element, the display device including a display portion including a pixel matrix including n rows and m columns, the pixel matrix including n×m number of the pixel circuits, where each of n and m is an integer being equal to or larger than two, a scanning signal line provided corresponding to each of the rows of the pixel matrix, and a data signal line provided corresponding to each of the columns of the pixel matrix, a data signal line drive circuit configured to apply a data signal to the data signal line, a scanning signal line drive circuit configured to apply a scanning signal to the scanning signal line, a first control signal line, and a first reference potential line configured to supply a first reference potential, the driving method including a scanning step of performing scanning of the scanning signal line to write a data signal for image display applied to the data signal line to each of the pixel circuits by the data signal line driving circuit, and a monitoring step of performing monitoring processing being a series of processes of measuring a current flowing in the pixel circuit outside the pixel circuit to compensate for deterioration of the drive transistor or the display element.

The scanning signal line drive circuit is configured of a shift register including a plurality of unit circuits each connected to the corresponding scanning signal line, each of the plurality of unit circuits includes a first output control circuit including a first internal node, a first output terminal connected to another unit circuit, and a first output control transistor including a control terminal connected to the first internal node, a first conduction terminal, and a second conduction terminal connected to the first output terminal, a second output control circuit including a second internal node to be applied with a potential having a logical level identical to a logical level of the first internal node, a second output terminal configured to output an on level signal for at least a part of a monitoring period for which the monitoring processing is performed, and a second output control transistor including a control terminal connected to the second internal node, a first conduction terminal, and a second conduction terminal connected to the second output terminal, a first internal node control transistor including a control terminal to be supplied with a signal for causing a potential of the first internal node to be at an off level, a first conduction terminal connected to the first internal node, and a second conduction terminal connected to the first control signal line, a stabilization transistor including a control terminal, a first conduction terminal connected to the first internal node, and a second conduction terminal connected to the first control signal line, a stabilization circuit configured to control a potential of the control terminal of the stabilization transistor, based on the potential of the first internal node, a first reset transistor including a control terminal, a first conduction terminal connected to the second output terminal, and a second conduction terminal connected to the first reference potential line, and a reset circuit configured to control a potential of the control terminal of the first reset transistor, based on the potential of the first internal node or a potential of the second internal node, in the scanning step, the first reference potential is applied to the first control signal line, and in the monitoring step, a potential for causing the first output control transistor to be turned on is applied to the first control signal line in a part of a period for which the potential of the first internal node of a unit circuit corresponding to a target row of the monitoring processing is to be maintained at the potential for causing the first output control transistor to be turned on.

Advantageous Effects of Disclosure

According to some embodiments of the present disclosure, the unit circuit is provided with the stabilization transistor including the first conduction terminal connected to the first internal node and the second conduction terminal connected to the first control signal line, and the stabilization circuit configured to control the potential of the control terminal of the stabilization transistor. In addition, in the unit circuit, the second conduction terminal of the first internal node control transistor including the control terminal to be applied with the signal for causing the potential of the first internal node to be at the off level is connected to the first control signal line. Here, the potential of the first control signal line is controlled by the control circuit. Thus, the potential being the on level can be applied to the first control signal line so as to suppress the occurrence of off-leakage at the first internal node control transistor in each unit circuit corresponding to the monitoring row in a period when the output signal from the second output terminal of each unit circuit corresponding to the monitoring row is to be maintained at the on level. Further, the unit circuit is provided with the first reset transistor including the first conduction terminal connected to the second output terminal and the second conduction terminal connected to the first reference potential line, and the reset circuit configured to control the potential of the control terminal of the first reset transistor. Thus, during the monitoring period, the first reset transistor in each unit circuit corresponding to the non-monitoring row can be maintained in the on state so that an output signal from the second output terminal of each unit circuit corresponding to the non-monitoring row is maintained at an off level. As a result, in each unit circuit corresponding to the non-monitoring row, even when off-leakage occurs at the second output control transistor, the output signal from the second output terminal is maintained at the off level. As described above, as for the display device having the external compensation function, the occurrence of operational failure caused by off-leakage at the transistor is suppressed.

DESCRIPTION OF EMBODIMENTS

Embodiments will be described below with reference to the accompanying drawings. Note that, in the following description, it will be assumed that each of m and n is an integer equal to or larger than 2, i is an odd number equal to or larger than 3, and equal to or smaller than (n−2), and j is an integer equal to or larger than 1, and equal to or smaller than m.

1. First Embodiment 1.1 Overall Configuration

Figure 2:
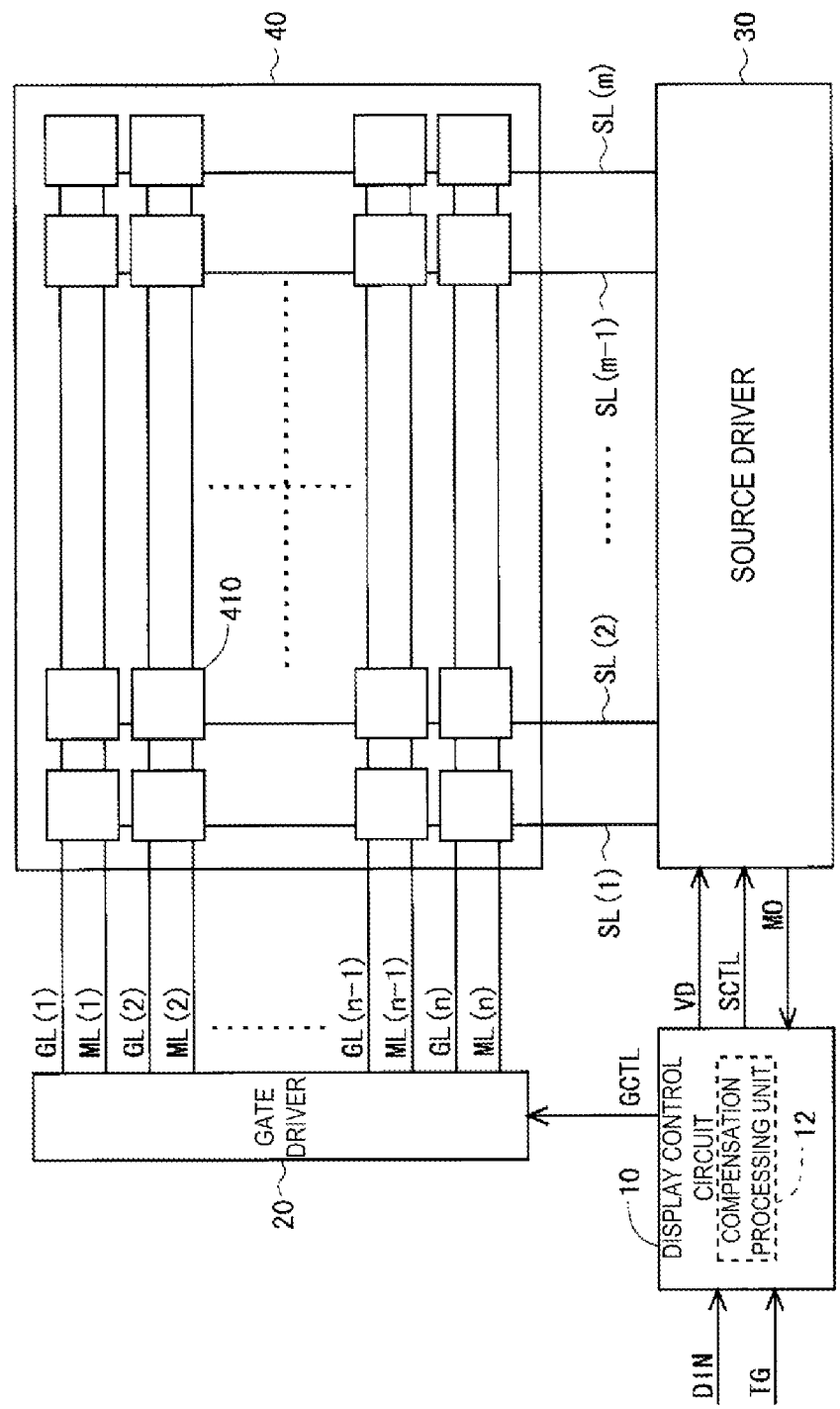
FIG. 2 is a block diagram illustrating an overall configuration of an organic EL display device according to the first embodiment described above.

FIG. 2 is a block diagram illustrating an overall configuration of an active-matrix type organic EL display device according to a first embodiment. The organic EL display device includes a display control circuit 10, a gate driver (scanning signal line drive circuit) 20, a source driver (data signal line drive circuit) 30, and a display portion 40. The display control circuit 10 includes a compensation processing unit 12 configured to compensate for deterioration of drive transistors and organic EL elements. In other words, the organic EL display device according to the present embodiment has an external compensation function. The gate driver 20 and the display portion 40 are integrally formed on a substrate configuring the display portion 40. That is, the gate driver 20 is formed to be monolithic.

In the display portion 40, m data signal lines SL(1) to SL(m) and n scanning signal lines GL(1) to GL(n) orthogonal to these data signal lines are arranged. Further, in the display portion 40, n monitoring control lines ML(1) to ML(n) are disposed so as to correspond one-to-one to the n scanning signal lines GL(1) to GL(n). The scanning signal lines GL(1) to GL(n) and the monitoring control lines ML(1) to ML(n) are typically parallel to each other. Furthermore, the display portion 40 is provided with (n×m) pixel circuits 410 corresponding to intersecting portions between the data signal lines SL(1) to SL(m) and the scanning signal lines GL(1) to GL(n). As a result, a pixel matrix of n rows and m columns is formed in the display portion 40. In the display portion 40, power source lines (not illustrated) that are common to the respective pixel circuits 410 are also disposed. To be more specific, a power source line that supplies a high-level power supply voltage ELVDD for driving the organic EL element (hereinafter, referred to as a "high-level power source line"), and a power source line that supplies a low-level power supply voltage ELVSS for driving the organic EL element (hereinafter, referred to as a "low-level power source line") are disposed. The high-level power supply voltage ELVDD, and the low-level power supply voltage ELVSS are supplied from a power source circuit (not illustrated).

Note that, in the following description, when necessary, scanning signals given to the scanning signal lines GL(1) to GL(n) are also denoted by reference signs GL(1) to GL(n), respectively, monitoring control signals given to the monitoring control lines ML(1) to ML(n) are also denoted by reference signs ML(1) to ML(n), respectively, and data signals given to the data signal lines SL(1) to SL(m) are also denoted by reference signs SL(1) to SL(m), respectively.

The display control circuit 10 receives an input image signal DIN and a group of timing signals (such as a horizontal synchronization signal and a vertical synchronization signal) TG that are transmitted from the outside, and outputs a digital video signal VD, a source control signal SCTL for controlling an operation of the source driver 30, and a gate control signal GCTL for controlling an operation of the gate driver 20. The source control signal SCTL includes a source start pulse signal, a source clock signal, a latch strobe signal, and the like. The gate control signal GCTL includes a gate start pulse signal, a gate clock signal, an enable signal, and the like. Note that the digital video signal VD for image display is generated by the compensation processing unit 12 performing compensation calculation processing on the input image signal DIN in accordance with monitoring data (data measured to obtain TFT characteristics and OLED characteristics) MO provided from the source driver 30.

The gate driver 20 is connected to the scanning signal lines GL(1) to GL(n) and the monitoring control lines ML(1) to ML(n). As will be described later, the gate driver 20 is configured of a shift register including a plurality of unit circuits. The gate driver 20 applies scanning signals to the scanning signal lines GL(1) to GL(n), and applies monitoring control signals to the monitoring control lines ML(1) to ML(n), based on the gate control signal GCTL output from the display control circuit 10.

Figure 3:
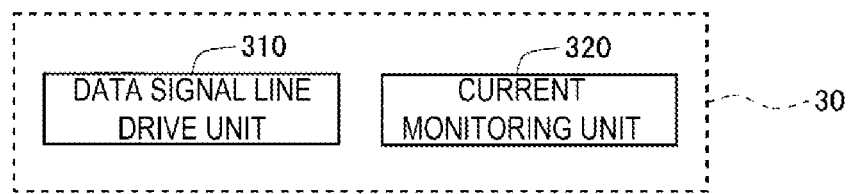
FIG. 3 is a diagram for describing a function of a source driver according to the first embodiment described above.

The source driver 30 is connected to the data signal lines SL(1) to SL(m). The source driver 30 selectively performs an operation of driving the data signal lines SL(1) to SL(m) and an operation of measuring a current flowing in each of the data signal lines SL(1) to SL(m). Specifically, as illustrated in FIG. 3, the source driver 30 functionally includes a portion configured to function as the data signal line drive unit 310 configured to drive the data signal lines SL(1) to SL(m) and a portion configured to function as a current monitoring unit 320 configured to measure currents output from the pixel circuits 410 to the data signal lines SL(1) to SL(m). The current monitoring unit 320 measures the currents flowing in the data signal lines SL(1) to SL(m), and outputs the monitoring data MO based on the measured values. As described above, in the present embodiment, the data signal lines SL(1) to SL(m) are used not only for transmission of data signals for image display, but also as signal lines configured to flow currents corresponding to the characteristics of the drive transistors or the organic EL elements during the monitoring processing. Note that a driving method called "DEMUX" can be employed in which an output (that is, a data signal) from the source driver 30 is shared with the plurality of data signal lines SL.

As described above, by applying scanning signals to the scanning signal lines GL(1) to GL(n), applying monitoring control signals to the monitoring control lines ML(1) to ML(n), and applying data signals serving as luminance signals to the data signal lines SL(1) to SL(m), an image based on the input image signal DIN is displayed on the display portion 40. In addition, since the monitoring processing is performed and the input image signal DIN is subjected to the compensation calculation processing in accordance with the monitoring data MO, the deterioration of the drive transistors or the organic EL elements is compensated.

1.2 Pixel Circuit and Source Driver

Next, the pixel circuits 410 and the source driver 30 will be described in detail. When the source driver 30 functions as the data signal line drive unit 310, the source driver 30 performs the following operations. The source driver 30 receives the source control signal SCTL output from the display control circuit 10, and applies voltages corresponding one-to-one to target luminance to m data signal lines SL(1) to SL(m) as data signals. At this time, the source driver 30 sequentially holds the digital video signals VD indicating respective voltages to be applied to the corresponding data signal lines SL at timings when pulses of source clock signals are generated with a pulse of a source start pulse signal being as a trigger. Then, at a timing when a pulse of a latch strobe signal is generated, the held digital video signals VD are converted into analog voltages. The converted analog voltages are simultaneously applied, as data signals, to all of the data signal lines SL(1) to SL(m). When the source driver 30 functions as the current monitoring unit 320, the source driver 30 applies appropriate voltages for monitoring processing as data signals to the data signal lines SL(1) to SL(m), and thereby converts respective currents flowing in the data signal lines SL(1) to SL(m) to voltages. The converted data is output from the source driver 30 as the monitoring data MO.

Figure 4:
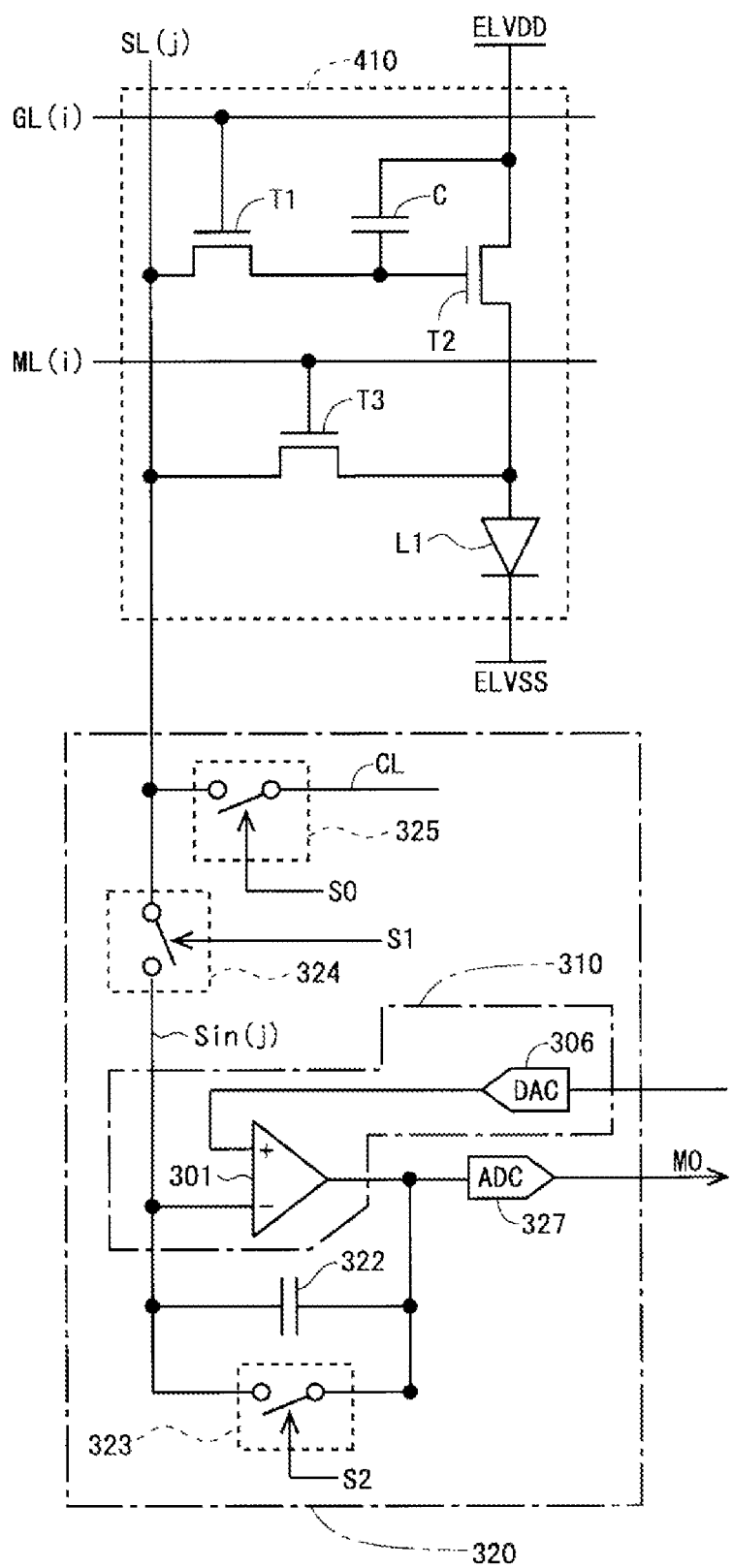
FIG. 4 is a circuit diagram illustrating a pixel circuit and a part of a source driver according to the first embodiment described above.

FIG. 4 is a circuit diagram illustrating the pixel circuit 410 and a part of the source driver 30. Note that in FIG. 4, the pixel circuit 410 at the i-th row and j-th column and a portion corresponding to the data signal line SL(j) at the j-th column of the source driver 30 are illustrated. The pixel circuit 410 includes one organic EL element L1, three transistors T1 to T3 (a writing control transistor T1 configured to control writing to the capacitor C, a drive transistor T2 configured to control supply of a current to the organic EL element L1, and a monitoring control transistor T3 configured to control whether or not the TFT characteristics or the OLED characteristics are detected), and one capacitor (capacitance element) C. In the present embodiment, the transistors T1 to T3 are n-channel type thin film transistors. Note that, as the transistors T1 to T3, an oxide TFT (a thin film transistor using an oxide semiconductor for a channel layer) and an amorphous silicon TFT can be employed. Examples of oxide TFTs include TFTs containing indium gallium zinc oxide (InGaZnO). By employing the oxide TFT, for example, it is possible to achieve high definition and low power consumption.

As for the writing control transistor T1, a control terminal is connected to the scanning signal line GL(i), a first conduction terminal is connected to the data signal line SL(j), and a second conduction terminal is connected to a control terminal of the drive transistor T2 and one end of the capacitor C. As for the drive transistor T2, a control terminal is connected to the second conduction terminal of the writing control transistor T1 and the one end of the capacitor C, a first conduction terminal is connected to the other end of the capacitor C and a high-level power source line, and a second conduction terminal is connected to a first conduction terminal of the monitoring control transistor T3 and an anode terminal of the organic EL element L1. As for the monitoring control transistor T3, a control terminal is connected to the monitoring control line ML(i), the first conduction terminal is connected to the second conduction terminal of the drive transistor T2 and the anode terminal of the organic EL element L1, and a second conduction terminal is connected to the data signal line SL(j). As for the capacitor C, the one end is connected to the second conduction terminal of the writing control transistor T1 and the control terminal of the drive transistor T2, and the other end is connected to the first conduction terminal of the drive transistor T2 and the high-level power source line. As for the organic EL element L1, the anode terminal is connected to the second conduction terminal of the drive transistor T2 and the first conduction terminal of the monitoring control transistor T3, and a cathode terminal is connected to a low-level power source line. In the present embodiment, the organic EL element L1 corresponds to a display element, the anode terminal of the organic EL element L1 corresponds to a first terminal, and the cathode terminal of the organic EL element L1 corresponds to a second terminal.

Figure 5:
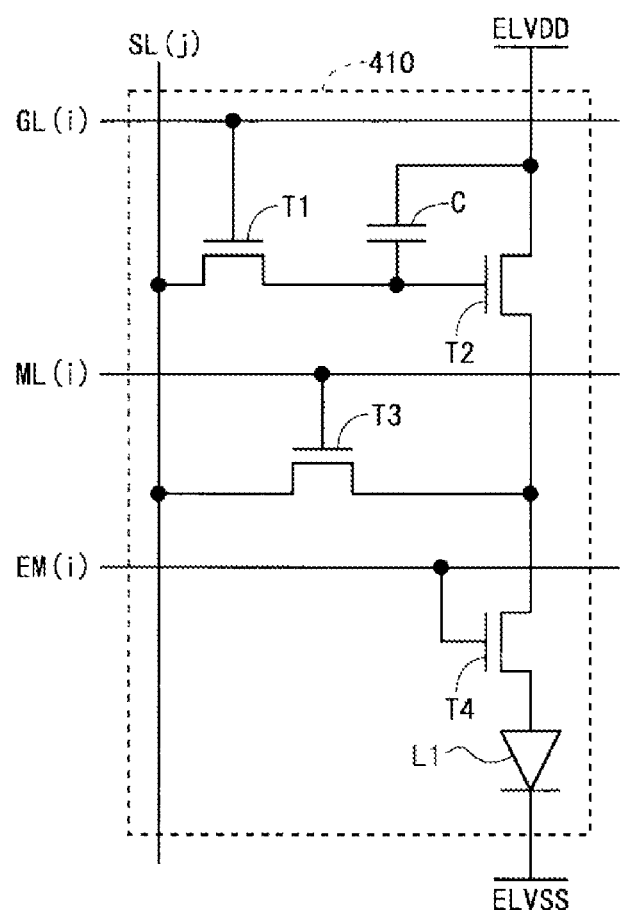
FIG. 5 is a circuit diagram illustrating another configuration example of the pixel circuit according to the first embodiment described above.

As will be described later, according to the configuration of the present embodiment, there is a concern that display quality deteriorates because a difference in length of a light emission period of the organic EL element L1 between the monitoring row and the non-monitoring row occurs. Thus, a configuration that will be described below may be adopted so that the length of the light emission period of the organic EL element L1 is identical in all rows. A light emission control line is provided in the display portion 40 so as to correspond to each row. Further, a light emission control transistor that controls light emission of the organic EL element L1 is provided in the pixel circuit 410. As illustrated in FIG. 5, as for a light emission control transistor T4, a control terminal is connected to a light emission control line EM(i), a first conduction terminal is connected to the second conduction terminal of the drive transistor T2 and the first conduction terminal of the monitoring control transistor T3, and a second conduction terminal is connected to the anode terminal of the organic EL element L1. When it is assumed that the i-th row is a monitoring row in the configuration described above, the potential of the light emission control line EM(i) is controlled so that the light emission control transistor T4 is in an off state in a predetermined period (for example, in periods P11 to P15 in FIG. 24) in the monitoring period and is in an on state in the other periods.

Next, a portion of the source driver 30 functioning as the current monitoring unit 320 will be described. As illustrated in FIG. 4, the current monitoring unit 320 is configured of a D/A converter 306, an A/D converter 327, an operational amplifier 301, a capacitor 322, and three switches (switches 323, 324, and 325). Note that the operational amplifier 301 and the D/A converter 306 also function as constitutional elements of the data signal line drive unit 310. The current monitoring unit 320 is provided with control signals S0, S1, and S2 for controlling states of the three switches as the source control signal SCTL. An internal data line Sin(j) of the current monitoring unit 320 is connected to the data signal line SL(j) via the switch 324. As for the operational amplifier 301, an inverting input terminal is connected to the internal data line Sin(j), and a non-inverting input terminal is provided with an output from the D/A converter 306. The capacitor 322 and the switch 323 are provided between an output terminal of the operational amplifier 301 and the internal data line Sin(j). The control signal S2 is provided to the switch 323. The operational amplifier 301, the capacitor 322, and the switch 323 configure an integrator circuit. An operation of the integrator circuit will now be described. When the switch 323 is in the on state, a short circuit between the output terminal and the inverting input terminal of the operational amplifier 301 (that is, between two electrodes of the capacitor 322) occurs. At this time, no charge is accumulated in the capacitor 322, and potentials of the output terminal of the operational amplifier 301 and the internal data line Sin(j) are equal to an output potential from the D/A converter 306. When the switch 323 is switched from the on state to the off state, charging is performed to the capacitor 322 based on a current flowing through the internal data line Sin(j). That is, a time integral value of the current flowing through the internal data line Sin(j) is accumulated in the capacitor 322. As a result, the potential of the output terminal of the operational amplifier 301 changes depending on a magnitude of the current flowing through the internal data line Sin(j). An output from the operational amplifier 301 is converted to a digital signal by the A/D converter 327, and the digital signal is sent to the display control circuit 10 as the monitoring data MO.

The switch 324 is provided between the data signal line SL(j) and the internal data line Sin(j). The control signal S1 is provided to the switch 324. By switching the state of the switch 324 based on the control signal S1, an electrical connection state between the data signal line SL(j) and the internal data line Sin(j) is controlled. In the present embodiment, when the control signal S1 is at the high level, the data signal line SL(j) and the internal data line Sin(j) are in an electrically connected state, and when the control signal S1 is at the low level, the data signal line SL(j) and the internal data line Sin(j) are in an electrically disconnected state.

The switch 325 is provided between the data signal line SL(j) and a control line CL. The control signal S0 is provided to the switch 325. By switching the state of the switch 325 based on the control signal S0, an electrical connection state between the data signal line SL(j) and the control line CL is controlled. In the present embodiment, when the control signal S0 is at the high level, the data signal line SL(j) and the control line CL are electrically connected, and when the control signal S0 is at the low level, the data signal line SL(j) and the control line CL are electrically disconnected. When the data signal line SL(j) and the control line CL are electrically connected, the data signal line SL(j) becomes in a high impedance state.

As described above, when the switch 324 is turned off, the data signal line SL(j) and the internal data line Sin(j) are in an electrically disconnected state. At this time, when the switch 323 is in the off state, the potential of the internal data line Sin(j) is maintained. In the present embodiment, AD conversion is performed by the A/D converter 327 with the potential of the internal data line Sin(j) maintained in this manner.

1.3 Gate Driver

A detailed configuration of the gate driver 20 according to the present embodiment will be described. The gate driver 20 is configured of a shift register including a plurality of stages (a plurality of unit circuits: at least n unit circuits). The display portion 40 has a pixel matrix having n rows and m columns, and the respective stages (respective unit circuits) of the shift register are provided corresponding one-to-one to the respective rows of the pixel matrix.

Figure 6:
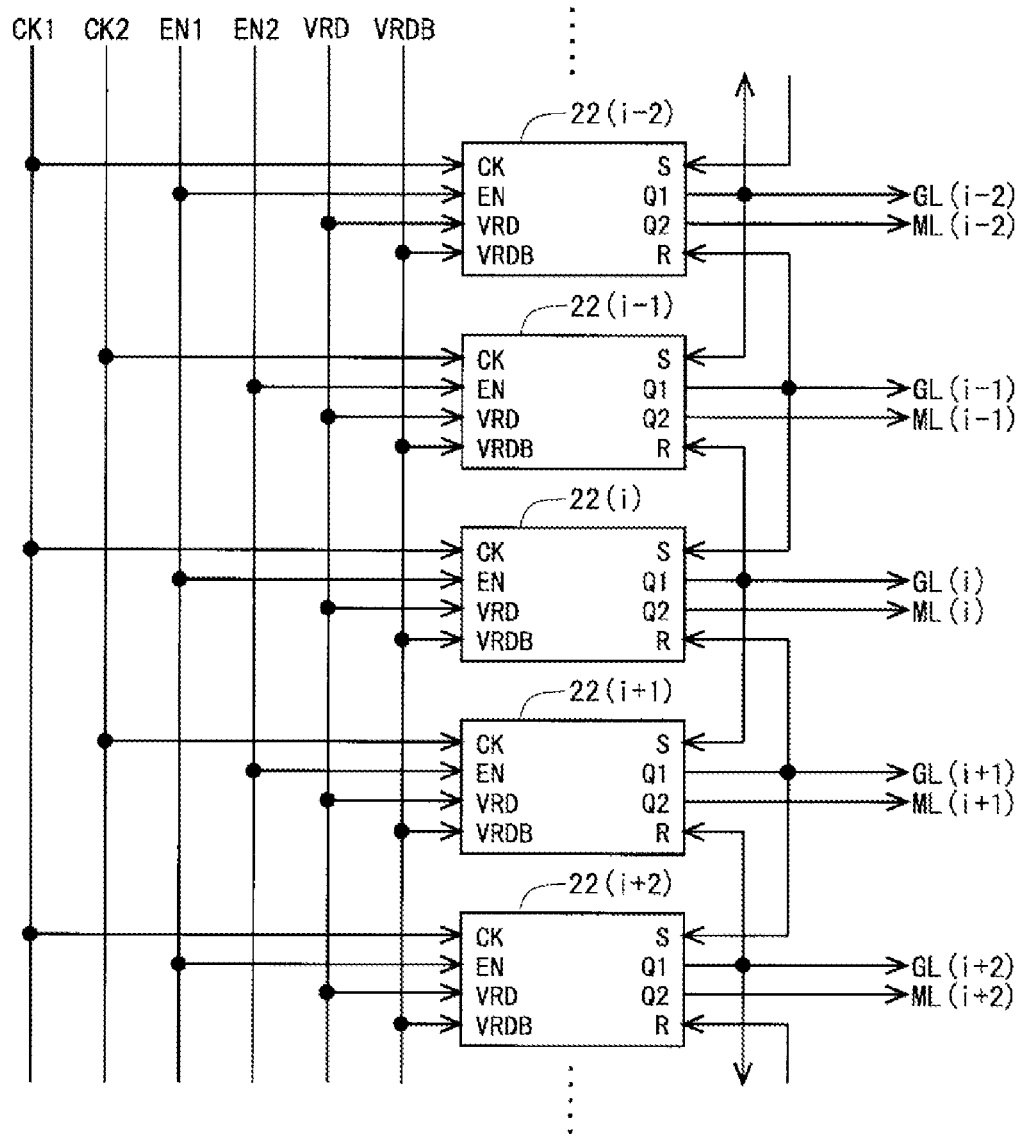
FIG. 6 is a block diagram illustrating a configuration of a shift register having five stages configuring the gate driver according to the first embodiment described above.

FIG. 6 is a block diagram illustrating a configuration of a shift register having five stages. Here, it is assumed that i is an odd number equal to or larger than 3 and equal to or smaller than (n−2), attention is focused on the unit circuits 22(i−2), 22(i−1), 22(i), 22(i+1), and 22(i+2) respectively provided at the (i−2)-th stage, the (i−1)-th stage, the i-th stage, the (i+1)-th stage, and the (i+2)-th stage. The shift register is applied with the gate start pulse signal, a clock signal CK1, a clock signal CK2, an enable signal EN1, an enable signal EN2, a stabilization control signal VRD, and a stabilization control signal VRDB as the gate control signal GCTL. Hereinafter, for convenience, a signal line that transmits the stabilization control signal VRD is referred to as a "first control signal line", and a signal line that transmits the stabilization control signal VRDB is referred to as a "second control signal line". In the present embodiment, a control circuit that controls potentials of the first control signal line and the second control signal line is implemented by the display control circuit 10. Note that the gate start pulse signal is a signal provided to the unit circuit 22(1) at the first stage as the set signal S, and is omitted in FIG. 6.

Each unit circuit 22 includes input terminals configured to receive each of the clock signal CK, the enable signal EN, the stabilization control signal VRD, the stabilization control signal VRDB, the set signal S, and the reset signal R, and output terminals configured to output each of the output signal Q1 and the output signal Q2.

As for the unit circuit 22 at the odd-numbered stage, the clock signal CK1 is provided as the clock signal CK, and the enable signal EN1 is provided as the enable signal EN. As for the unit circuit 22 at the even-numbered stage, the clock signal CK2 is provided as the clock signal CK, and the enable signal EN2 is provided as the enable signal EN. The stabilization control signal VRD and the stabilization control signal VRDB are applied in common to all of the unit circuits 22. That is, the first control signal line applies a common potential to all of the unit circuits 22, and the second control signal line also applies a common potential to all of the unit circuits 22. In addition, to the unit circuit 22 at each stage, the output signal Q1 from the unit circuit 22 at the previous stage is provided as the set signal S, and the output signal Q1 from the unit circuit 22 at the next stage is provided as the reset signal R. The output signal Q1 from the unit circuit 22 at each stage is provided as the reset signal R to the unit circuit 22 at the previous stage, is provided as the set signal S to the unit circuit 22 at the next stage, and is provided as a scanning signal to the corresponding scanning signal line GL. The output signal Q2 from the unit circuit 22 at each stage is provided as a monitoring control signal to the corresponding monitoring control line ML. Note that, as illustrated in FIG. 4, the scanning signal line GL is connected to the control terminal of the writing control transistor T1 in the pixel circuit 410, and the monitoring control line ML is connected to the control terminal of the monitoring control transistor T3 in the pixel circuit 410.

Figure 1:
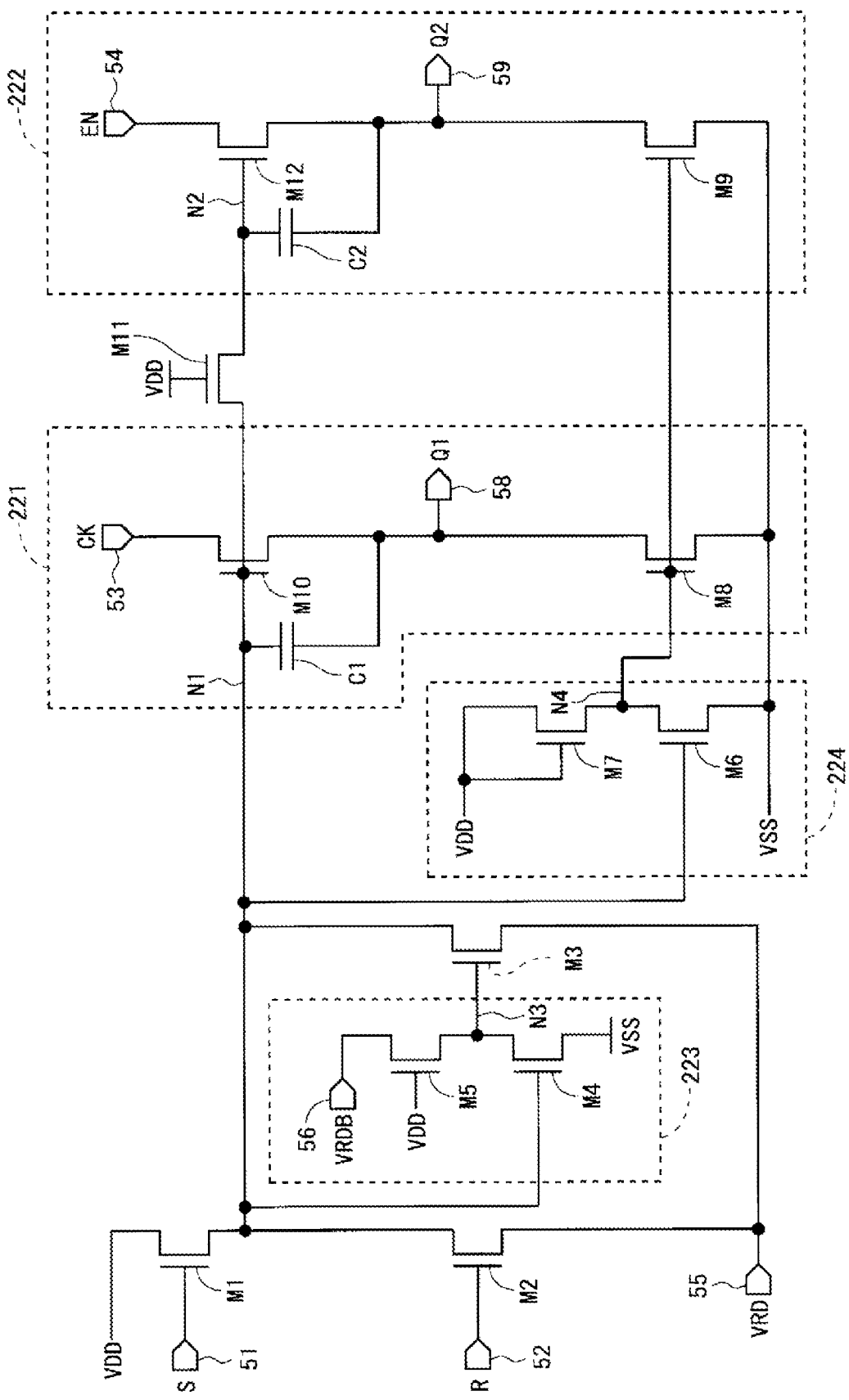
FIG. 1 is a circuit diagram illustrating a configuration of a unit circuit in a gate driver according to a first embodiment.

FIG. 1 is a circuit diagram illustrating a configuration of the unit circuit 22 according to the present embodiment. As illustrated in FIG. 1, the unit circuit 22 includes twelve transistors M1 to M12 and two capacitors C1 and C2. Further, the unit circuit 22 includes six input terminals 51 to 56 and two output terminals 58 and 59, in addition to the input terminals connected to a power source line applied with a low-level potential VSS as a first reference potential (hereinafter, referred to as a "first reference potential line") and the input terminals connected to a power source line applied with a high-level potential VDD as a second reference potential (hereinafter, referred to as a "second reference potential line"). In FIG. 1, the input terminal configured to receive the set signal S is denoted by a reference sign 51, the input terminal configured to receive the reset signal R is denoted by a reference sign 52, the input terminal configured to receive the clock signal CK is denoted by a reference sign 53, the input terminal configured to receive the enable signal EN is denoted by a reference sign 54, the input terminal configured to receive the stabilization control signal VRD (the input terminal connected to the first control signal line) is denoted by a reference sign 55, the input terminal configured to receive the stabilization control signal VRDB (the input terminal connected to the second control signal line) is denoted by a reference sign 56, the output terminal configured to output the output signal Q1 is denoted by a reference sign 58, and the output terminal configured to output the output signal Q2 is denoted by a reference sign 59. Note that, as will be described later, the output signal Q2 at the high level (on level) is output from the output terminal 59 for some periods (the periods P11, P13, and P14 in FIG. 16) of the monitoring period for which the monitoring processing is performed. The output signal Q2 being at the high level (on level) output from the output terminal 59 is a signal being at a level sufficient to cause the writing control transistor T1 in the pixel circuit 410 being a connection destination of the output terminal 59 to be turned on to perform the monitoring processing (in other words, a signal being at a level sufficient to cause the pixel circuit 410 being a connection destination of the output terminal 59 to perform an operation for the monitoring processing).

A second conduction terminal of the transistor M1, a first conduction terminal of the transistor M2, a first conduction terminal of the transistor M3, a control terminal of the transistor M4, a control terminal of the transistor M6, a control terminal of the transistor M10, a first conduction terminal of the transistor M11, and one end of the capacitor C1 are connected to one another. Note that a region (wiring line) where they are connected to one another is referred to as a "first internal node". The first internal node is denoted by a reference sign N1. A second conduction terminal of the transistor M11, a control terminal of the transistor M12, and one end of the capacitor C2 are connected to one another. Note that a region (wiring line) where they are connected to one another is referred to as a "second internal node". The second internal node is denoted by a reference sign N2. A control terminal of the transistor M3, a first conduction terminal of the transistor M4, and a second conduction terminal of the transistor M5 are connected to one another. Note that a region (wiring line) where they are connected to one another is referred to as a "third internal node". The third internal node is denoted by a reference sign N3. A first conduction terminal of the transistor M6, a second conduction terminal of the transistor M7, a control terminal of the transistor M8, and a control terminal of the transistor M9 are connected to one another. Note that a region (wiring line) where they are connected to one another is referred to as a "fourth internal node". The fourth internal node is denoted by a reference sign N4.

Incidentally, the unit circuit 22 includes a first output control circuit 221 that controls an output of the output signal Q1, and a second output control circuit 222 that controls an output of the output signal Q2, a stabilization circuit 223 that stabilizes a potential of the first internal node N1, and a reset circuit 224 that suppresses an output of noise from the output terminals 58 and 59. The stabilization circuit 223 controls a potential of the control terminal of the transistor M3 based on the potential of the first internal node N1. The reset circuit 224 controls potentials of the control terminals of the transistors M8 and M9 based on the potential of the first internal node N1. The first output control circuit 221 includes the first internal node N1, the transistor M8, the transistor M10, the capacitor C1, the input terminal 53, and the output terminal 58. The second output control circuit 222 includes the second internal node N2, the transistor M9, the transistor M12, the capacitor C2, the input terminal 54, and the output terminal 59. The stabilization circuit 223 includes the third internal node N3, the transistor M4, the transistor M5, and the input terminal 56. The reset circuit 224 includes the fourth internal node N4, the transistor M6, and the transistor M7.

As for the transistor M1, a control terminal is connected to the input terminal 51, a first conduction terminal is connected to the second reference potential line, and the second conduction terminal is connected to the first internal node N1. As for the transistor M2, a control terminal is connected to the input terminal 52, the first conduction terminal is connected to the first internal node N1, and a second conduction terminal is connected to the input terminal 55. As for the transistor M3, the control terminal is connected to the third internal node N3, the first conduction terminal is connected to the first internal node N1, and a second conduction terminal is connected to the output terminal 55. As for the transistor M4, the control terminal is connected to the first internal node N1, the first conduction terminal is connected to the third internal node N3, and a second conduction terminal is connected to the first reference potential line. As for the transistor M5, a control terminal is connected to the second reference potential line, a first conduction terminal is connected to the input terminal 56, and the second conduction terminal is connected to the third internal node N3. As for the transistor M6, the control terminal is connected to the first internal node N1, the first conduction terminal is connected to the fourth internal node N4, and a second conduction terminal is connected to the first reference potential line. Note that the control terminal of the transistor M6 may be connected to the second internal node N2.

As for the transistor M7, a control terminal and a first conduction terminal are connected to the second reference potential line (in other words, in a diode connection state), and the second conduction terminal is connected to the fourth internal node N4. As for the transistor M8, the control terminal is connected to the fourth internal node N4, a first conduction terminal is connected to the output terminal 58, and a second conduction terminal is connected to the first reference potential line. As for the transistor M9, the control terminal is connected to the fourth internal node N4, a first conduction terminal is connected to the output terminal 59, and a second conduction terminal is connected to the first reference potential line. As for the transistor M10, the control terminal is connected to the first internal node N1, a first conduction terminal is connected to the input terminal 53, and a second conduction terminal is connected to the output terminal 58. As for the transistor M11, a control terminal is connected to the second reference potential line, the first conduction terminal is connected to the first internal node N1, and the second conduction terminal is connected to the second internal node N2. As for the transistor M12, the control terminal is connected to the second internal node N2, a first conduction terminal is connected to the input terminal 54, and a second conduction terminal is connected to the output terminal 59. As described above, the second conduction terminal of the transistor M8 and the second conduction terminal of the transistor M9 are connected to the first reference potential line. The low-level potential VSS (first reference potential) applied to the first reference potential line is a potential that causes the potentials of the output terminals 58 and 59 to be set to the low level (off level) via the transistors M8 and M9 (specifically, a potential of a level sufficient to cause the writing control transistor T1 and the monitoring control transistor T3 in the pixel circuit 410 that are connection destinations of the output terminals 58 and 59 to be turned off).

As for the capacitor C1, the one end is connected to the first internal node N1, and the other end is connected to the output terminal 58. As for the capacitor C2, the one end is connected to the second internal node N2, and the other end is connected to the output terminal 59.

Here, attention is now directed toward the transistor M11. The control terminal of the transistor M11 is applied with the high-level (on level) potential VDD. This high-level potential VDD is a potential of a level sufficient to maintain the transistor M11 in an on state except when the potential of the first internal node N1 or the second internal node N2 is higher than the normal high level. That is, the transistor M11 is maintained in the on state except when the potential of the first internal node N1 or the second internal node N2 is higher than the normal high level. The transistor M11 is turned off when the potential of the second internal node N2 is larger than or equal to a predetermined value, and electrically disconnects the first internal node N1 and the second internal node N2. Thus, the transistor M11 assists in increasing the potential of the second internal node N2 when the second internal node N2 is in a boost state.

Regarding the transistors in the stabilization circuit 223 and the transistors in the reset circuit 224, the following relationships are established in the present embodiment. The transistor M4 and the transistor M5 in the stabilization circuit 223 configure a ratio circuit, with performance of the transistor M4 being sufficiently higher than performance of the transistor M5. That is, an on current of the transistor M4 is sufficiently larger than an on current of the transistor M5. The transistor M6 and the transistor M7 in the reset circuit 224 configure a ratio circuit, with performance of the transistor M6 being sufficiently higher than performance of the transistor M7. That is, an on current of the transistor M6 is sufficiently larger than an on current of the transistor M7. Note that, in general, performance of a transistor depends on a channel width and a channel length. Specifically, the larger a channel width is, the higher performance of a transistor is, and the shorter a channel length is, the higher performance of a transistor is.

In the present embodiment, a first internal node control transistor is implemented by the transistor M2, a stabilization transistor is implemented by the transistor M3, a first stabilization control transistor is implemented by the transistor M4, a second stabilization control transistor is implemented by the transistor M5, a first reset control transistor is implemented by the transistor M6, a second reset control transistor is implemented by the transistor M7, a second reset transistor is implemented by the transistor M8, a first reset transistor is implemented by the transistor M9, a first output control transistor is implemented by the transistor M10, an output circuit control transistor is implemented by the transistor M11, a second output control transistor is implemented by the transistor M12, a first output terminal is implemented by the output terminal 58, and a second output terminal is implemented by the output terminal 59.

1.4 Driving Method

A method for driving according to the present embodiment will be described. Note that, here, a period from the start of scanning of the scanning signal line GL(1) for image display to the next start of the scanning of the scanning signal line GL(1) is referred to as a "frame period".

1.4.1 Overview

In the present embodiment, a monitoring mode and a non-monitoring mode are prepared as an operation mode related to the monitoring processing. When the operation mode is set to the monitoring mode, the monitoring processing is performed at any time during an operation of the organic EL display device. In particular, the monitoring processing is performed for at least one row in each frame period. The monitoring processing is performed during a display period. The monitoring processing to be performed during the display period in this way is referred to as "real-time monitoring". When the operation mode is set to the non-monitoring mode, the monitoring processing is not performed during the operation of the organic EL display device. In other words, the display is performed based on the input image signal DIN in all rows throughout the period in which the organic EL display device is operating.

An operation in each mode will be described with reference to FIG. 7 and FIG. 8. Note that FIG. 7 and FIG. 8 schematically illustrate a state of scanning sequentially from the scanning signal line GL(1) at the first row to the scanning signal line GL(n) at the n-th row in order for writing for image display by diagonal thick lines (the same applies to FIG. 37 to FIG. 39).

Figure 7:
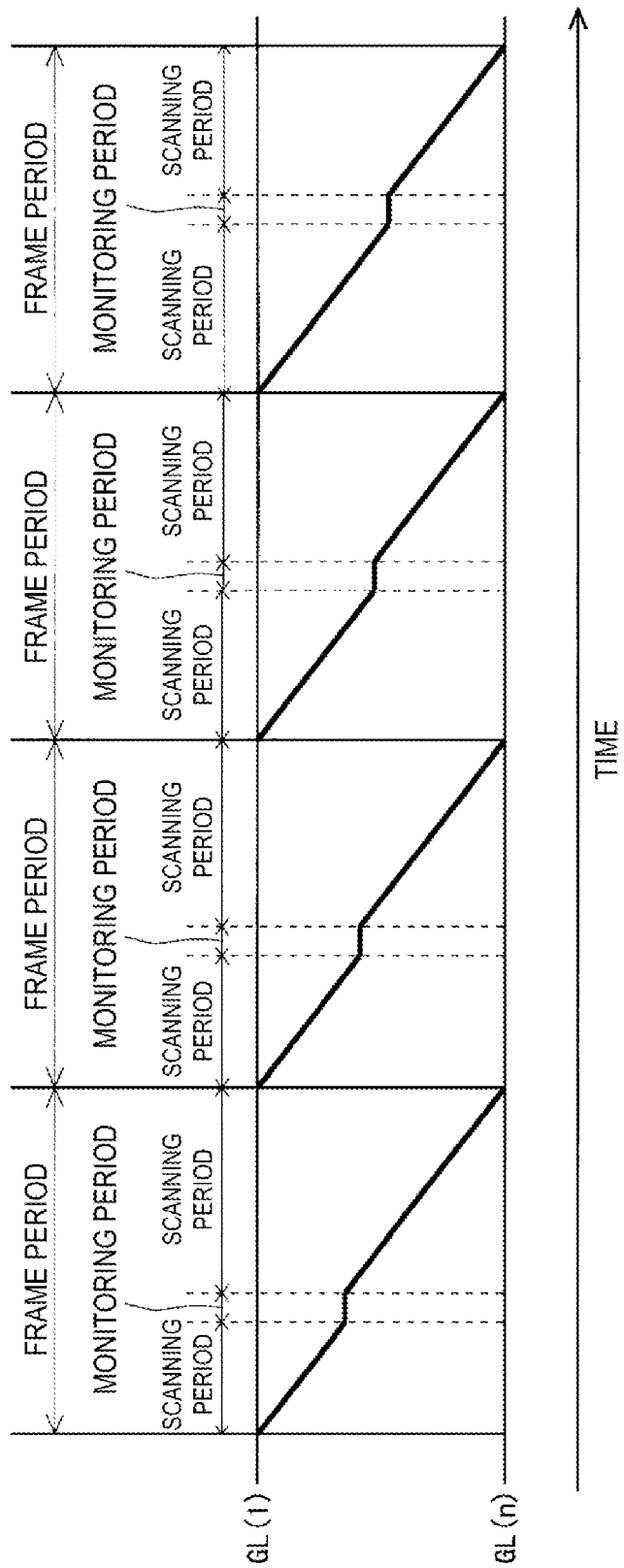
FIG. 7 is a diagram for describing a schematic operation when an operation mode is set to a monitoring mode in the first embodiment described above.

When the operation mode is set to the monitoring mode, the monitoring period is included in each frame period, as illustrated in FIG. 7. Regarding each frame period, periods other than the monitoring period are scanning periods. The scanning period is a period during which scanning of the scanning signal line GL is performed for image display. In this way, the above-described real-time monitoring is performed in the present embodiment.

Figure 8:
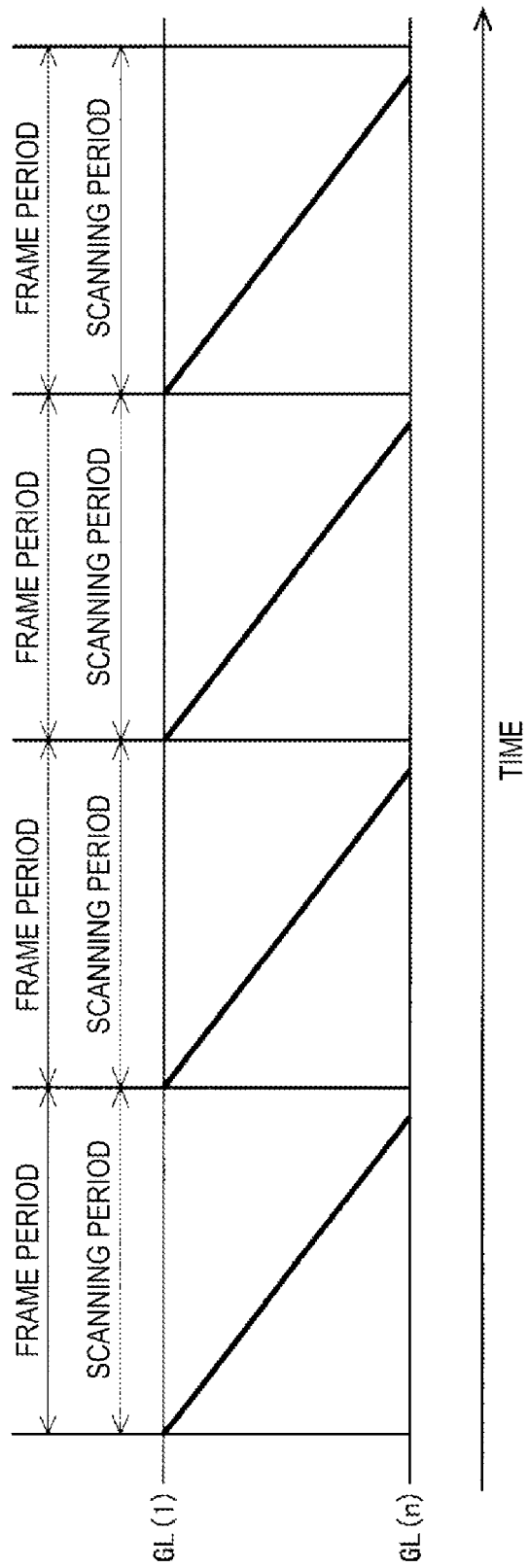
FIG. 8 is a diagram for describing a schematic operation when the operation mode is set to a non-monitoring mode in the first embodiment described above.

When the operation mode is set to the non-monitoring mode, unlike when the operation mode is set to the monitoring mode, only the scanning period is included in each frame period as illustrated in FIG. 8. In other words, operations for writing are continuously performed without performing the monitoring processing.

When the operation mode is set to the monitoring mode, a vertical period (a period from the start of scanning of the scanning signal line GL(1) at the first row to the end of scanning of the scanning signal line GL(n) at the n-th row) is longer than that when the operation mode is set to the non-monitoring mode. In other words, the vertical period of the image display including the monitoring processing is longer than the vertical period of the image display not including the monitoring processing. However, no such limitation is intended, and by adjusting a length of a flyback period, a length of the vertical period of the image display including the monitoring processing can be made identical to a length of the vertical period of the image display not including the monitoring processing.

Note that in the present embodiment, a scanning step is achieved by the operation in the scanning period, and a monitoring step is achieved by the operation of the monitoring period.

1.4.2 Operation when Operation Mode is Set to Non-Monitoring Mode

Figure 9:
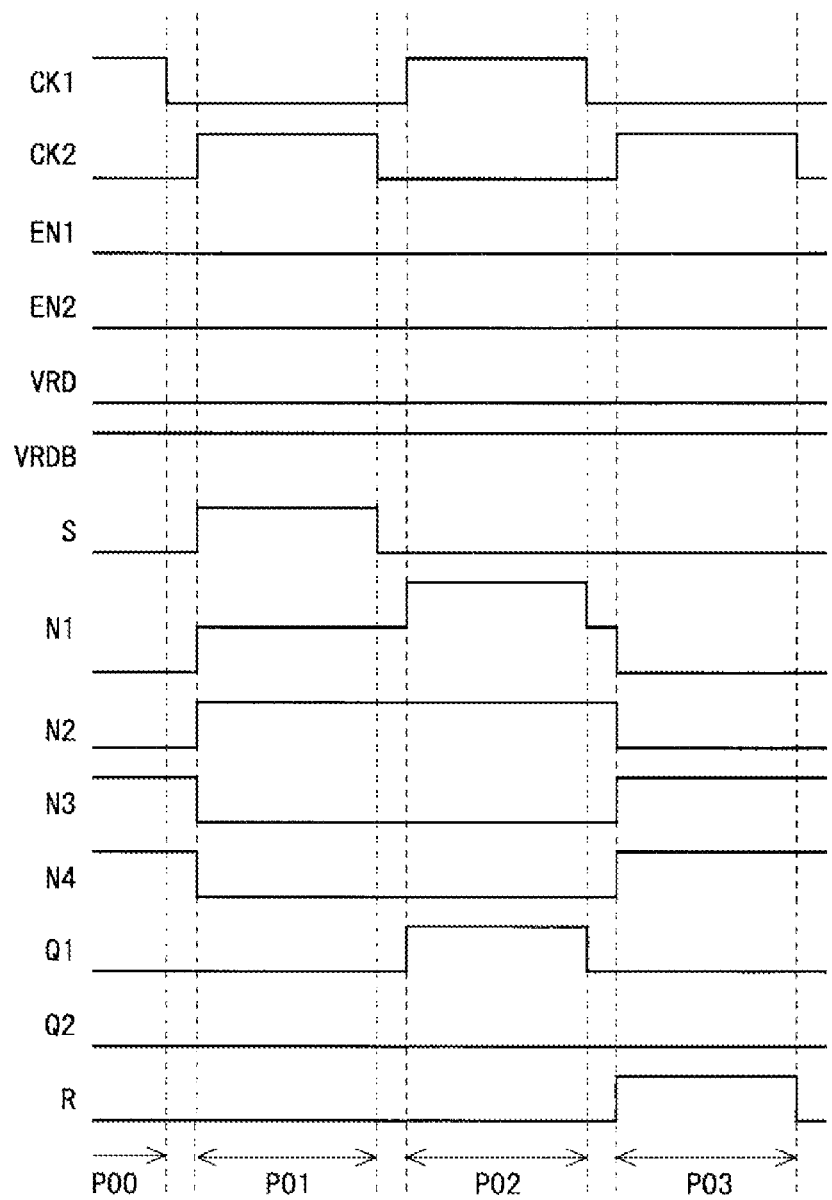
FIG. 9 is a signal waveform diagram for describing an operation (an operation when writing is performed in the corresponding row) of a unit circuit when the operation mode is set to the non-monitoring mode in the first embodiment described above.

With reference to FIG. 9 to FIG. 13, an operation of the unit circuit 22(i) at the i-th stage when the operation mode is set to the non-monitoring mode will be described. However, attention is focused on an operation when writing to the i-th row is performed (when a row to be selected is the i-th row). Note that, in FIG. 10 and the like, the potentials of the signals and the nodes are denoted by bold "H" and "L". "H" means a high level, and "L" means a low level. Also, in FIG. 10 and the like, "OFF" is denoted near the transistors being in an off state. As described above, the unit circuit 22(i) at the i-th stage is provided with the clock signal CK1 as the clock signal CK and is provided with the enable signal EN1 as the enable signal EN. When the operation mode is set to the non-monitoring mode, as illustrated in FIG. 9, the enable signal EN1, the enable signal EN2, and the stabilization control signal VRD are maintained at the low level, and the stabilization control signal VRDB is maintained at the high level.

Figure 10:
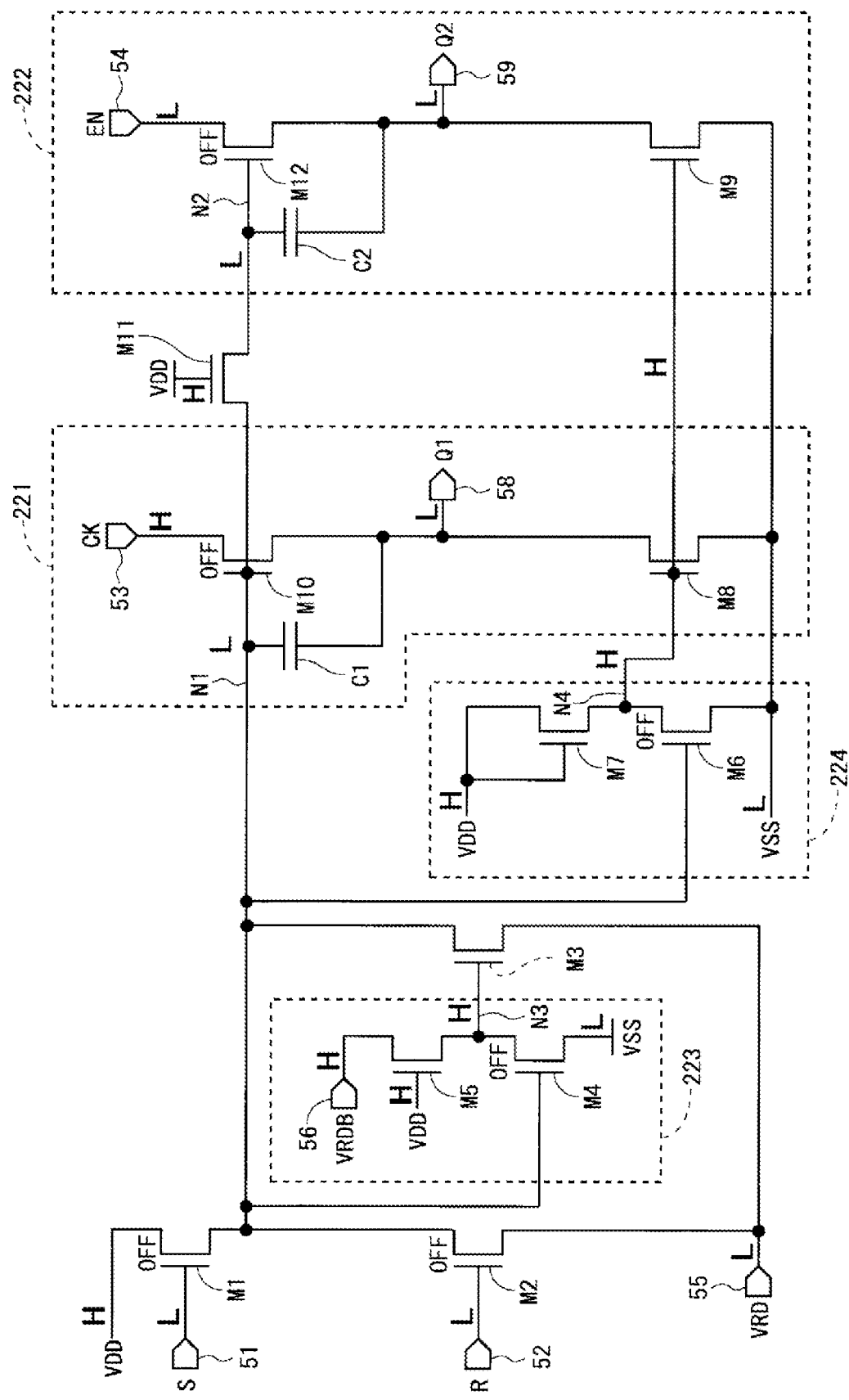
FIG. 10 is a diagram for describing a state of the unit circuit when the operation mode is set to the non-monitoring mode in the first embodiment described above.

FIG. 10 illustrates a state of the unit circuit 22(i) in a period P00. In the period P00, the potential of the first internal node N1 and the potential of the second internal node N2 are set to the low level. When attention is focused on the stabilization circuit 223, the transistor M5 is maintained in the on state, and the transistor M4 is in the off state because the potential of first internal node N1 is at the low level. Since the stabilization control signal VRDB is at the high level in this state, the potential of the third internal node N3 is at the high level. When attention is focused on the reset circuit 224, the control terminal and the first conduction terminal of the transistor M7 are applied with the high-level potential VDD, and the potential of the first internal node N1 is at the low level, so the transistor M6 is in the off state. Thus, the potential of the fourth internal node N4 is at the high level.

Figure 11:
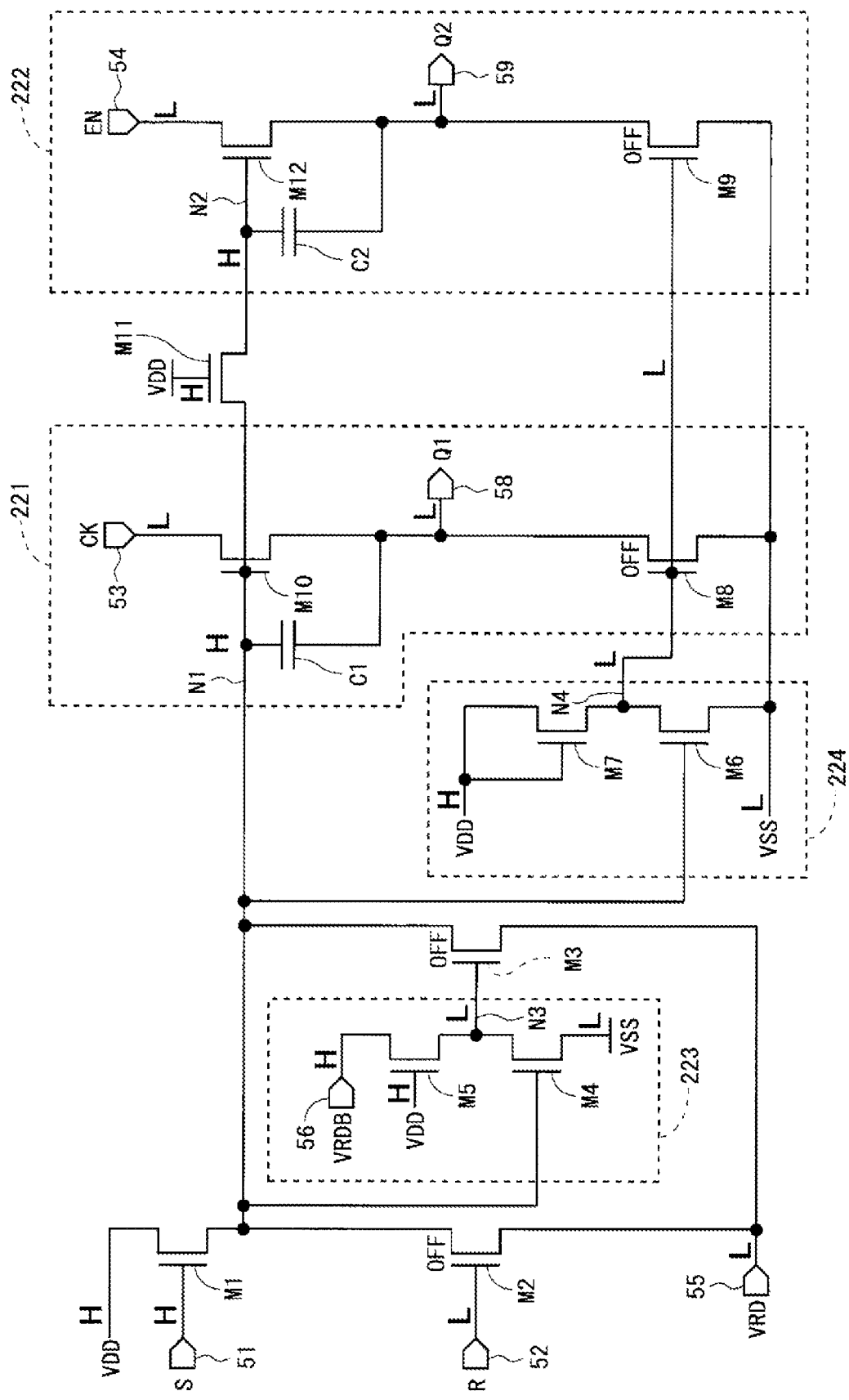
FIG. 11 is a diagram for describing a state of the unit circuit when the operation mode is set to the non-monitoring mode in the first embodiment described above.

FIG. 11 illustrates a state of the unit circuit 22(i) in a period P01. When the period P01 starts, the set signal S changes from the low level to the high level. The pulse of this set signal S causes the transistor M1 to be in the on state, and the capacitor C1 is charged. This increases the potential of the first internal node N1 to set the transistor M10 to the on state. However, in the period P01, the clock signal CK (clock signal CK1) is maintained at the low level, and thus, the output signal Q1 is maintained at the low level. Additionally, since the transistor M11 is in the on state, the capacitor C2 is also charged in the period P01. This increases the potential of the second internal node N2 to set the transistor M12 to the on state. However, since the enable signal EN (enable signal EN1) is maintained at the low level in the period P01, the output signal Q2 is maintained at the low level. Also, as the potential of the first internal node N1 increases, the transistors M4 and M6 are turned on. Here, as described above, "the transistor M4 and the transistor M5" configure a ratio circuit, and "the transistor M6 and the transistor M7" configure a ratio circuit, and the performance of the transistor M4 is sufficiently higher than the performance of the transistor M5, and the performance of the transistor M6 is sufficiently higher than the performance of the transistor M7. Thus, the potential of the third internal node N3 and the potential of the fourth internal node N4 are set to the low level. As a result, the transistors M3, M8, and M9 are set to the off state.

Figure 12:
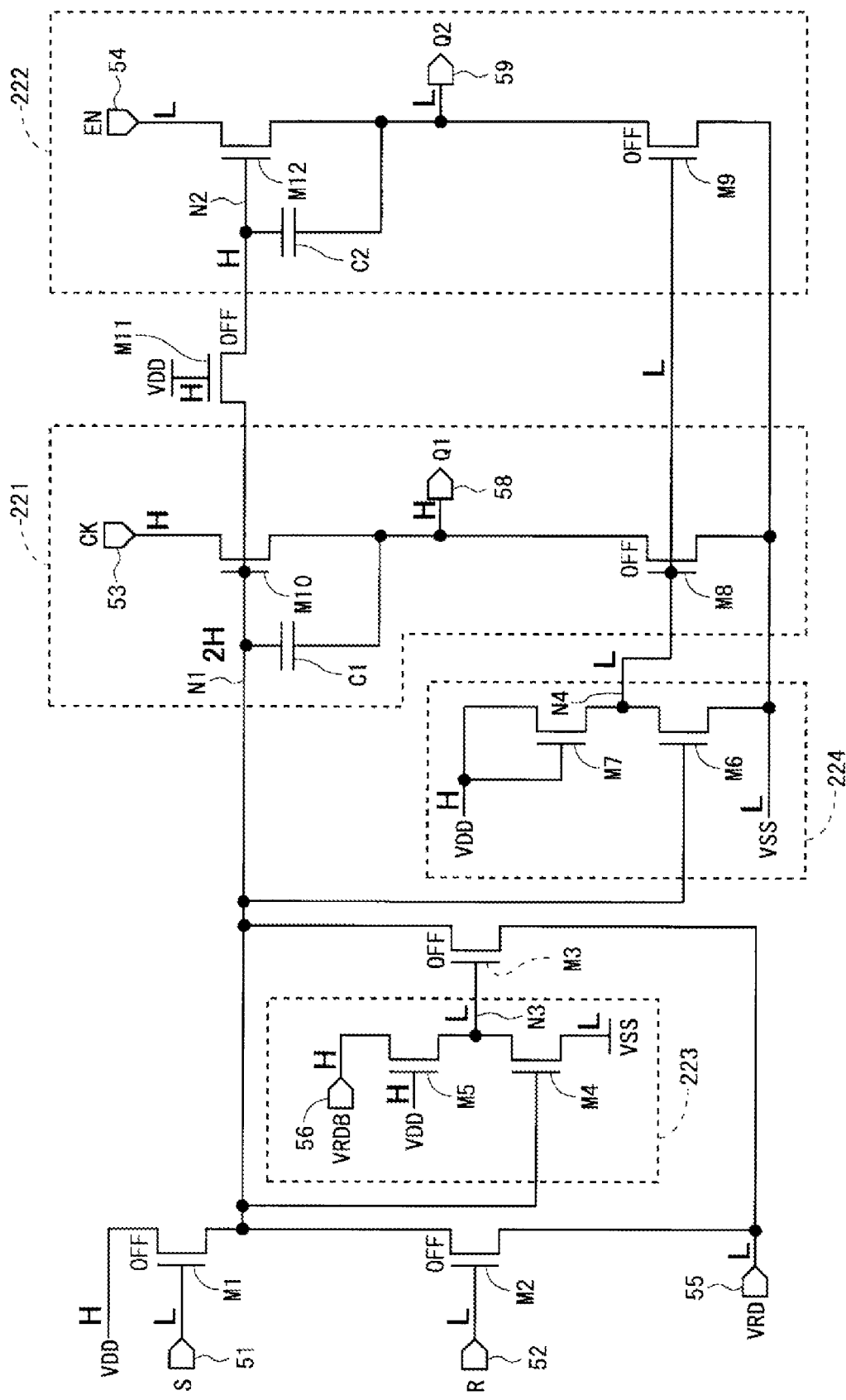
FIG. 12 is a diagram for describing a state of the unit circuit when the operation mode is set to the non-monitoring mode in the first embodiment described above.

FIG. 12 illustrates a state of the unit circuit 22(i) in a period P02. When the period P02 starts, the clock signal CK (clock signal CK1) changes from the low level to the high level. At this time, since the transistor M10 is in the on state, the potential of the output terminal 58 (the potential of the output signal Q1) rises along with the rise of the potential of the input terminal 53. Here, since the capacitor C1 is provided between the first internal node N1 and the output terminal 58, the potential of the first internal node N1 rises along with the rise of the potential of the output terminal 58 (the first internal node N1 is set to a boost state). As a result, a large voltage is applied to the control terminal of the transistor M10, and the potential of the output signal Q1 rises to a level sufficient to cause the writing control transistor T1 being a connection destination of the output terminal 58 to be turned on. Thus, the writing is performed in the pixel circuit 410 in the i-th row. Since the enable signal EN (enable signal EN1) is maintained at the low level, the output signal Q2 is also maintained at the low level in the period P02. Note that the first internal node N1 is in the boost state (in FIG. 12, the state is denoted as "2H"), and thus, the transistor M11 is turned off.

When the period P02 ends, the clock signal CK (clock signal CK1) changes from the high level to the low level. As a result, the potential of the output terminal 58 (the potential of the output signal Q1) decreases as the potential of the input terminal 53 decreases. As the potential of the output terminal 58 decreases, the potential of the first internal node N1 also decreases via the capacitor C1.

Figure 13:
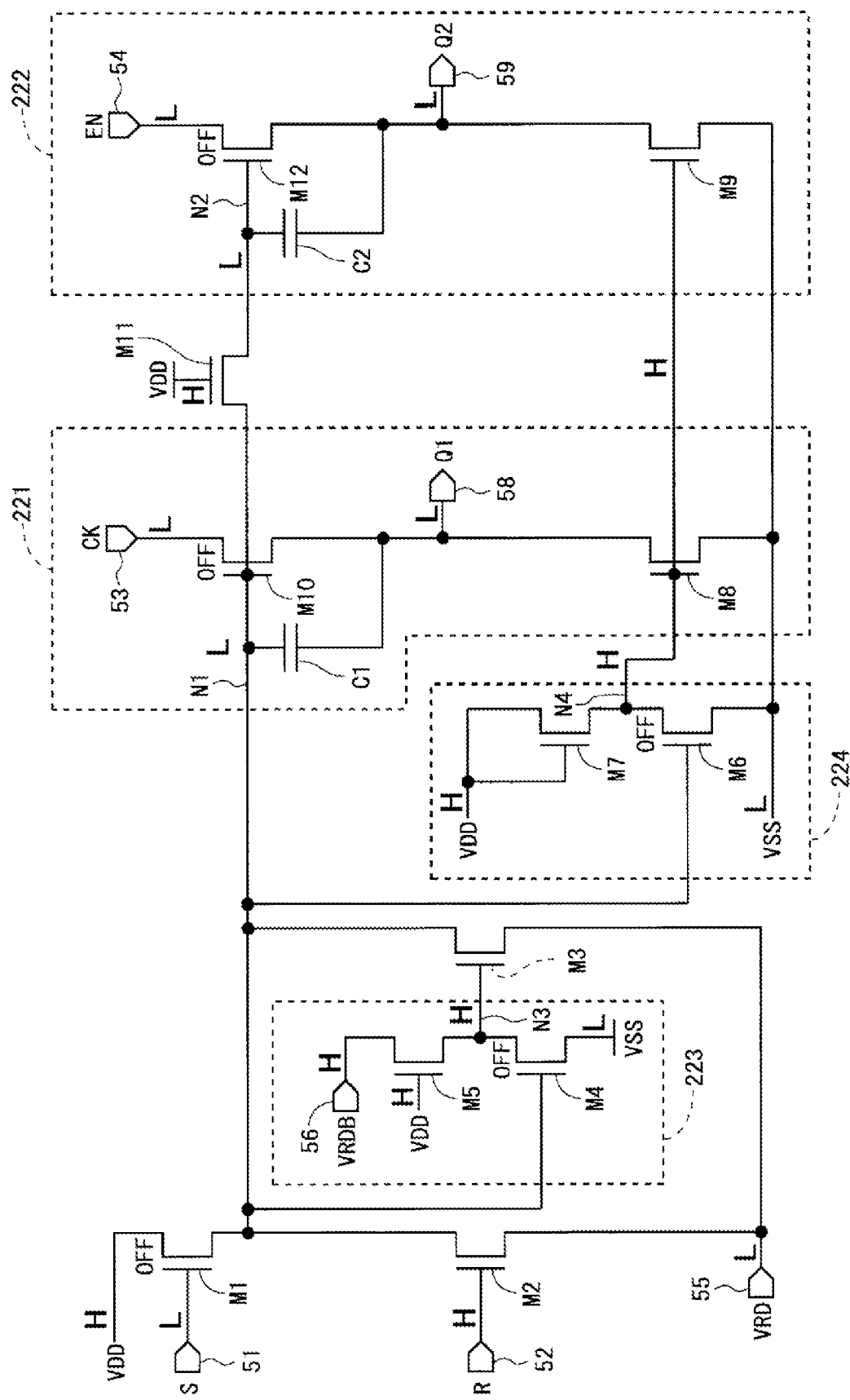
FIG. 13 is a diagram for describing a state of the unit circuit when the operation mode is set to the non-monitoring mode in the first embodiment described above.

FIG. 13 illustrates a state of the unit circuit 22(i) in a period P03. When the period P03 starts, the reset signal R changes from the low level to the high level. Thus, the transistor M2 is turned on. Since the stabilization control signal VRD is maintained at the low level, the transistor M2 is turned on, and thus, the potential of the first internal node N1 is set to the low level. Due to this, the transistor M11 is turned on, and the potential of the second internal node N2 is also set to the low level. In addition, the potential of the first internal node N1 is set to the low level, and thus, the transistors M4 and M6 are turned off. As a result, the potential of the third internal node N3 and the potential of the fourth internal node N4 are set to the high level.

Figure 14:
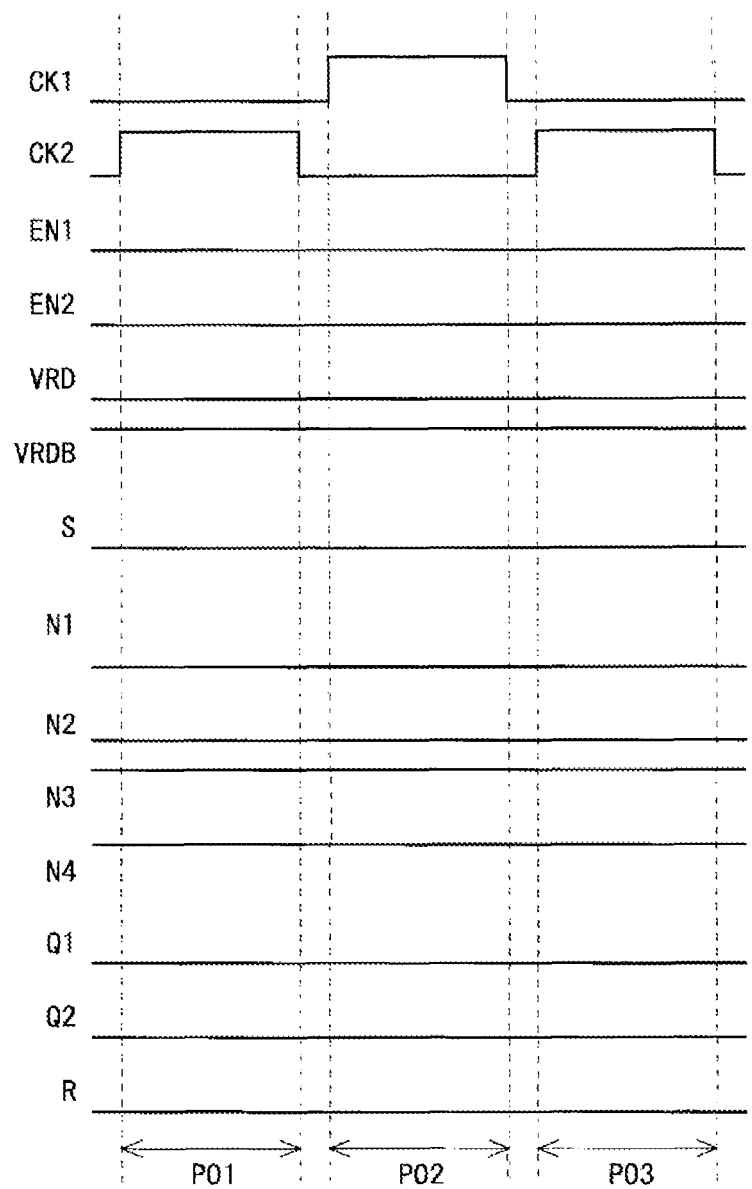
FIG. 14 is a signal waveform diagram for describing an operation (an operation when writing is not performed in the corresponding row) of the unit circuit when the operation mode is set to the non-monitoring mode in the first embodiment described above.

When writing to the rows other than the i-th row is performed (when a row to be selected is a row other than the i-th row), since the pulse of the set signal S is not input to the unit circuit 22(i) at the i-th stage, as is the case with the periods P00 and P03 in FIG. 9, the potential of the first internal node N1, the potential of the second internal node N2, the potential of the output signal Q1, and the potential of the output signal Q2 are maintained at the low level, and the potential of the third internal node N3 and the potential of the fourth internal node N4 are maintained at the high level (see FIG. 14).

1.4.3 Operation when Operation Mode is Set to Monitoring Mode

Figure 15:
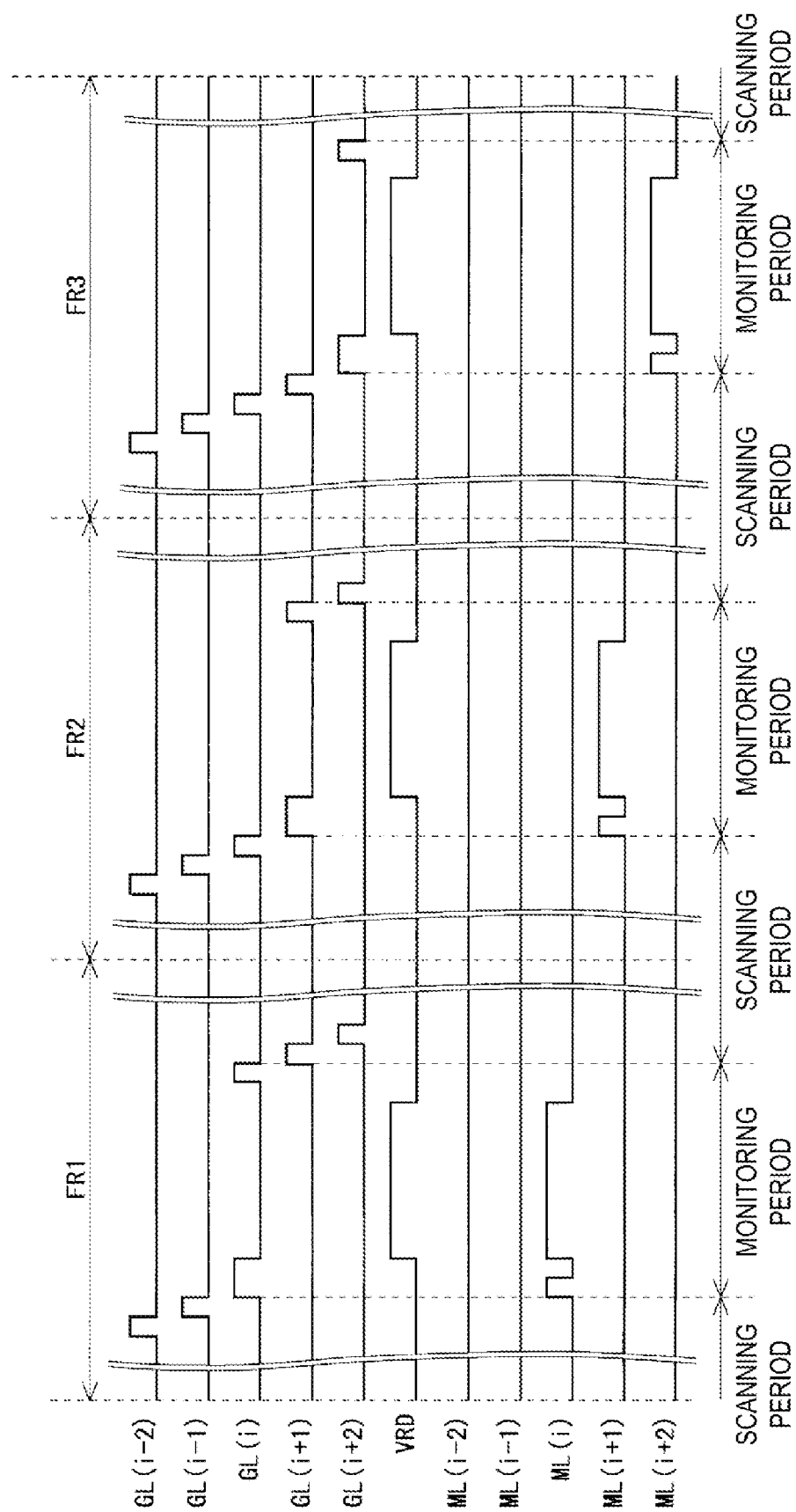
FIG. 15 is a signal waveform diagram for three consecutive frame periods when the operation mode is set to the monitoring mode in the first embodiment described above.

FIG. 15 is a signal waveform diagram of successive three frame periods FR1 to FR3 when the operation mode is set to the monitoring mode. The monitoring processing for the i-th row is performed in the frame period FR1, the monitoring processing for the (i+1)-th row is performed in the frame period FR2, and the monitoring processing for the (i+2)-th row is performed in the frame period FR3. As described above, in the present embodiment, the monitoring processing is performed for one row in each frame period. However, the monitoring processing may be performed for a plurality of rows in each frame period. As can be understood from FIG. 15, in each frame period, the scanning signal GL corresponding to the non-monitoring row is set to the high level only once, but the scanning signal GL corresponding to the monitoring row is set to the high level twice. In this manner, the scanning pulse is given twice to the scanning signal line GL corresponding to the monitoring row in each frame period. A period from the rise of the first scanning pulse to the decay of the second scanning pulse is the monitoring period. In each frame period, the monitoring control signal ML corresponding to the non-monitoring row is maintained at the low level, but the monitoring control signal ML corresponding to the monitoring row is set to the high level twice in the monitoring period.

With reference to FIG. 16 to FIG. 23, an operation of the unit circuit 22(i) at the i-th stage when the operation mode is set to the monitoring mode will be described. However, it is assumed that the i-th row is the monitoring row, and attention is focused on the operation when the monitoring processing is performed for the i-th row. Immediately before the start of a period P10, the potential of the first internal node N1 and the potential of the second internal node N2 are at the low level, the potential of the third internal node N3 and the potential of the fourth internal node N4 are at the high level, the stabilization control signal VRD is at the low level, and the stabilization control signal VRDB is at the high level. Note that the stabilization control signal VRD being at the low level (an off level signal to be applied to the first control signal line) is a signal being at such a level that the transistor M10 is turned off when the signal is supposed to be applied to the control terminal of the transistor M10. Furthermore, the stabilization control signal VRDB being at the high level (an on level signal to be applied to the second control signal line) is a signal being at such a level that the transistor M3 is turned on when the signal is supposed to be applied to the control terminal of the transistor M3.

Figure 17:
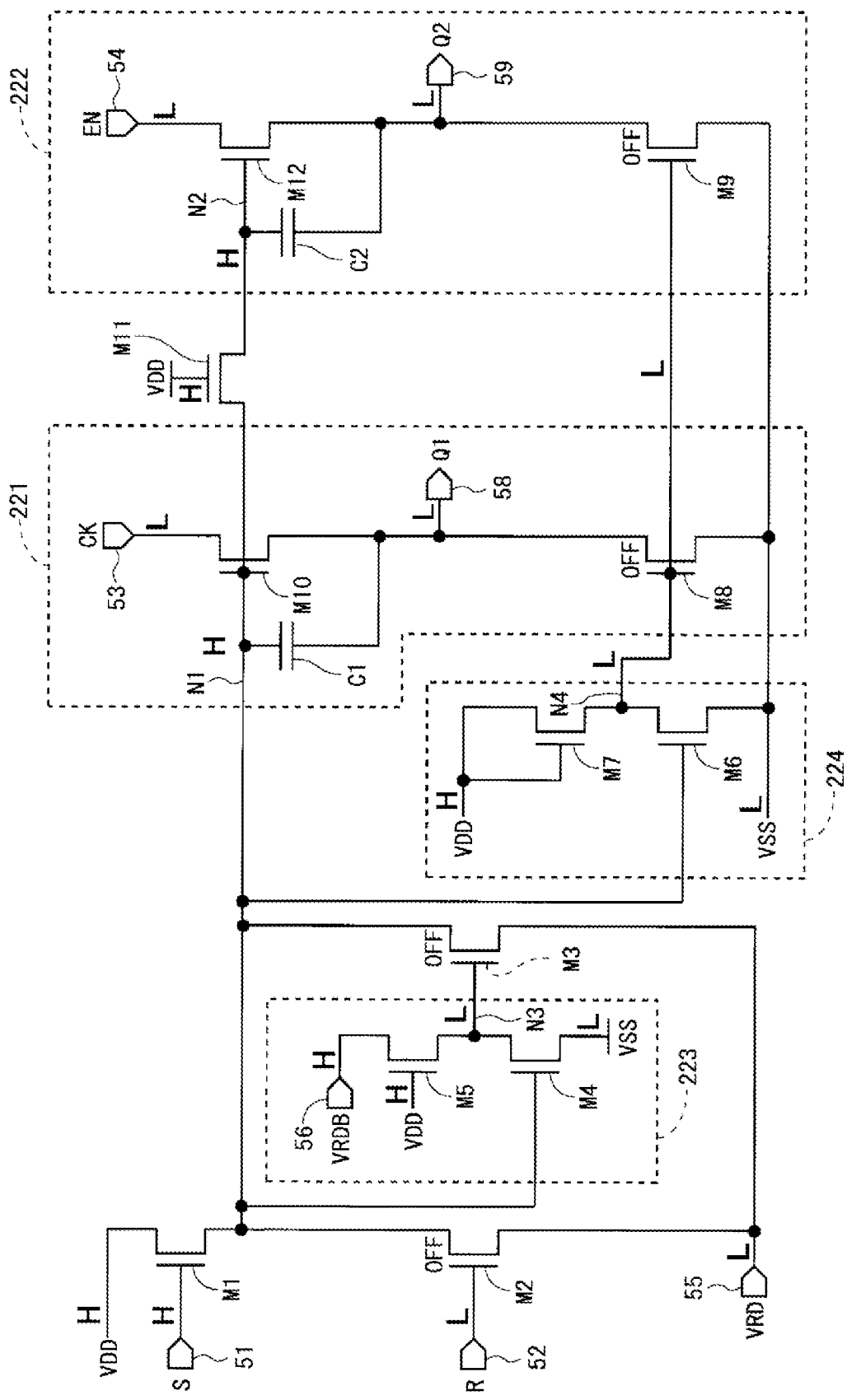
FIG. 17 is a diagram for describing a state of the unit circuit corresponding to the monitoring row when the operation mode is set to the monitoring mode in the first embodiment described above.

FIG. 17 illustrates a state of the unit circuit 22(i) in the period P10. When the period P10 starts, the set signal S changes from the low level to the high level. The pulse of this set signal S causes the transistor M1 to be in the on state, and the capacitor C1 is charged. At this time, since the transistor M11 is in the on state, the capacitor C2 is also charged. As described above, the potential of the first internal node N1 increases, the transistor M10 is turned on, and the potential of the second internal node N2 increases, and thus, the transistor M12 is turned on. However, since the clock signal CK (the clock signal CK1) and the enable signal EN (the enable signal EN1) are maintained at the low level in the period P10, the output signals Q1 and Q2 are maintained at the low level. Further, in the period P10, similar to the period P01 in FIG. 9, the potential of the third internal node N3 and the potential of the fourth internal node N4 are set to the low level.

Figure 18:
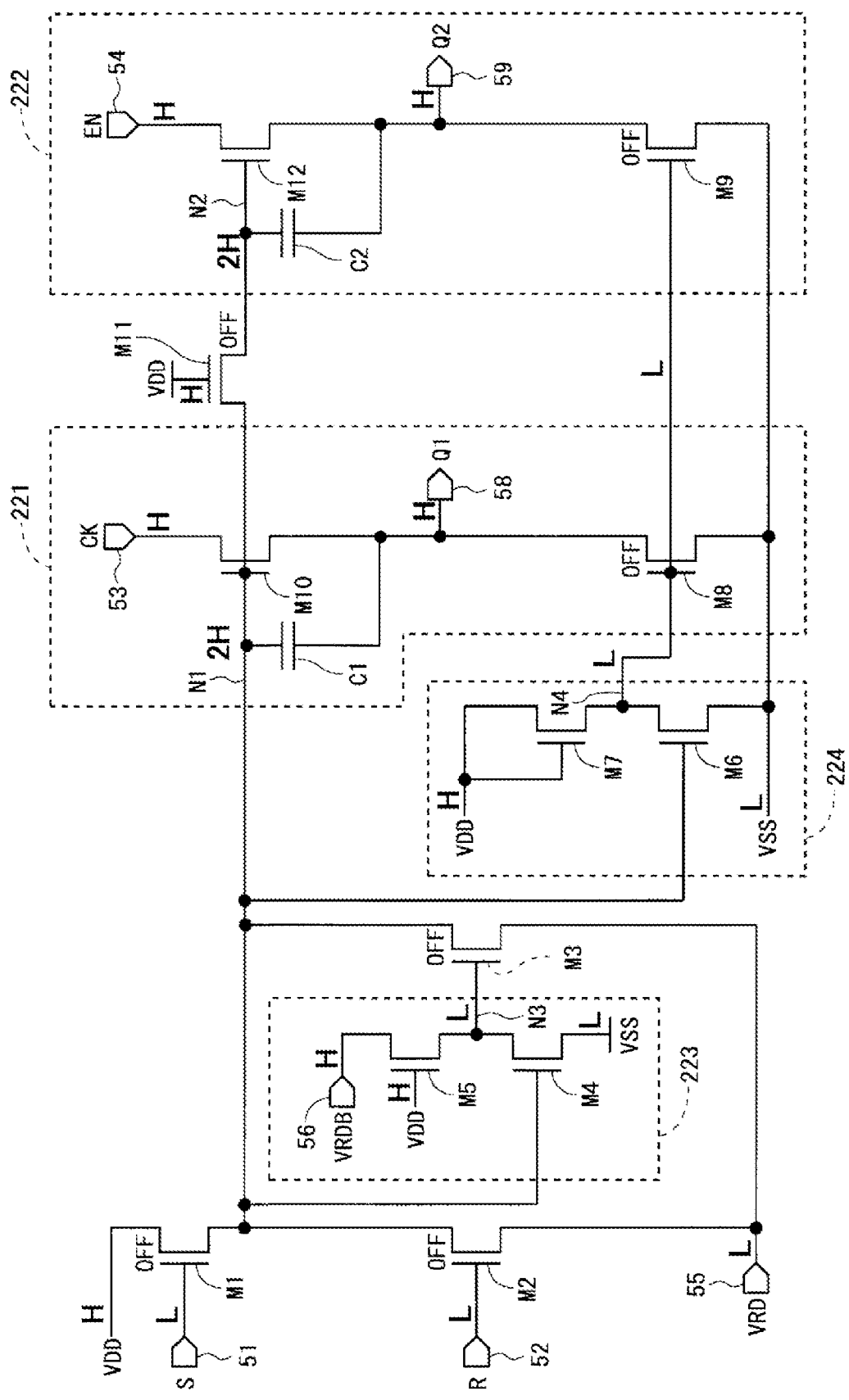
FIG. 18 is a diagram for describing a state of the unit circuit corresponding to the monitoring row when the operation mode is set to the monitoring mode in the first embodiment described above.

FIG. 18 illustrates a state of the unit circuit 22(i) in a period P11. When the period P11 starts, the clock signal CK (the clock signal CK1) changes from the low level to the high level. At this time, since the transistor M10 is in the on state, the potential of the output terminal 58 (the potential of the output signal Q1) rises along with the rise of the potential of the input terminal 53. According to this, the potential of the first internal node N1 also increases via the capacitor C1. As a result, a large voltage is applied to the control terminal of the transistor M10, and the potential of the output signal Q1 rises to a level sufficient to cause the writing control transistor T1 being a connection destination of the output terminal 58 to be turned on. Additionally, when the period P11 starts, the enable signal EN (the enable signal EN1) changes from the low level to the high level. At this time, since the transistor M12 is in the on state, the potential of the output terminal 59 (the potential of the output signal Q2) rises along with the rise of the potential of the input terminal 54. With this, the potential of the second internal node N2 also increases via the capacitor C2 (the second internal node N2 is set to a boost state). As a result, a large voltage is applied to the control terminal of the transistor M12, and the potential of the output signal Q2 increases to a level sufficient to cause the monitoring control transistor T3 being a connection destination of the output terminal 59 to be turned on.

Figure 19:
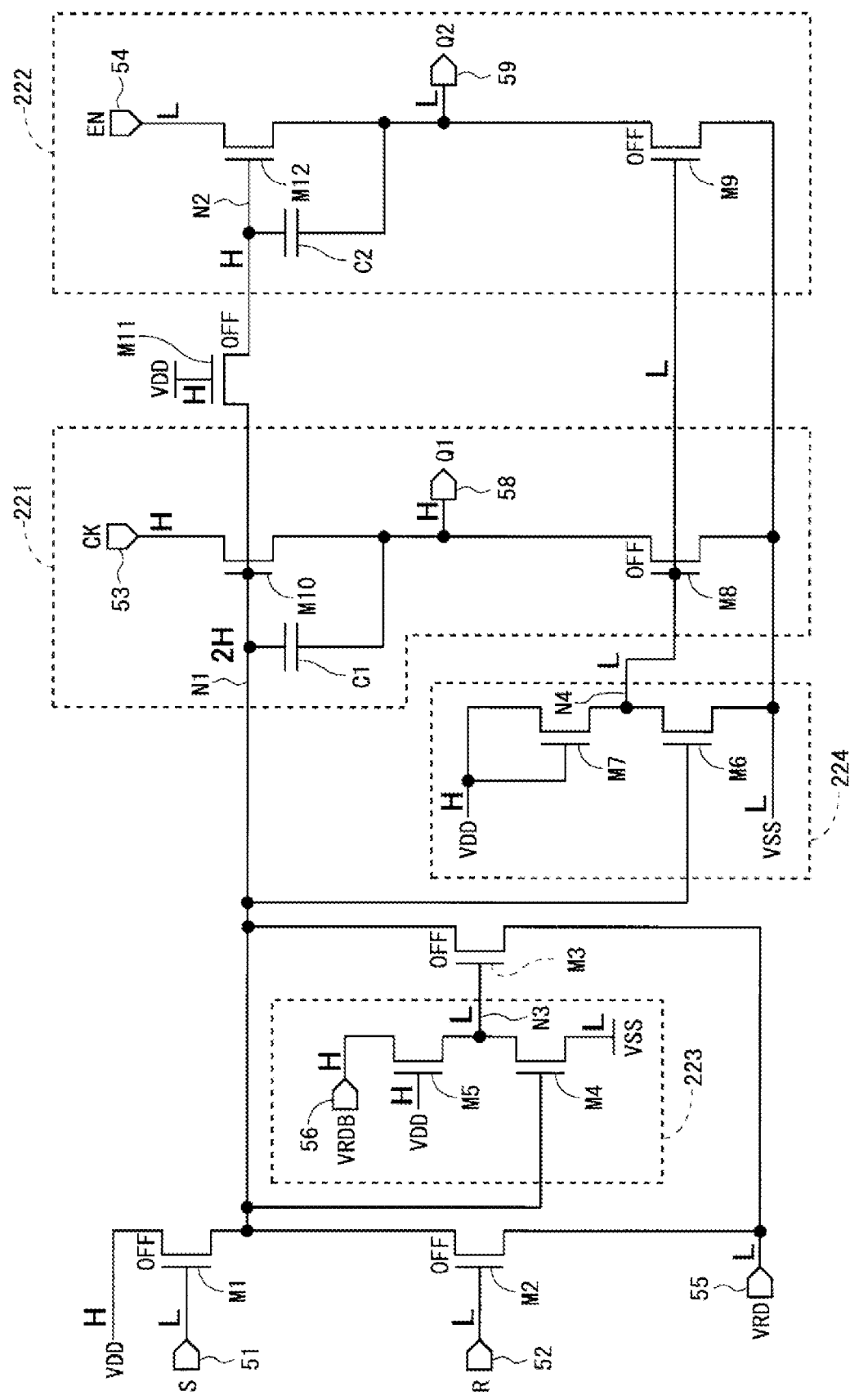
FIG. 19 is a diagram for describing a state of the unit circuit corresponding to the monitoring row when the operation mode is set to the monitoring mode in the first embodiment described above.

FIG. 19 illustrates a state of the unit circuit 22(i) in a period P12. When the period P12 starts, the enable signal EN (the enable signal EN1) changes from the high level to the low level. As a result, the potential of the output terminal 59 (the potential of the output signal Q2) decreases as the potential of the input terminal 54 decreases. As the potential of the output terminal 59 decreases, the potential of the second internal node N2 also decreases via the capacitor C2. When the period P12 ends, the clock signal CK (the clock signal CK1) changes from the high level to the low level. As a result, the potential of the output terminal 58 (the potential of the output signal Q1) decreases as the potential of the input terminal 53 decreases. As the potential of the output terminal 58 decreases, the potential of the first internal node N1 also decreases via the capacitor C1. Furthermore, when the period P12 ends, the stabilization control signal VRDB changes from the high level to the low level (the off level potential is applied to the second control signal line). This stabilization control signal VRDB being at the low level is a signal being at such a level that the transistor M3 is turned off when the signal is supposed to be applied to the control terminal of the transistor M3.

Figure 20:
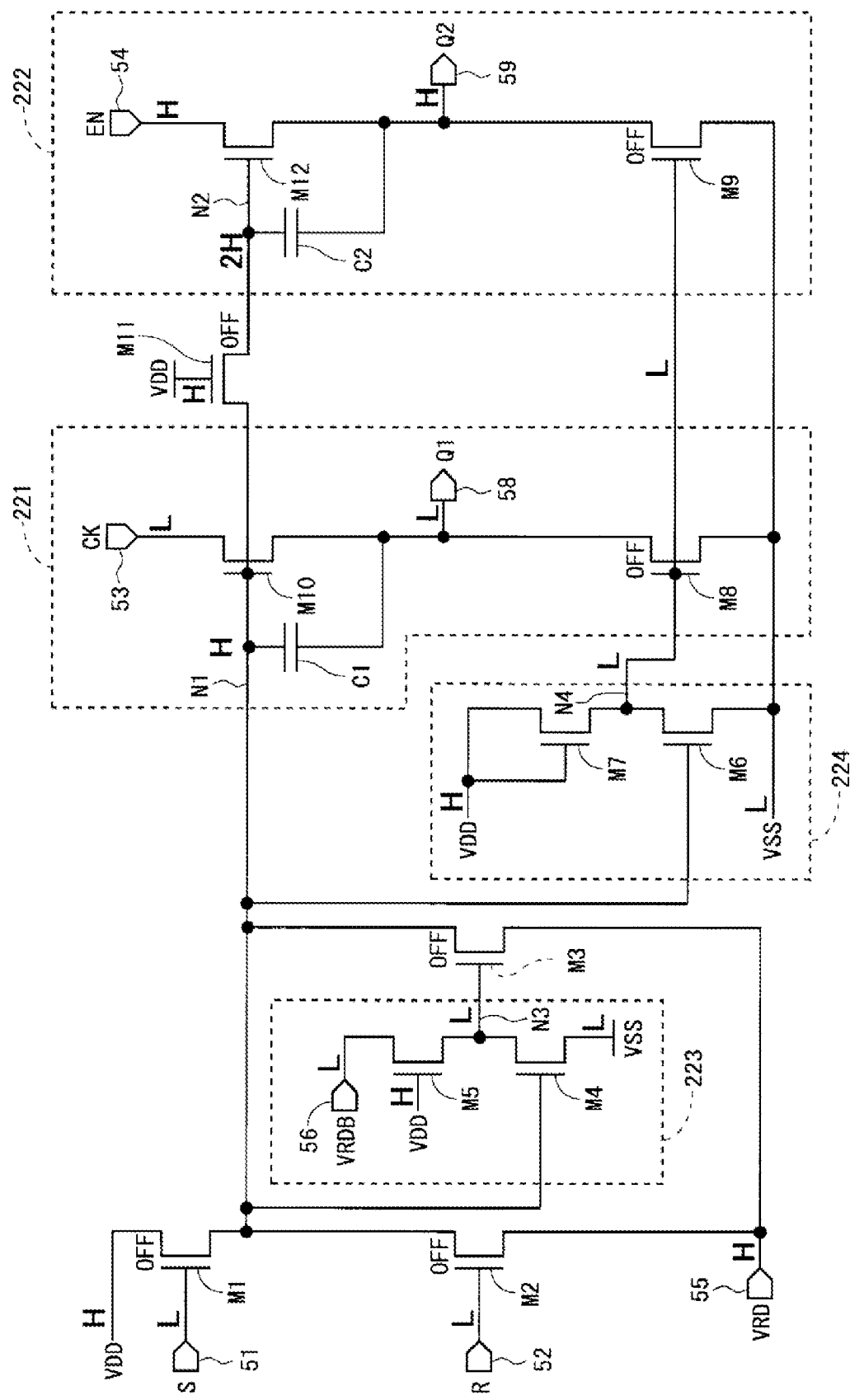
FIG. 20 is a diagram for describing a state of the unit circuit corresponding to the monitoring row when the operation mode is set to the monitoring mode in the first embodiment described above.

FIG. 20 illustrates a state of the unit circuit 22(i) in periods P13 to P14. Note that the period P13 is a period in which a current to be measured that flows through the data signal line SL is stabilized, and the period P14 is a period in which the current is measured outside the pixel circuits 410. When the period P13 starts, the enable signal EN (the enable signal EN1) changes from the low level to the high level. With this, similar to the period P11, the potential of the second internal node N2 and the potential of the output signal Q2 increase. Further, in the period P13, the stabilization control signal VRD changes from the low level to the high level (the on level potential is applied to the first control signal line). This stabilization control signal VRD being at the high level is a signal being at such a level that the transistor M10 is turned on when the signal is supposed to be applied to the control terminal of the transistor M10 (in other words, a signal being at a level corresponding to the potential of the first internal node N1 in the periods P13 to P14). As a result, a voltage between the first conduction terminal and the second conduction terminal (drain-source voltage) with regard to each of the transistors M2 and M3 is reduced, and thus, reductions in potentials of the first internal node N1 and the second internal node N2 caused by off-leakage at the transistors M2 and M3 are suppressed throughout the periods P13 to P14. When the period P14 ends, the enable signal EN (the enable signal EN1) changes from the high level to the low level. As a result, the potential of the output terminal 59 (the potential of the output signal Q2) decreases as the potential of the input terminal 54 decreases. With this, the potential of the second internal node N2 also decreases via the capacitor C2. Additionally, when the period P14 ends, the stabilization control signal VRD changes from the high level to the low level.

Figure 21:
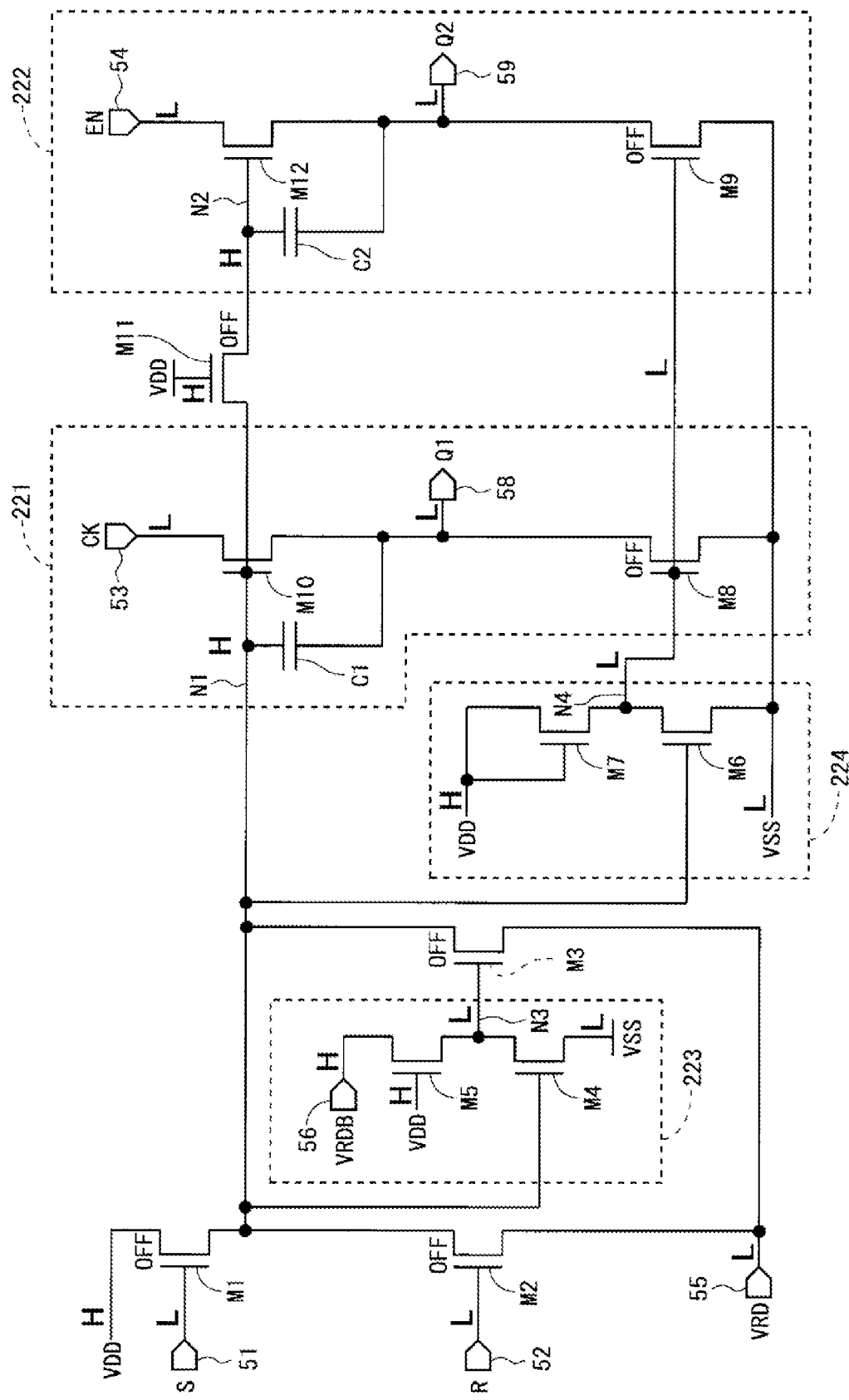
FIG. 21 is a diagram for describing a state of the unit circuit corresponding to the monitoring row when the operation mode is set to the monitoring mode in the first embodiment described above.

FIG. 21 illustrates a state of the unit circuit 22(i) in a period P15. When the period P15 starts, the stabilization control signal VRDB changes from the low level to the high level. At this time, since the potential of the first internal node N1 is maintained at the high level, the transistor M4 is maintained in the on state. As a result, the potential of the third internal node N3 is maintained at the low level.

Figure 22:
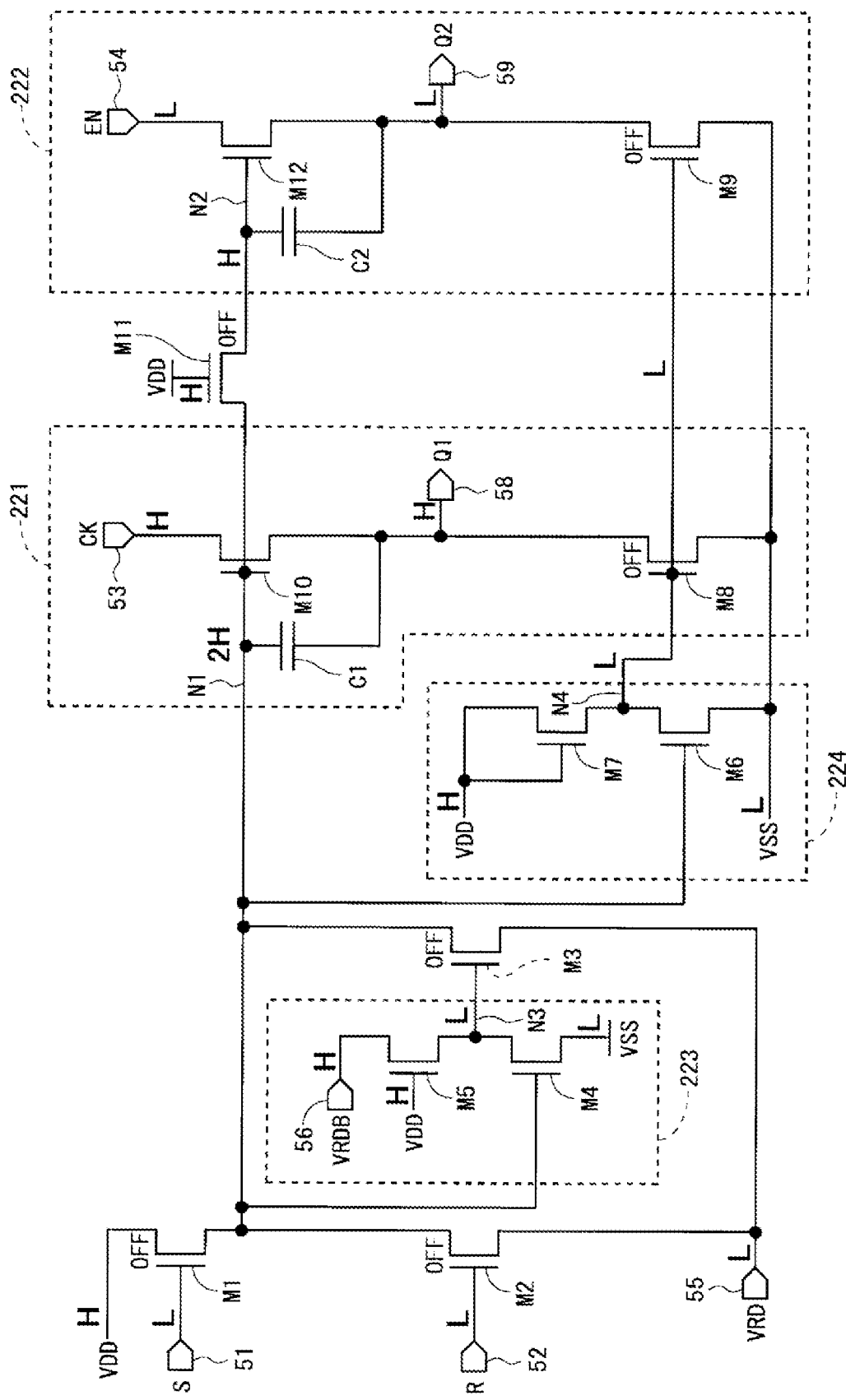
FIG. 22 is a diagram for describing a state of the unit circuit corresponding to the monitoring row when the operation mode is set to the monitoring mode in the first embodiment described above.

FIG. 22 illustrates a state of the unit circuit 22(i) in a period P16. When the period P16 starts, the clock signal CK (the clock signal CK1) changes from the low level to the high level. As a result, similar to the period P11, the potential of the first internal node N1 and the potential of the output signal Q1 increase. Note that, since the enable signal EN (the enable signal EN1) is maintained at the low level in the period P16, the potential of the second internal node N2 does not rise. When the period P16 ends, the clock signal CK (the clock signal CK1) changes from the high level to the low level. As a result, the potential of the output terminal 58 (the potential of the output signal Q1) decreases as the potential of the input terminal 53 decreases. With this, the potential of the first internal node N1 also decreases via the capacitor C1.

Figure 23:
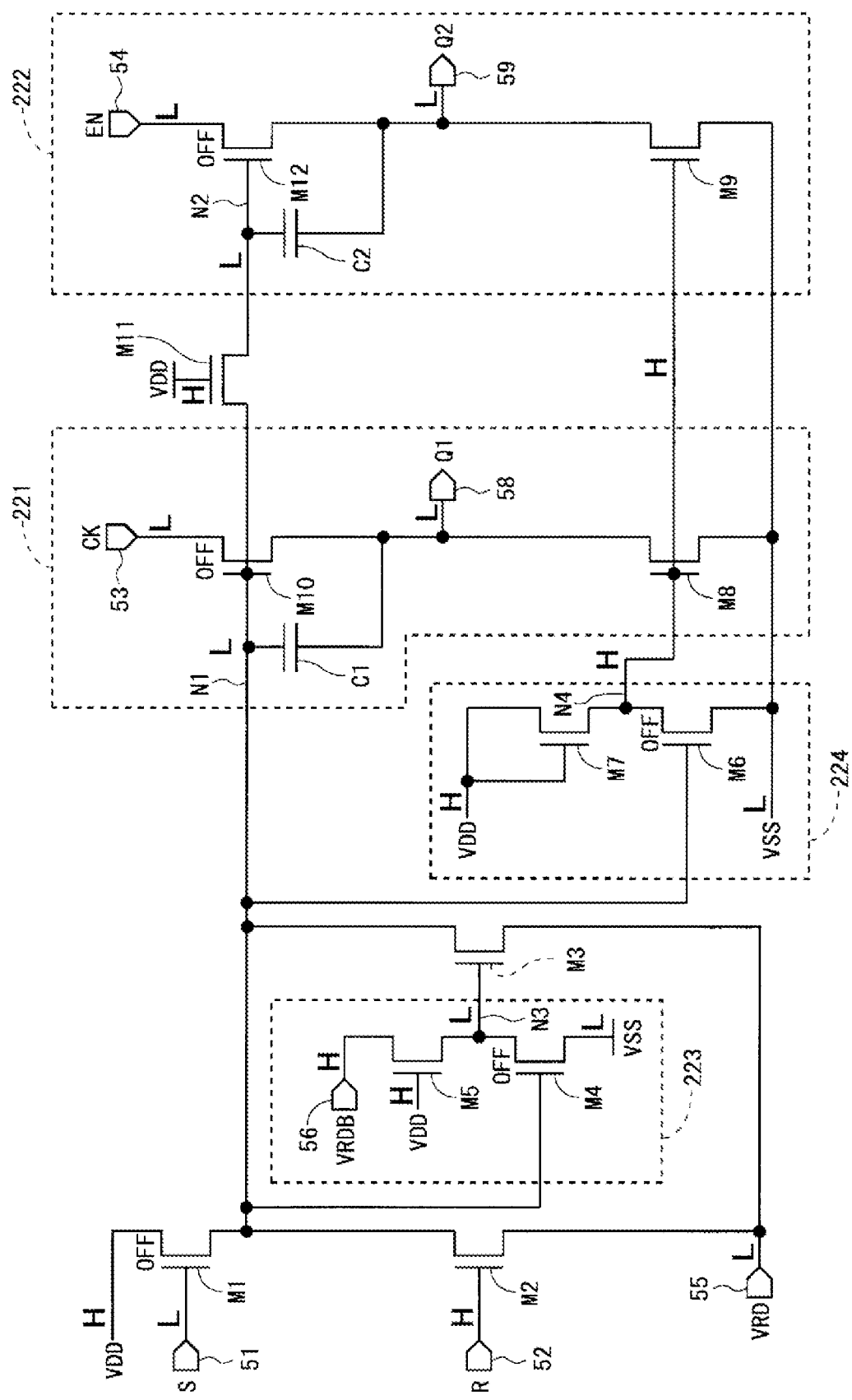
FIG. 23 is a diagram for describing a state of the unit circuit corresponding to the monitoring row when the operation mode is set to the monitoring mode in the first embodiment described above.

FIG. 23 illustrates a state of the unit circuit 22(i) in a period P17. When the period P17 starts, the reset signal R changes from the low level to the high level. Thus, the transistor M2 is turned on. As a result, as is the case with the period P03 in FIG. 9, the potentials of the first internal node N1 and the second internal node N2 are set to the low level, and the potential of the third internal node N3 and the potential of the fourth internal node N4 are set to the high level.

As described above, in the pixel circuit 410 in the i-th row, the writing control transistor T1 is set to the on state in the periods P11, P12, and P16, and the monitoring control transistor T3 is set to the on state in the periods P11, P13, and P14. In this way, the monitoring processing for the pixel circuit 410 in the i-th row is performed in the periods P11 to P16.

Figure 24:
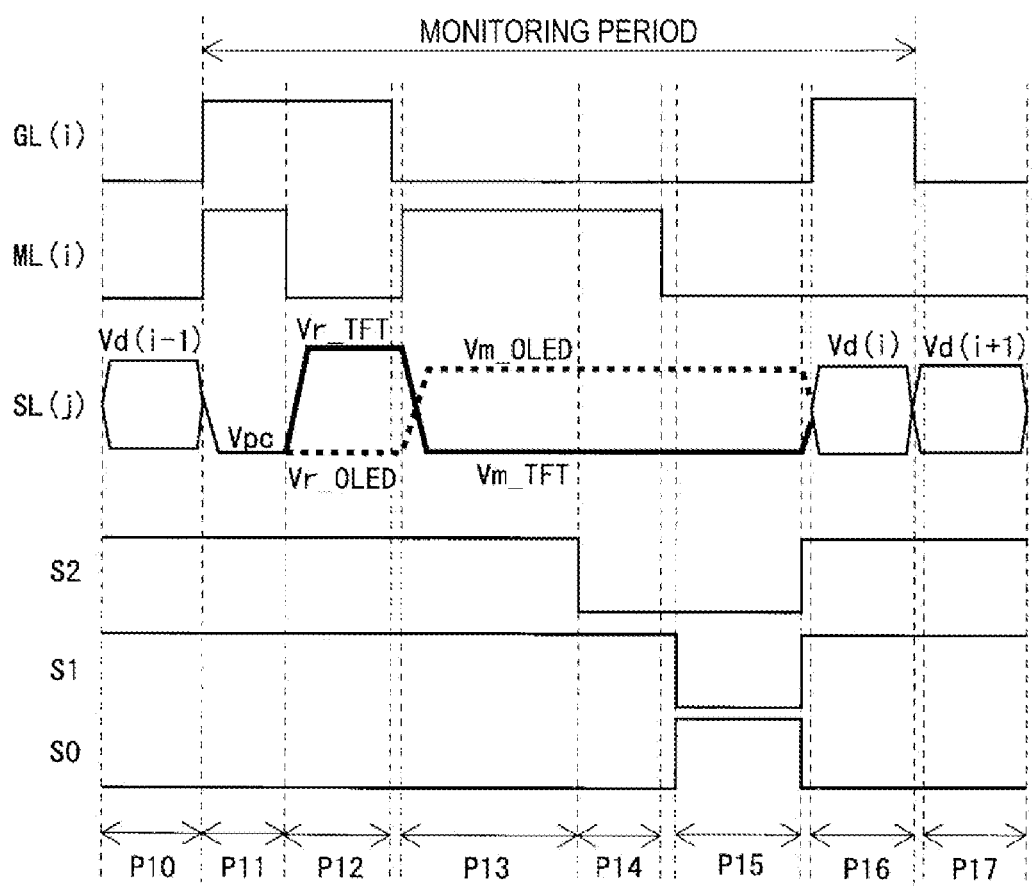
FIG. 24 is a signal waveform diagram for describing operations of the pixel circuit and a current monitoring unit when monitoring processing is performed in the first embodiment described above.

Next, the operations of the pixel circuit 410 and the current monitoring unit 320 when the monitoring processing is performed will be described with reference to FIG. 24. Here, attention is focused on the pixel circuit 410 at the i-th row and the j-th column and the current monitoring unit 320 corresponding to the j-th column.

In the period P10, writing is performed based on a data potential Vd(i−1) for image display in the (i−1)-th row. Immediately before the end of the period P10, the scanning signal GL(i) and the monitoring control signal ML(i) are at the low level. Thus, the writing control transistor T1 and the monitoring control transistor T3 are in the off state. Further, immediately before the end of the period P10, the control signals S2 and S1 are at the high level, and the control signal S0 is at the low level. Thus, the switches 323 and 324 are in the on state and the switch 325 is in the off state. At this time, the data signal line SL(j) and the internal data line Sin(j) are electrically connected.

When the period P11 starts, the scanning signal GL(i) and the monitoring control signal ML(i) change from the low level to the high level. This causes the writing control transistor T1 and the monitoring control transistor T3 to be set to the on state. In the period P11, an initialization potential Vpc that initializes the state of the pixel circuit 410 is applied to the data signal line SL(j). As a result, the state of the capacitor C and the anode potential of the organic EL element L1 are initialized.

When the period P12 starts, the monitoring control signal ML(i) changes from the high level to the low level. This causes the monitoring control transistor T3 to be in the off state. In this state, a characteristic detection potential Vr_TFT or a characteristic detection potential Vr_OLED is applied to the data signal line SL(j). The characteristic detection potential Vr_TFT is a potential set so that a current flows into the drive transistor T2 but no current flows into the organic EL element L1. The characteristic detection potential Vr_OLED is a potential set so that a current flows into the organic EL element L1 but no current flows into the drive transistor T2.

When the period P13 starts, the scanning signal GL(i) changes from the high level to the low level, and the monitoring control signal ML(i) changes from the low level to the high level. This causes the writing control transistor T1 to be set to the off state, and causes the monitoring control transistor T3 to be set to the on state. In this state, a current measurement potential Vm_TFT or a current measurement potential Vm_OLED is applied to the data signal line SL(j). As a result, when the TFT characteristics are being measured, a current flowing into the drive transistor T2 flows into the current monitoring unit 320 via the monitoring control transistor T3 and the data signal line SL(j), and when the OLED characteristics are being measured, a current flows from the current monitoring unit 320 to the organic EL element L1 via the data signal line SL(j) and the monitoring control transistor T3. At this time, since the control signal S2 is at the high level, the switch 323 is in the on state and no charge is accumulated in the capacitor 322. Note that the period P13 is set to have a length sufficient to stabilize a current to be measured that flows through the data signal line SL(j).

When the period P14 starts, the control signal S2 changes from the high level to the low level. This causes the switch 323 to be set to the off state, and the operational amplifier 301 and the capacitor 322 function as an integrator circuit. As a result, an output voltage of the operational amplifier 301 is a voltage corresponding to a current flowing through the data signal line SLj).

When the period P15 starts, the control signal S1 changes from the high level to the low level, and the control signal S0 changes from the low level to the high level. This causes the switch 324 to be set to the off state, and causes the switch 325 to be set to the on state. When the switch 324 is in the off state, the data signal line SL(j) and the internal data line Sin(j) are electrically disconnected. In this state, the output voltage of the operational amplifier 301 (a charging voltage of the capacitor 322) is converted to a digital signal by the A/D converter 327. The digital signal is sent to the display control circuit 10 as the monitoring data MO, and is used to correct the input image signal DIN.

When the period P16 starts, the control signals S2 and S1 change from the low level to the high level, and the control signal S0 changes from the high level to the low level. This causes the switches 323 and 324 to be set to the on state, and causes the switch 325 to be set to the off state. Further, in the period P16, the scanning signal GL(i) changes from the low level to the high level. Thus, the writing control transistor T1 is set to the on state. In this state, the data potential Vd(i) for image display is applied to the data signal line SL(j), and writing based on the data potential Vd(i) is performed in the pixel circuit 410 at the i-th row and the j-th column.

When the period P17 starts, the scanning signal GL(i) changes from the high level to the low level. This causes the writing control transistor T1 to be set to the off state. Note that, in the period P17, writing is performed based on the data potential Vd(i+1) for image display in the (i+1)-th row. In the period P17 and subsequent periods, the organic EL element L1 emits light, based on the writing in the period P16, in the pixel circuit 410 at the i-th row and the j-th column.

Note that the period P11 corresponds to an initialization period, the period P12 corresponds to a writing period for measurement, the period P14 corresponds to a measurement period, and the period P16 corresponds to a second writing period.

Next, with reference to FIG. 25 to FIG. 31, an operation of the unit circuit 22(i) at the i-th stage when the i-row is supposed to be the non-monitoring row will be described. However, it is assumed that the monitoring processing is performed on the monitoring row in a period on which attention is focused here. Immediately before the start of the period P10, the potential of the first internal node N1 and the potential of the second internal node N2 are at the low level, the potential of the third internal node N3 and the potential of the fourth internal node N4 are at the high level, the stabilization control signal VRD is at the low level, and the stabilization control signal VRDB is at the high level.

Figure 26:
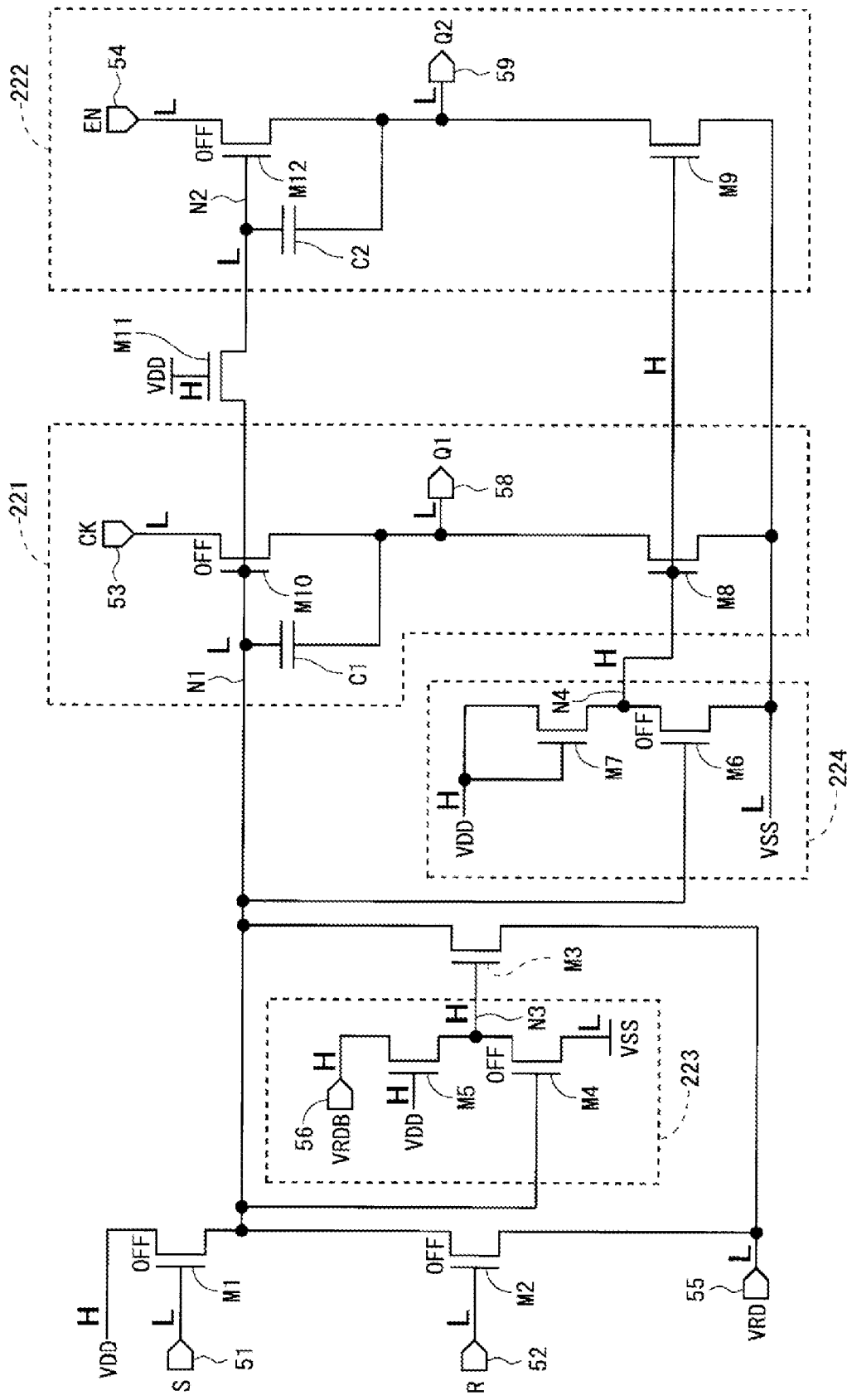
FIG. 26 is a diagram for describing a state of the unit circuit corresponding to the non-monitoring row when the operation mode is set to the monitoring mode in the first embodiment described above.

FIG. 26 illustrates a state of the unit circuit 22(i) in the period P10. When the period P10 starts, the clock signal CK2 changes from the low level to the high level, but the clock signal CK2 is not input to the unit circuit 22(i). Thus, the state of the unit circuit 22(i) is maintained in a state immediately before the start of the period P10.

Figure 27:
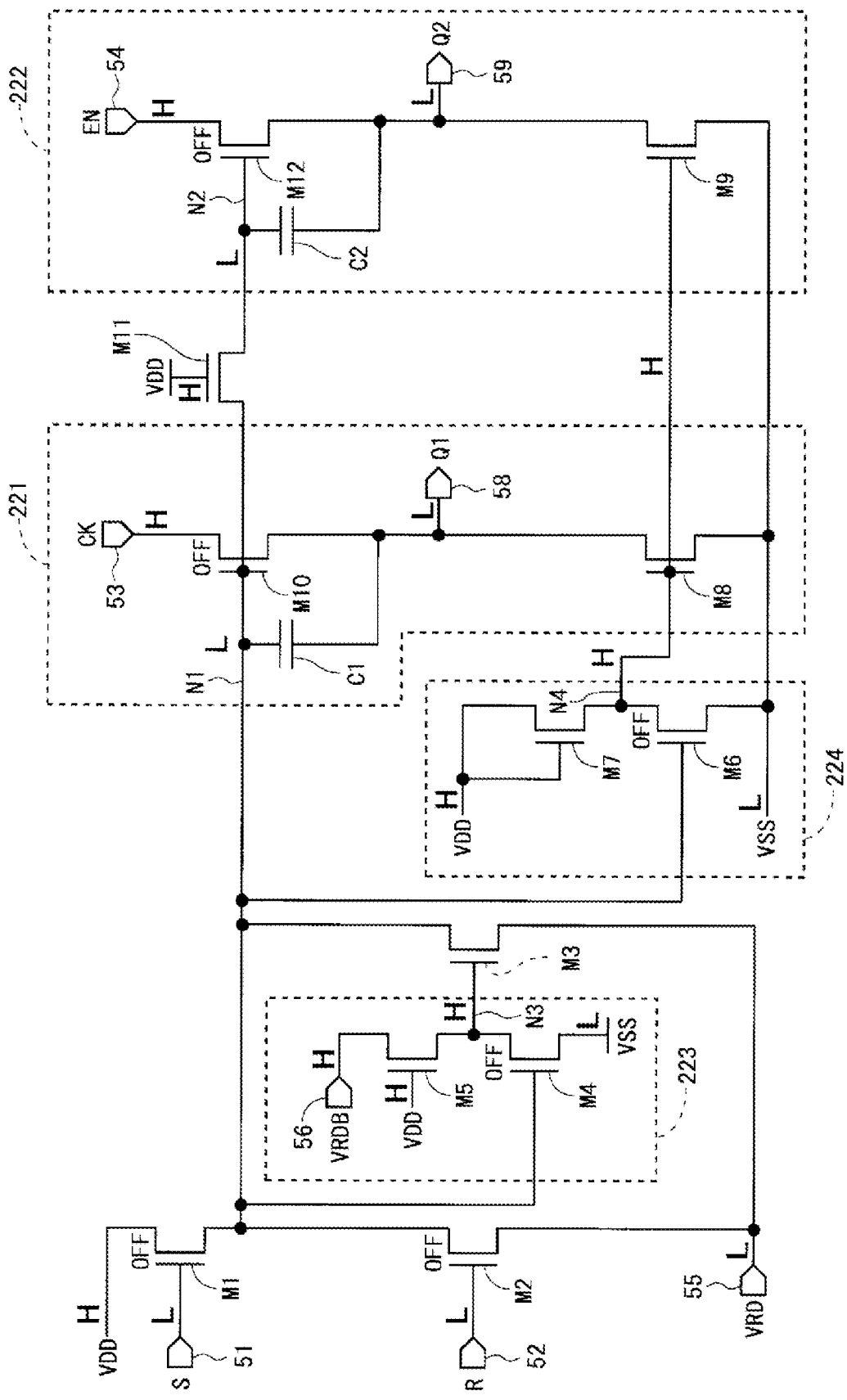
FIG. 27 is a diagram for describing a state of the unit circuit corresponding to the non-monitoring row when the operation mode is set to the monitoring mode in the first embodiment described above.

FIG. 27 illustrates a state of the unit circuit 22(i) in the period P11. When the period P11 starts, the clock signal CK (the clock signal CK1) and the enable signal EN (the enable signal EN1) change from the low level to the high level. However, since the potential of the first internal node N1 and the potential of the second internal node N2 are maintained at the low level, the potential of the output terminal 58 (the potential of the output signal Q1) and the potential of the output terminal 59 (the potential of the output signal Q2) are maintained at the low level.

Figure 28:
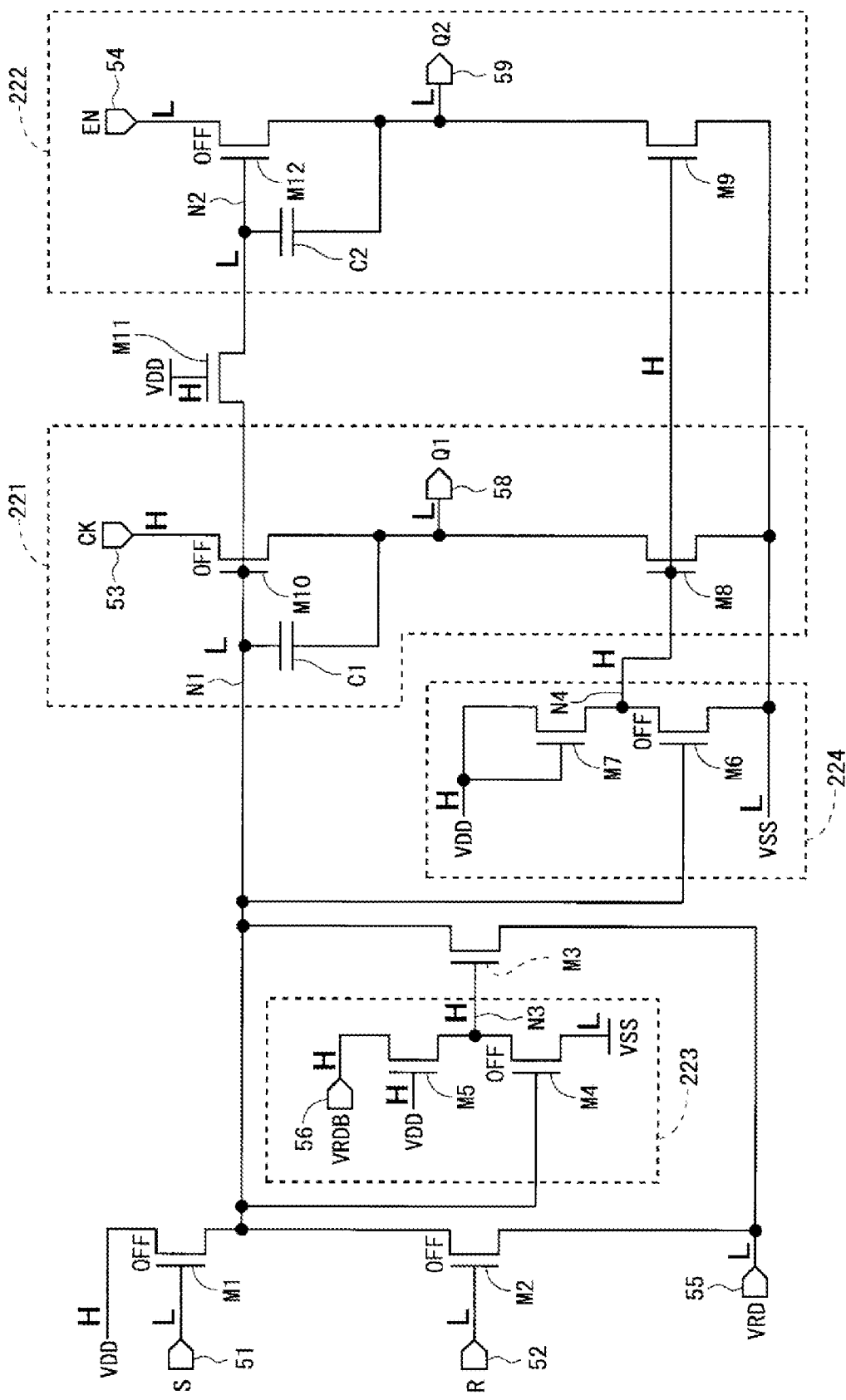
FIG. 28 is a diagram for describing a state of the unit circuit corresponding to the non-monitoring row when the operation mode is set to the monitoring mode in the first embodiment described above.

FIG. 28 illustrates a state of the unit circuit 22 (i) in the period P12. When the period P12 starts, the enable signal EN (the enable signal EN1) changes from the high level to the low level, but the state of the unit circuit 22(i) is maintained in the state in the period P11. When the period P12 ends, the stabilization control signal VRDB changes from the high level to the low level. This causes the potential of the third internal node N3 to be set to the low level.

Figure 29:
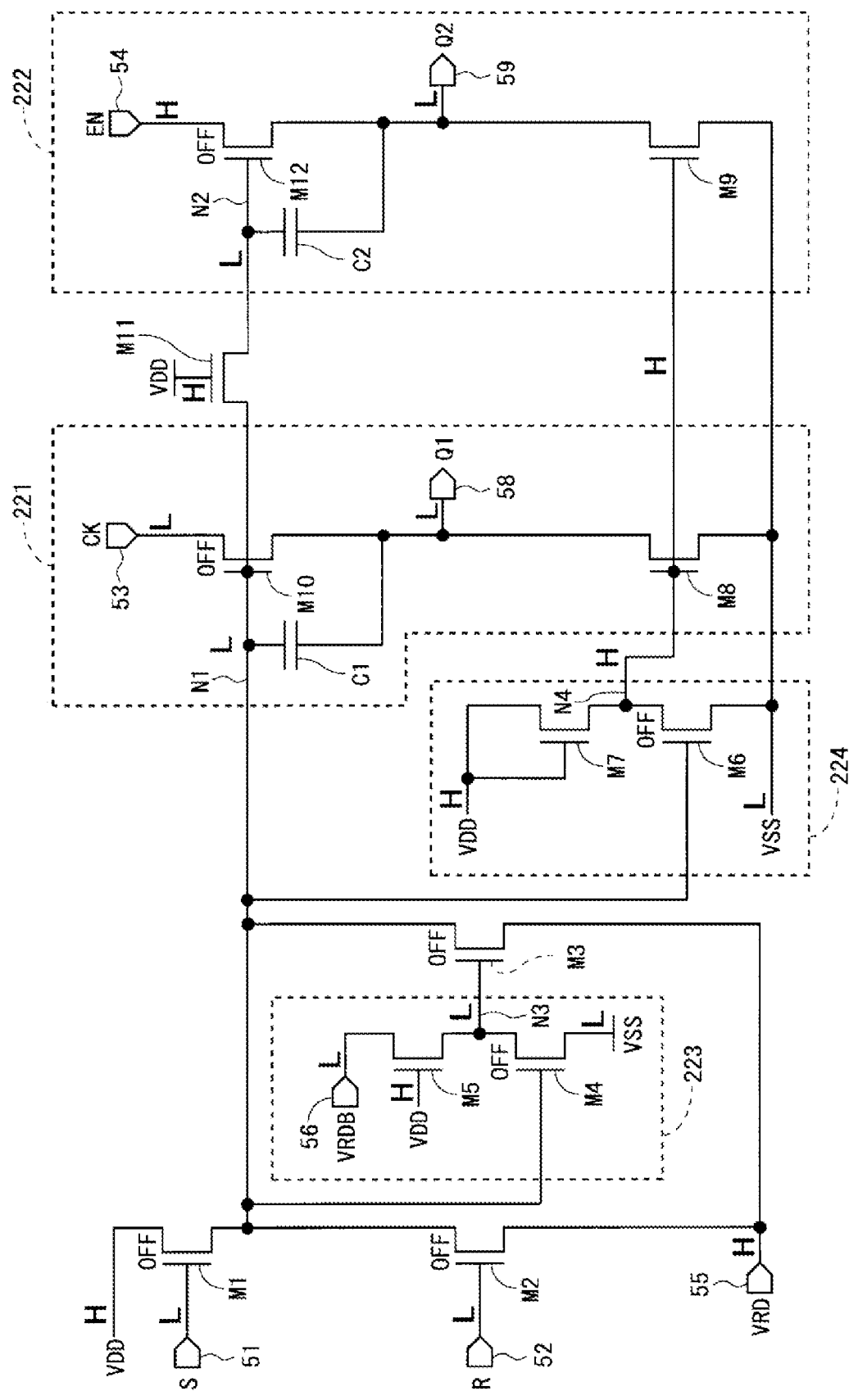
FIG. 29 is a diagram for describing a state of the unit circuit corresponding to the non-monitoring row when the operation mode is set to the monitoring mode in the first embodiment described above.

FIG. 29 illustrates a state of the unit circuit 22(i) in the periods P13 to P14. When the period P13 starts, the enable signal EN (the enable signal EN1) changes from the low level to the high level. However, since the potential of the second internal node N2 is maintained at the low level, the potential of the output terminal 59 (the potential of the output signal Q2) is maintained at the low level. Further, when the period P13 starts, the stabilization control signal VRD changes from the low level to the high level. Incidentally, the potential of the fourth internal node N4 is maintained at the high level. Thus, the transistor M9 is maintained in the on state. Here, the second conduction terminal of the transistor M9 is applied with the low-level potential VSS. Thus, even when off-leakage occurs at the transistor M12 in the periods P13 to P14, the potential of the output terminal 59 (the potential of the output signal Q2) is maintained at the low level. Also, since the potential of the third internal node N3 is maintained at the low level in the periods P13 to P14, the transistor M3 is maintained in the off state. Thus, a current is prevented from flowing from the output terminal 55 via the transistor M3 to the first internal node N1.

Figure 30:
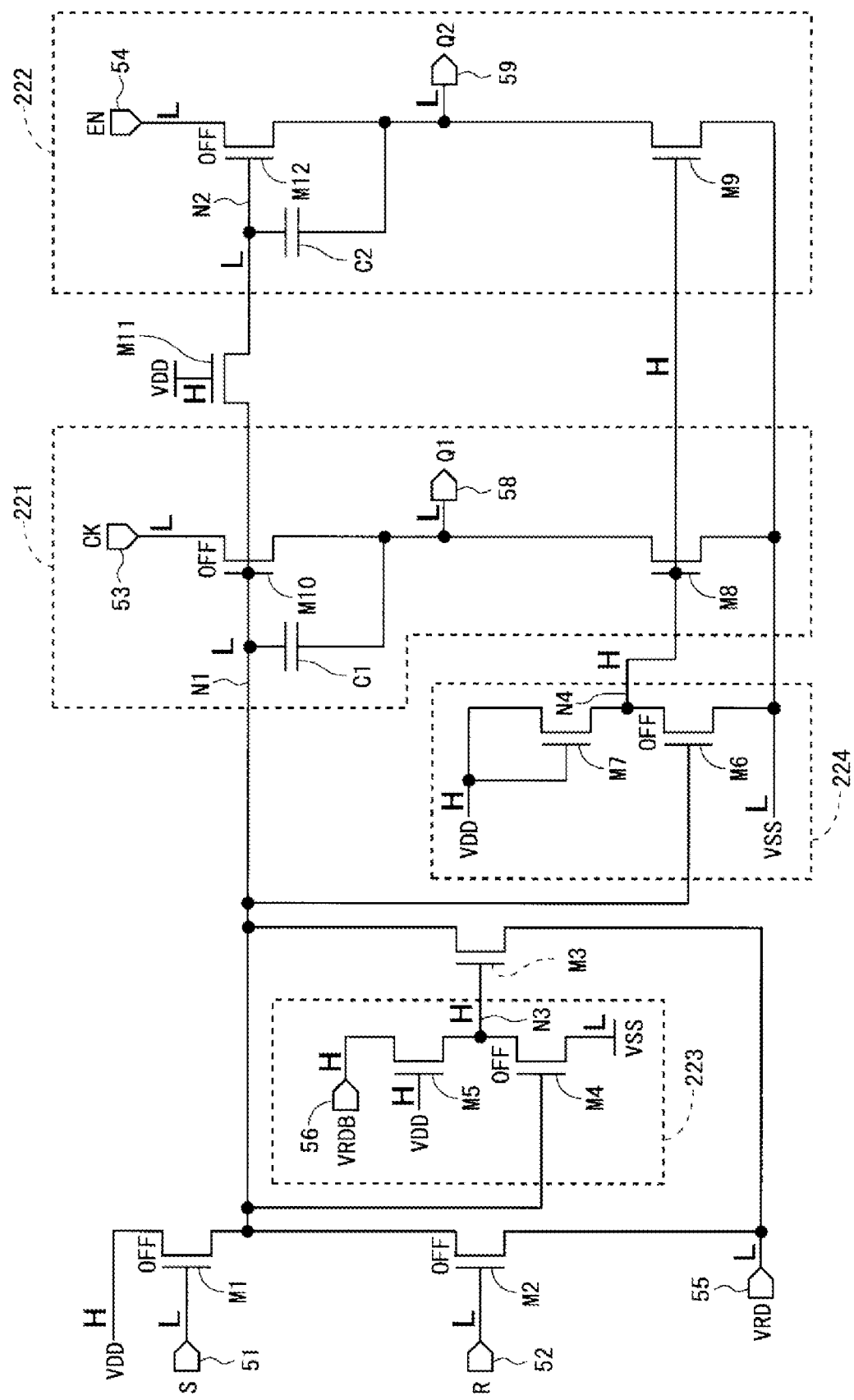
FIG. 30 is a diagram for describing a state of the unit circuit corresponding to the non-monitoring row when the operation mode is set to the monitoring mode in the first embodiment described above.

FIG. 30 illustrates a state of the unit circuit 22(i) in the period P15. When the period P15 starts, the stabilization control signal VRDB changes from the low level to the high level. At this time, since the potential of the first internal node N1 is maintained at the low level, the transistor M4 is maintained in the off state. Thus, the potential of the third internal node N3 is set to the high level by the stabilization control signal VRDB being at the high level.

Figure 31:
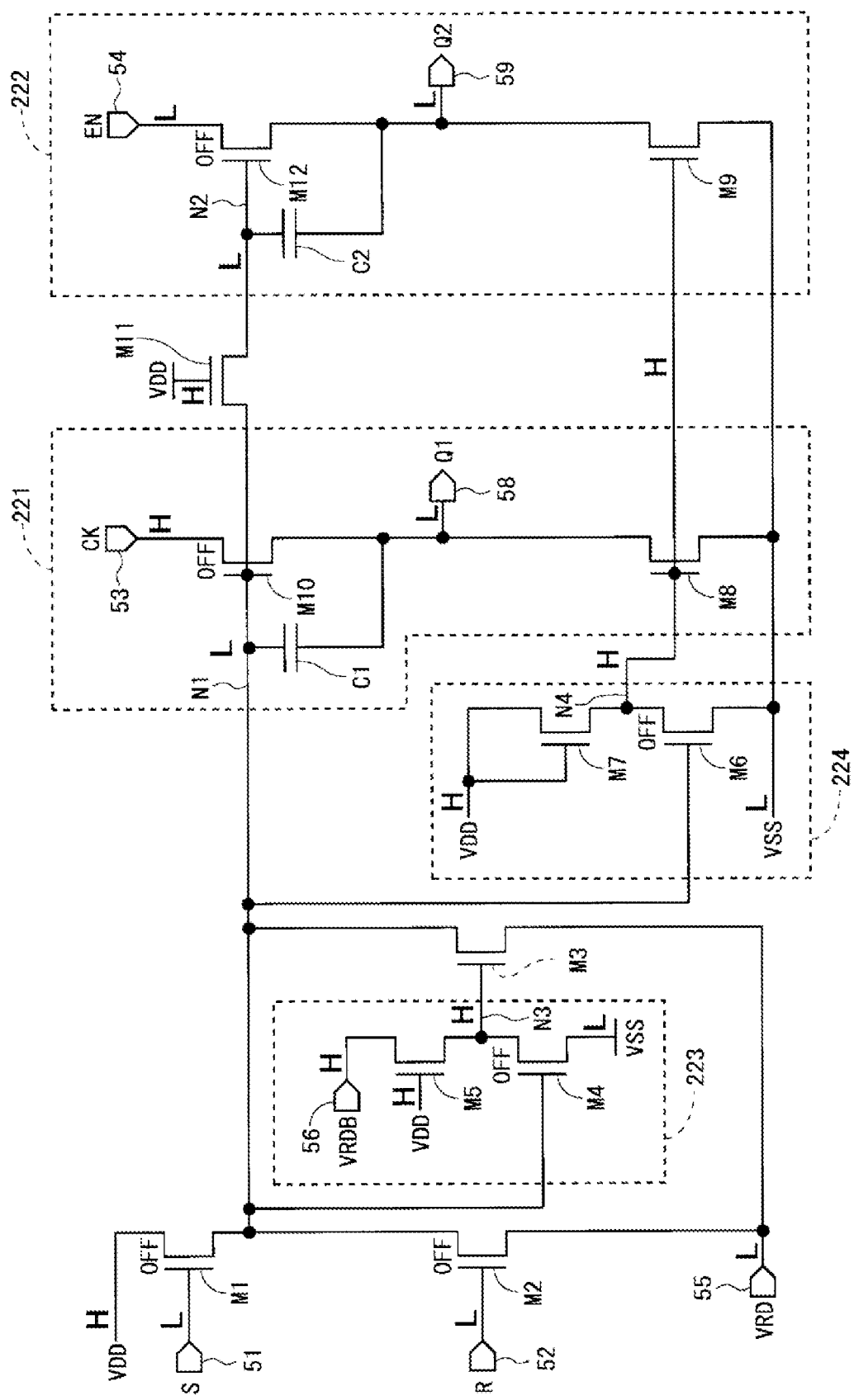
FIG. 31 is a diagram for describing a state of the unit circuit corresponding to the non-monitoring row when the operation mode is set to the monitoring mode in the first embodiment described above.

FIG. 31 illustrates a state of the unit circuit 22(i) in the period P16. When the period P16 starts, the clock signal CK (the clock signal CK1) changes from the low level to the high level. However, since the potential of the first internal node N1 is maintained at the low level, the potential of the output terminal 58 (the potential of the output signal Q1) is maintained at the low level. The period P17 is similar to the period P10 (see FIG. 26).

Figure 25:
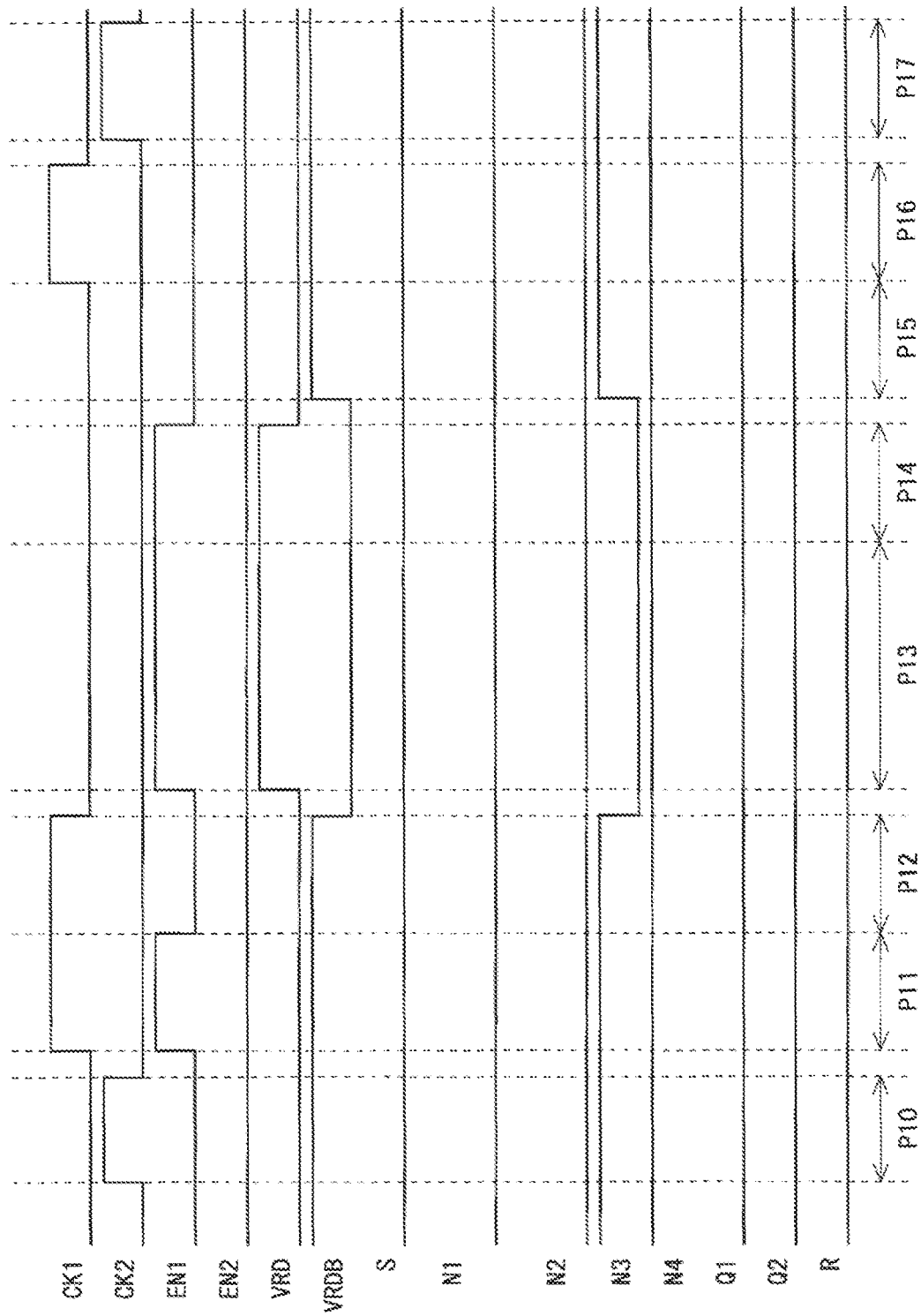
FIG. 25 is a signal waveform diagram for describing an operation of the unit circuit corresponding to a non-monitoring row when the operation mode is set to the monitoring mode in the first embodiment described above.

Incidentally, in a case where attention is focused on the stabilization control signals VRD and VRDB in FIG. 25, after the stabilization control signal VRDB changes from the high level to the low level at the end of the period P12, the stabilization control signal VRD changes from the low level to the high level at the start of the period P13, and after the stabilization control signal VRD changes from the high level to the low level at the end of the period P14, the stabilization control signal VRDB changes from the low level to the high level at the start of the period P15. In other words, the display control circuit 10 changes the potential to be applied to the second control signal line (the potential of the stabilization control signal VRDB) from the high level to the low level before changing the potential to be applied to the first control signal line (the potential of the stabilization control signal VRD) from the low level to the high level in the monitoring period, and changes the potential to be applied to the second control signal line from the low level to the high level after changing the potential to be applied to the first control signal line from the high level to the low level. The reason why such control is performed is as follows.

In a case where it is supposed that the stabilization control signal VRD is changed from the low level to the high level before the stabilization control signal VRDB is changed from the high level to the low level, the potential of the output terminal 55 increases when the transistor M3 is maintained in the on state in the unit circuit 22 corresponding to the non-monitoring row. This increases the potential of the first internal node N1 despite the fact that the potential of the first internal node N1 is to be maintained at the low level. In addition, in a case where it is supposed that the stabilization control signal VRDB is changed from the low level to the high level before the stabilization control signal VRD is changed from the high level to the low level, the transistor M3 is turned on by the stabilization control signal VRDB being at the high level when the potential of the output terminal 55 is at the high level. This increases the potential of the first internal node N1 despite the fact that the potential of the first internal node N1 is to be maintained at the low level. Thus, the control described above is performed on the stabilization control signals VRD and VRDB.

1.5 Effect

Figure 32:
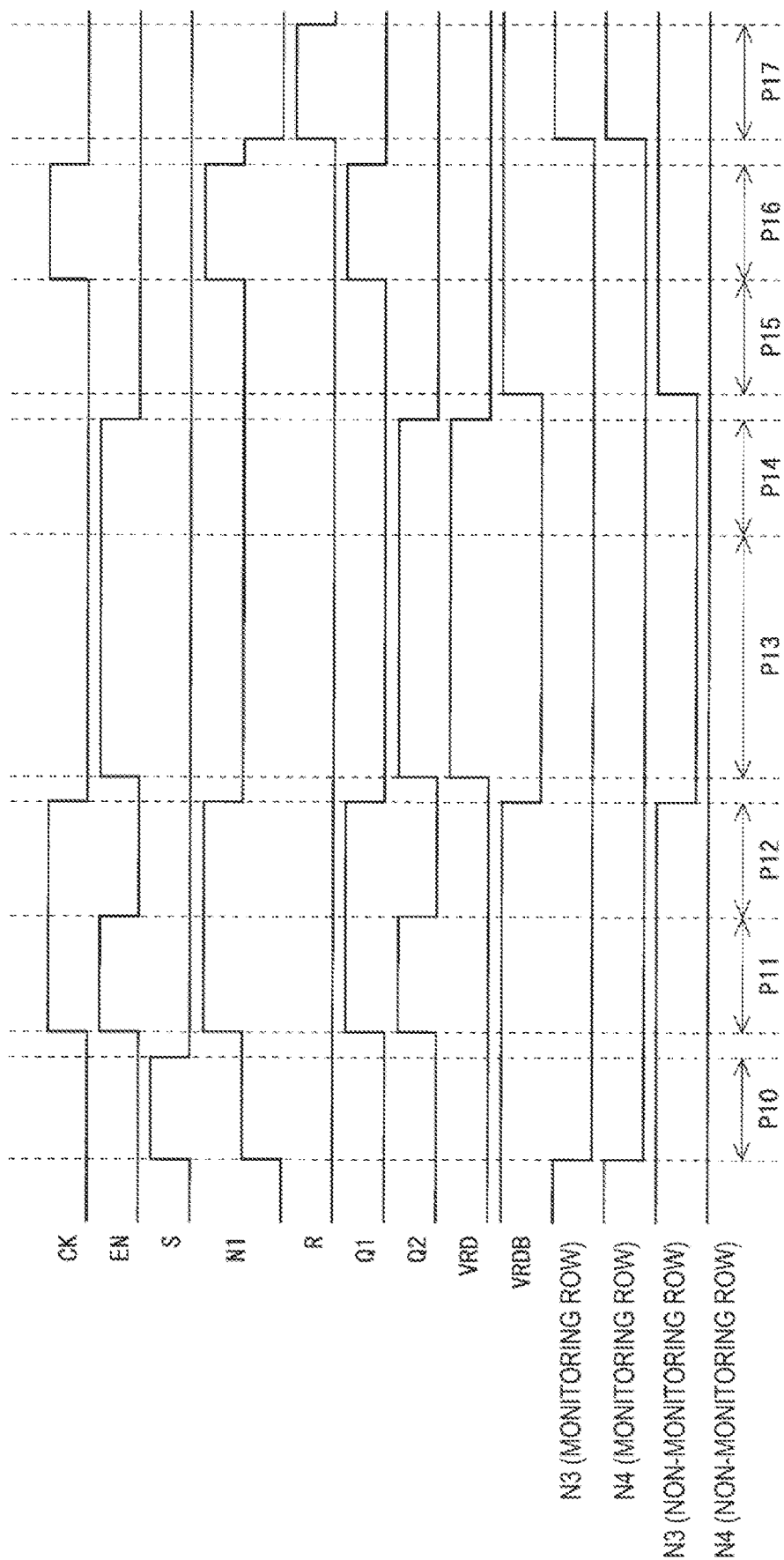
FIG. 32 is a signal waveform diagram for describing effects according to the first embodiment.

According to the present embodiment, the unit circuit 22 includes the transistor M3 whose first conduction terminal is connected to the first internal node N1 and whose second conduction terminal is connected to the first control signal line, and the stabilization circuit 223 that controls the potential of the control terminal of the transistor M3. In addition, in the unit circuit 22, the second conduction terminal of the transistor M2 including the control terminal to be provided with the reset signal R for setting the potential of the first internal node N1 to the low level is connected to the first control signal line. Here, the potential of the first control signal line is controlled by the display control circuit 10. Since the configuration described above is employed, as illustrated in FIG. 32, during the monitoring processing, in a period in which the output signal Q2 output from the unit circuit 22 corresponding to the monitoring row is maintained at the high level (the period P13 for stabilizing the current to be measured and the period P14 in which the current is measured outside the pixel circuits 410), the high level potential can be applied to the first control signal line (the potential of the stabilization control signal VRD is set to the high level) so that the occurrence of off-leakage at the transistor M2 in the unit circuit 22 corresponding to the monitoring row is suppressed. Note that since the first conduction terminal of the transistor M1 is connected to the second reference potential line (the power source line applied with the high-level potential VDD), the occurrence of off-leakage at the transistor M1 is also suppressed. As described above, the occurrence of reading failure of the current during the monitoring processing is suppressed. Further, the unit circuit 22 is provided with the transistor M9 whose first conduction terminal is connected to the output terminal 59 and whose second conduction terminal is connected to the first reference potential line, and the reset circuit 224 that controls the potential of the control terminal of the transistor M9 (the potential of the fourth internal node N4). Thus, in the monitoring period, as illustrated in FIG. 32, while the potential of the fourth internal node N4 is maintained at the low level so that the output signal Q2 may be at the high level in the unit circuit 22 corresponding to the monitoring row, the potential of the fourth internal node N4 can be maintained at the high level to maintain the transistor M9 in the on state so that the output signal Q2 is maintained at the low level in the unit circuit 22 corresponding to the non-monitoring row. As a result, in the unit circuit 22 corresponding to the non-monitoring row, even when off-leakage occurs at the transistor M12, the output signal Q2 is maintained at the low level. By this manner, the occurrence of reading failure of the current in the non-monitoring row is suppressed. As described above, according to the present embodiment, as for the organic EL display device having the external compensation function, the occurrence of operational failure caused by off-leakage at the transistor in the unit circuit 22 configuring the gate driver 20 is suppressed.

1.6 Modified Example

A modified example of the first embodiment will be described. An organic EL display device according to the present modified example is a display device capable of pause driving (also referred to as "low-frequency driving")

that intermittently performs operations of writing data signals to the pixel circuits 410. Note that, with regard to the pause driving, a period during which the operation of writing the data signal to the pixel circuit 410 is interrupted is referred to as a "pause period". Hereinafter, description of similar configurations to those of the first embodiment will be properly omitted.

1.6.1 Overall Configuration

Figure 33:
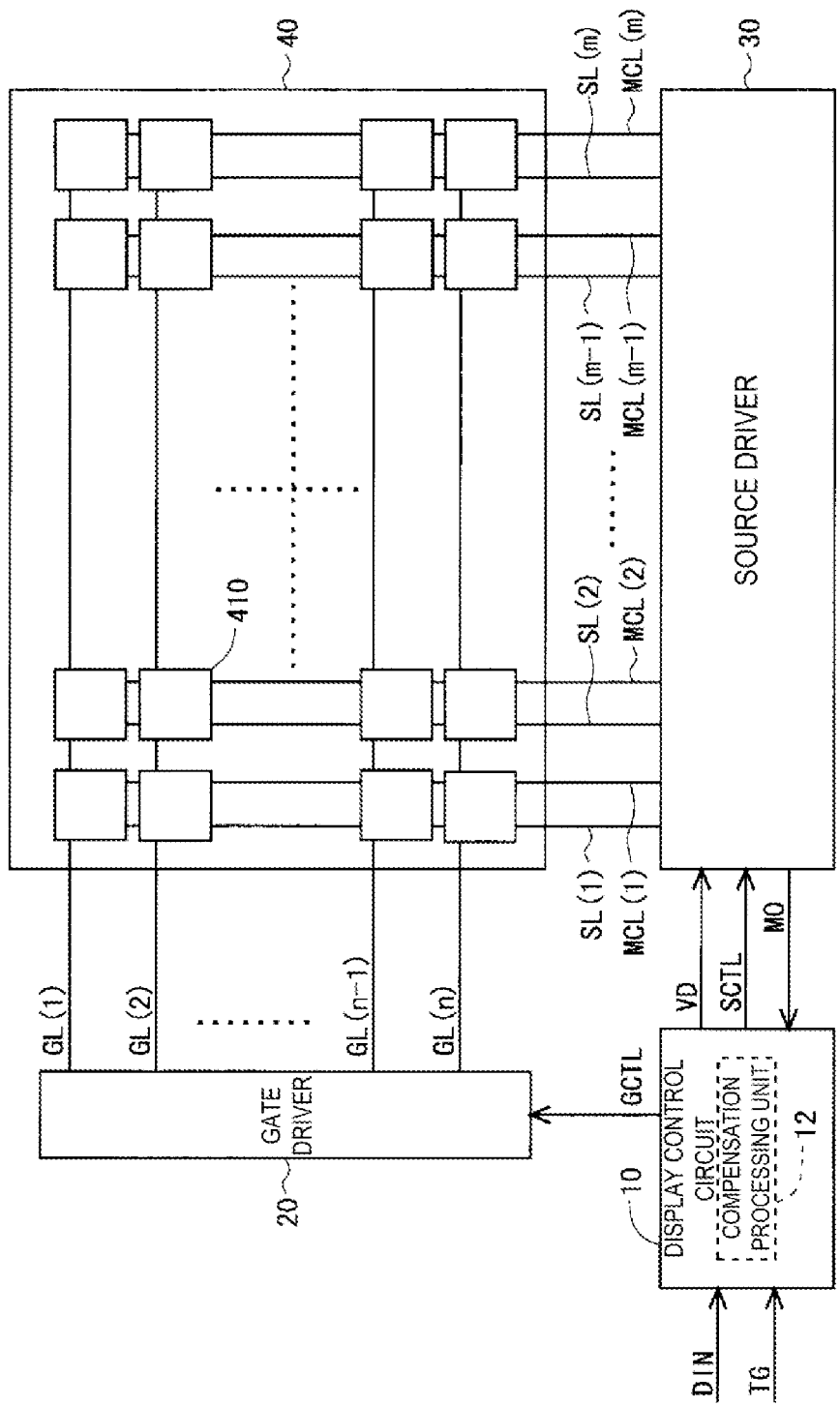
FIG. 33 is a block diagram illustrating an overall configuration of an organic EL display device according to a modified example of the first embodiment described above.

FIG. 33 is a block diagram illustrating an overall configuration of the organic EL display device according to the present modified example. In the first embodiment, the scanning signal lines GL(1) to GL(n), the data signal lines SL(1) to SL(m), and the monitoring control lines ML(1) to ML(n) are disposed in the display portion 40. In contrast, in the present modified example, the scanning signal lines GL(1) to GL(n), the data signal lines SL(1) to SL(m), and current monitoring lines MCL(1) to MCL(m) are disposed in the display portion 40. The current monitoring lines MCL(1) to MCL(m) are disposed so as to correspond to the data signal lines SL(1) to SL(m) in a one-to-one manner. The current monitoring lines MCL(1) to MCL(m) and the data signal lines SL(1) to SL(m) are typically parallel to each other.

The gate driver 20 is connected to the scanning signal lines GL(1) to GL(n). Similar to the first embodiment, the gate driver 20 is configured of a shift register having a plurality of unit circuits. The gate driver 20 applies scanning signals to the scanning signal lines GL(1) to GL(n), based on the gate control signal GCTL output from the display control circuit 10.

The source driver 30 is connected to the data signal lines SL(1) to SL(m) and the current monitoring lines MCL(1) to MCL(m). The source driver 30 selectively operates to drive the data signal lines SL(1) to SL(m) and to measure currents flowing into the current monitoring lines MCL(1) to MCL(m). In other words, functionally, the source driver 30 includes a portion that functions as the data signal line drive unit 310 that drives the data signal lines SL(1) to SL(m), and a portion that functions as the current monitoring unit 320 that measures currents output from the pixel circuits 410 to the current monitoring lines MCL(1) to MCL(m) (see FIG. 3). The current monitoring unit 320 measures the currents flowing into the current monitoring lines MCL(1) to MCL(m), and outputs the monitoring data MO based on the measured values.

As described above, scanning signals are applied to the scanning signal lines GL(1) to GL(n), data signals as luminance signals are applied to the data signal lines SL(1) to SL(m), and thus, an image based on the input image signal DIN is displayed on the display portion 40. In addition, since the monitoring processing is performed and the input image signal DIN is subjected to the compensation calculation processing in accordance with the monitoring data MO, the deterioration of the drive transistors or the organic EL elements is compensated.

1.6.2 Pixel Circuit and Source Driver

Figure 34:
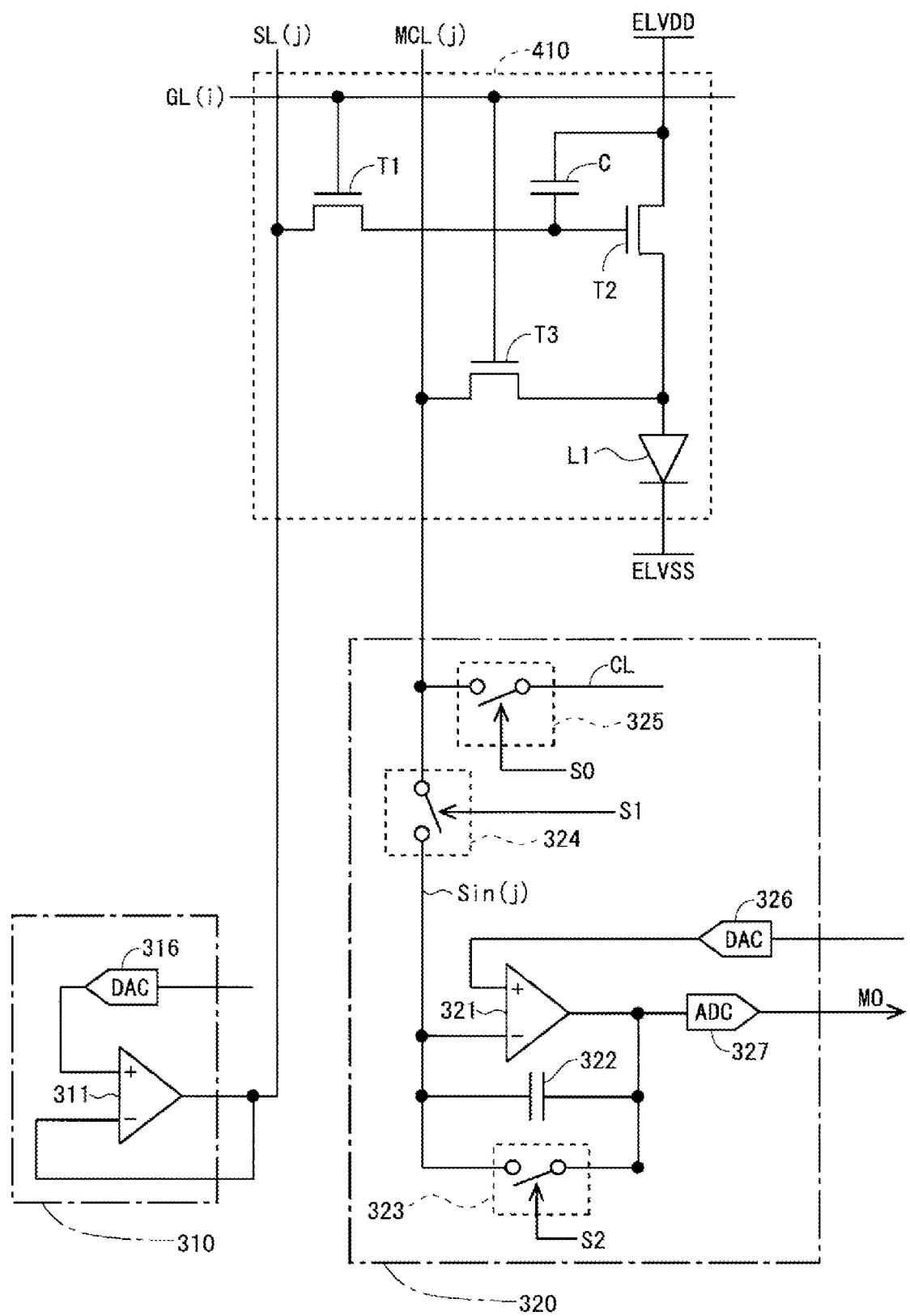
FIG. 34 is a circuit diagram illustrating a pixel circuit and a part of a source driver according to the modified example of the first embodiment described above.
Figure 35:
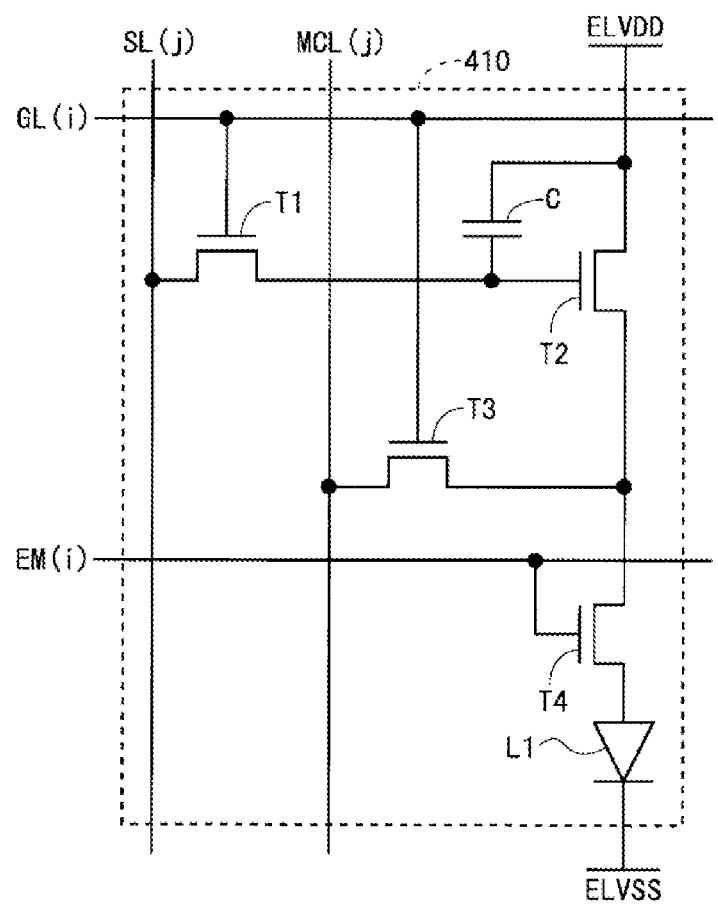
FIG. 35 is a circuit diagram illustrating another configuration example of the pixel circuit according to the modified example of the first embodiment described above.

FIG. 34 is a circuit diagram illustrating the pixel circuit 410 and a part of the source driver 30. Note that in FIG. 34, the pixel circuit 410 at the i-th row and the j-th column, and a portion of the source driver 30 corresponding to the data signal line SL(j) at the j-th column are illustrated. Similar to the first embodiment, the pixel circuit 410 includes one organic EL element L1, three transistors T1 to T3 (the writing control transistor T1, the drive transistor T2, and the monitoring control transistor T3), and one capacitor (capacitance element) C. Note that, as for the monitoring control transistor T3, the control terminal is connected to the scanning signal line GL(i), the first conduction terminal is connected to the second conduction terminal of the drive transistor T2 and the anode terminal of the organic EL element L1, and the second conduction terminal is connected to the current monitoring line MCL(j). Note that the light emission control transistor T4 may be provided in the pixel circuit 410 as illustrated in FIG. 35 so that the length of the light emission period of the organic EL element L1 is identical in all the rows.

As for the source driver 30, as illustrated in FIG. 34, a portion that functions as the data signal line drive unit 310 and a portion that functions as the current monitoring unit 320 are separated. The data signal line drive unit 310 includes an operational amplifier 311 and a D/A converter 316. The current monitoring unit 320 is configured of a D/A converter 326, the A/D converter 327, an operational amplifier 321, the capacitor 322, and the three switches (the switches 323, 324, and 325). Note that the operational amplifier 321 and the D/A converter 326 respectively correspond to the operational amplifier 301 and the D/A converter 306 in the first embodiment (see FIG. 4). The operation of the current monitoring unit 320 is the same as that of the first embodiment, and thus, the description thereof will be omitted. However, the current monitoring unit 320 in the present modified example measures a current flowing through the current monitoring line MCL.

1.6.3 Gate Driver

Figure 36:
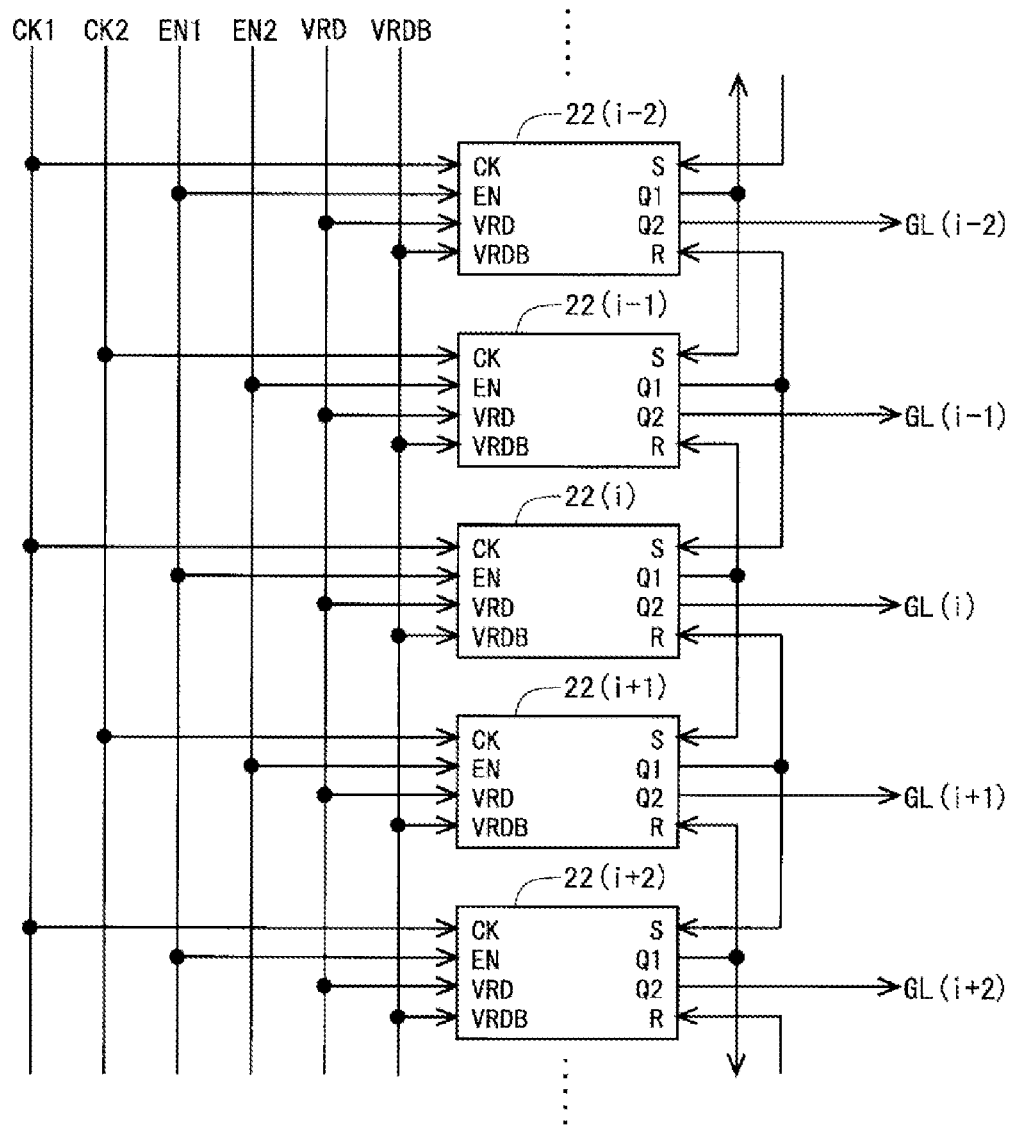
FIG. 36 is a block diagram illustrating a configuration of a shift register having five stages and configuring a gate driver according to the modified example of the first embodiment described above.

A detailed configuration of the gate driver 20 according to the present modified example will be described. FIG. 36 is a block diagram illustrating a configuration of a shift register having five stages. The output signal Q1 from the unit circuit 22 at each stage is provided as the reset signal R to the unit circuit 22 at the previous stage, and is provided as the set signal S to the unit circuit 22 at the next stage. The output signal Q2 from the unit circuit 22 at each stage is provided as a scanning signal to the corresponding scanning signal line GL. The other configurations are the same as those of the first embodiment. A configuration of the unit circuit 22 is the same as that of the first embodiment (see FIG. 1).

1.6.4 Driving Method

1.6.4.1 Overview

In the present modified example, a normal mode and a pause mode are prepared as an operation mode related to a drive frequency. When the operation mode is set to the normal mode, image display is repeated without interruption to an operation for writing during an operation of the organic EL display device. When the operation mode is set to the pause mode, pause driving is performed that intermittently performs the operation for writing. In addition, the monitoring mode and the non-monitoring mode are prepared as the operation mode related to the monitoring processing. In the present modified example, when the operation mode is set to the monitoring mode, the monitoring processing is performed for at least one row during a pause period. Hereinafter, for convenience, a combination of the normal mode and the non-monitoring mode is referred to as a "first mode", a combination of the pause mode and the non-monitoring mode is referred to as a "second mode", and a combination of the pause mode and the monitoring mode is referred to as a "third mode". The normal mode and the monitoring mode are not combined. In other words, in the present modified example, the monitoring processing is performed only when the pause driving is performed.

Figure 37:
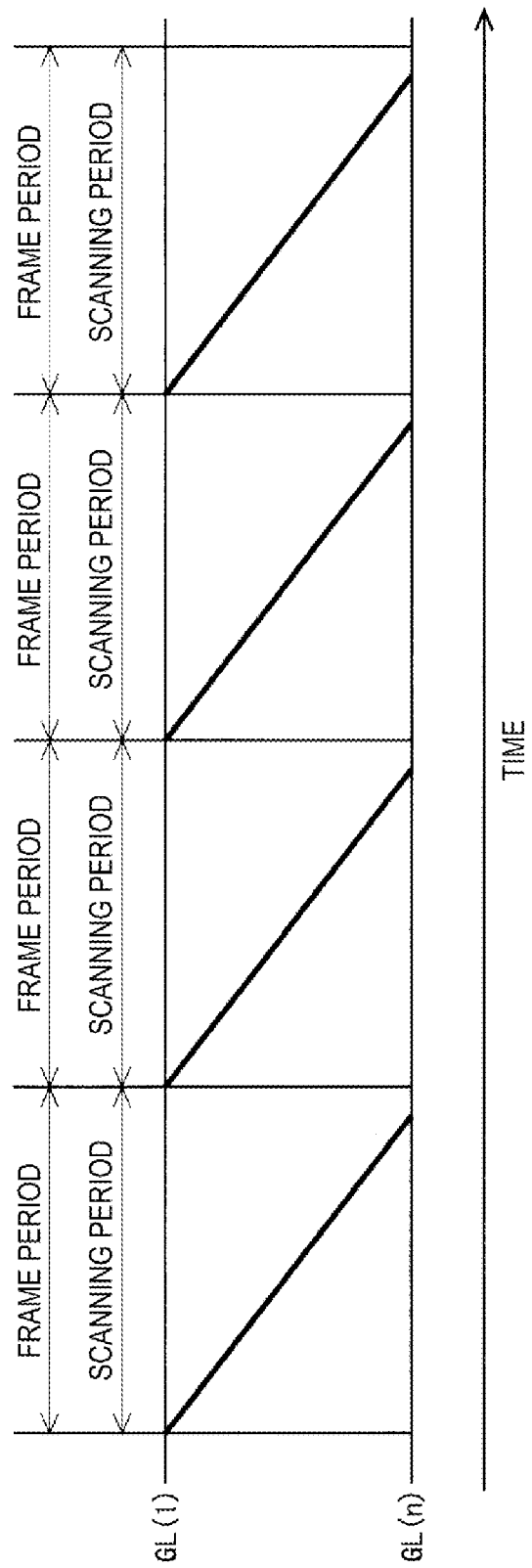
FIG. 37 is a diagram for describing a schematic operation when an operation mode is set to a first mode in the modified example of the first embodiment described above.

An operation in each mode will be described below with reference to FIG. 37 to FIG. 39. When the operation mode is set to the first mode, as illustrated in FIG. 37, a frame period (frame period including only a scanning period) during which image display is performed continues, without a pause period being provided. In this way, the monitoring processing is not performed when the operation mode is set to the first mode.

Figure 38:
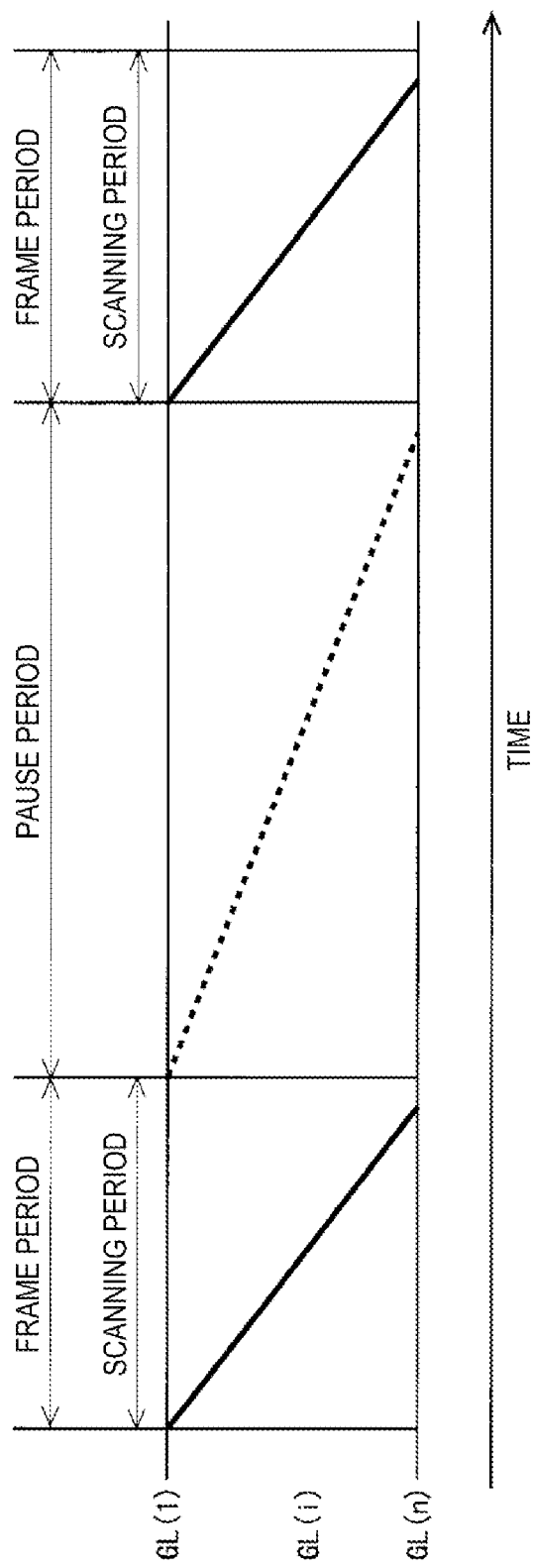
FIG. 38 is a diagram for describing a schematic operation when the operation mode is set to a second mode in the modified example of the first embodiment described above.
Figure 39:
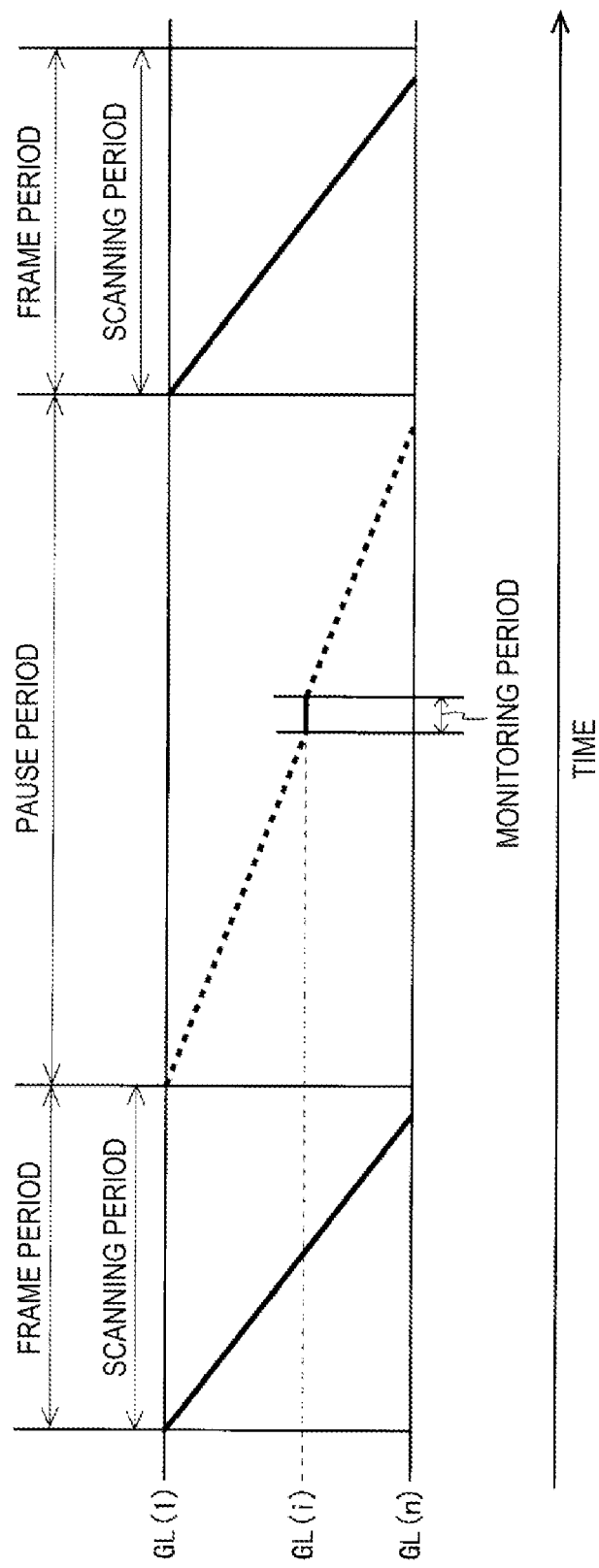
FIG. 39 is a diagram for describing a schematic operation when the operation mode is set to a third mode in the modified example of the first embodiment described above.

When the operation mode is set to the second mode, as illustrated in FIG. 38, a pause period appears between two frame periods. Each frame period includes only a scanning period. In other words, only the operation for writing is performed in each frame period without the monitoring processing being performed. In the pause period, only a shifting operation in the shift register is performed without scanning the scanning signal lines GL. As described above, the monitoring processing is not performed when the operation mode is set to the second mode. Note that in FIG. 38, a state in which the shifting operation from the unit circuit 22(1) at the first stage to the unit circuit 22(n) at the n-th stage is performed in the shift register without scanning the scanning signal lines GL is schematically illustrated by using a diagonal thick dotted line (also similar to FIG. 39).

When the operation mode is set to the third mode, a pause period appears between two frame periods in a similar manner when the operation mode is set to the second mode. However, as illustrated in FIG. 39, a monitoring period for performing the monitoring processing is included in the pause period. In the period other than the monitoring period, of the pause period, only the shifting operation in the shift register is performed without scanning the scanning signal lines GL.

When the operation mode is set to the third mode, the pause period is longer than that when the operation mode is set to the second mode. In other words, the pause period including the monitoring processing is longer than the pause period not including the monitoring processing.

1.6.4.2 Operation when Operation Mode is Set to First Mode

Figure 40:
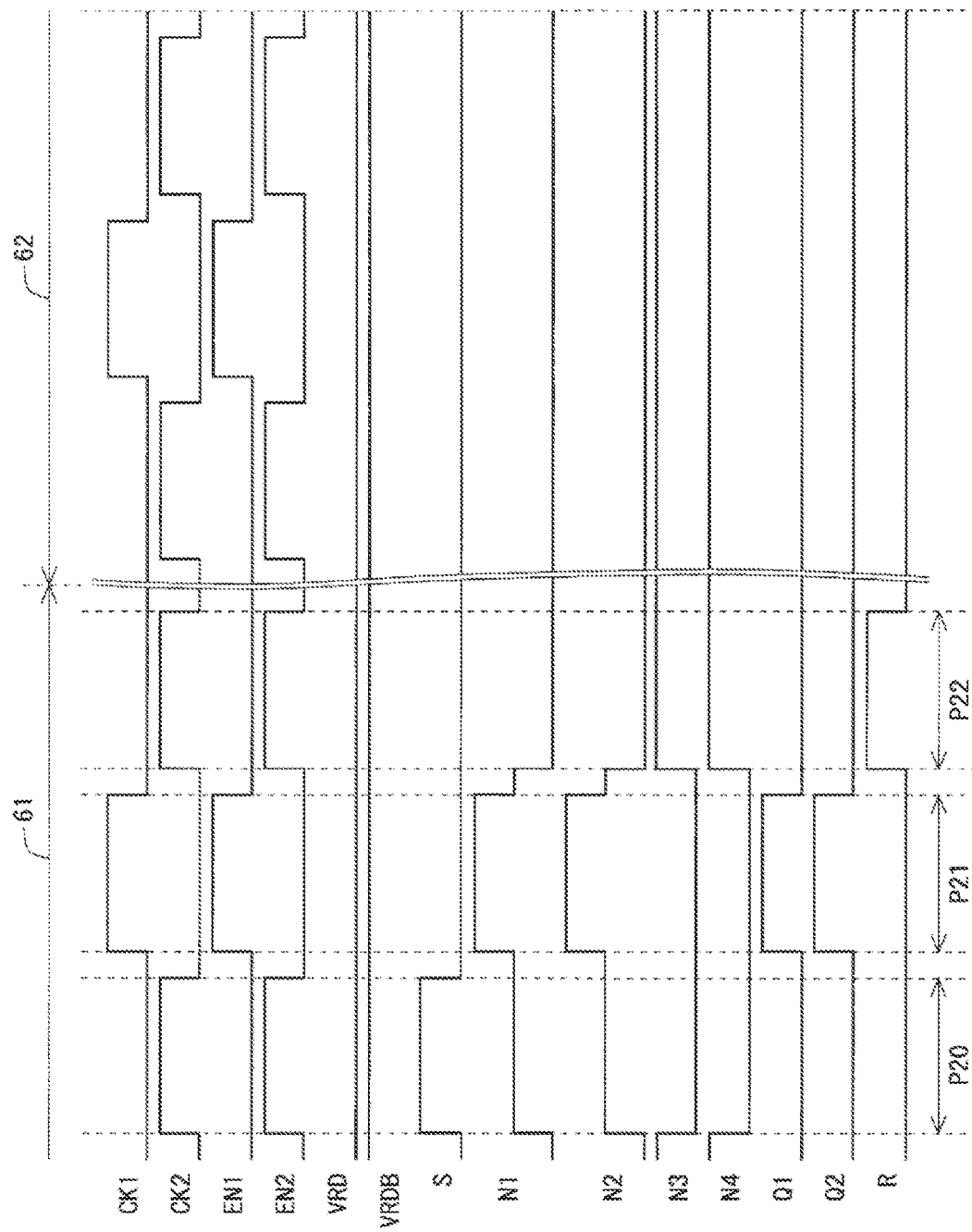
FIG. 40 is a signal waveform diagram for describing an operation of the unit circuit when the operation mode is set to the first mode in the modified example of the first embodiment described above.

With reference to FIG. 40, an operation of the unit circuit 22(i) at the i-th stage when the operation mode is set to the first mode will be described. In FIG. 40, a portion indicated by the arrow denoted by a reference sign 61 indicates a waveform of each signal when writing to the i-th row is performed (when the row to be selected is the i-th row). In FIG. 40, a portion indicated by the arrow denoted by a reference sign 62 indicates a waveform of each signal when writing to a row other than the i-th row is performed (when the row to be selected is a row other than the i-th row). As illustrated in FIG. 40, the stabilization control signal VRD is maintained at the low level, and the stabilization control signal VRDB is maintained at the high level. Note that, similar to the first embodiment, the unit circuit 22(i) at the i-th stage is provided with the clock signal CK1 as the clock signal CK, and is provided with the enable signal EN1 as the enable signal EN.

Immediately before the start of a period P20, the potential of the first internal node N1 and the potential of the second internal node N2 are at the low level, and the potential of the third internal node N3 and the potential of the fourth internal node N4 are at the high level. When the period P20 starts, the set signal S changes from the low level to the high level. The pulse of this set signal S causes the transistor M1 to be in the on state, and the capacitor C1 is charged. At this time, since the transistor M11 is in the on state, the capacitor C2 is also charged. As described above, the potential of the first internal node N1 increases, the transistor M10 is turned on, and the potential of the second internal node N2 increases, and thus, the transistor M12 is turned on. However, since the clock signal CK (the clock signal CK1) and the enable signal EN (the enable signal EN1) are maintained at the low level in the period P20, the output signals Q1 and Q2 are maintained at the low level. Also, the potential of the third internal node N3 and the potential of the fourth internal node N4 are set to the low level, similar to the period P01 in FIG. 9 in the first embodiment, due to the rise of the potential of the first internal node N1.

When a period P21 starts, the clock signal CK (the clock signal CK1) changes from the low level to the high level. At this time, since the transistor M10 is in the on state, the potential of the output terminal 58 (the potential of the output signal Q1) rises along with the rise of the potential of the input terminal 53. According to this, the potential of the first internal node N1 also increases via the capacitor C1. As a result, a large voltage is applied to the control terminal of the transistor M10 to sufficiently increase the potential of the output signal Q1. Additionally, when the period P21 starts, the enable signal EN (the enable signal EN1) changes from the low level to the high level. At this time, since the transistor M12 is in the on state, the potential of the output terminal 59 (the potential of the output signal Q2) rises along with the rise of the potential of the input terminal 54. According to this, the potential of the second internal node N2 also increases via the capacitor C2. As a result, a large voltage is applied to the control terminal of the transistor M12, and the potential of the output signal Q2 increases to a level sufficient to cause the writing control transistor T1 being a connection destination of the output terminal 59 and the monitoring control transistor T3 to be turned on. Thus, the writing is performed in the pixel circuit 410 in the i-th row.

When the period P21 ends, the clock signal CK (the clock signal CK1) changes from the high level to the low level. As a result, the potential of the output terminal 58 (the potential of the output signal Q1) decreases as the potential of the input terminal 53 decreases. As the potential of the output terminal 58 decreases, the potential of the first internal node N1 also decreases via the capacitor C1. Additionally, when the period P21 ends, the enable signal EN (the enable signal EN1) changes from the high level to the low level. As a result, the potential of the output terminal 59 (the potential of the output signal Q2) decreases as the potential of the input terminal 54 decreases. As the potential of the output terminal 59 decreases, the potential of the second internal node N2 also decreases via the capacitor C2.

When a period P22 starts, the reset signal R changes from the low level to the high level. As a result, similar to the period P03 in FIG. 9 in the first embodiment, the potential of the first internal node N1 and the potential of the second internal node N2 are set to the low level. Also, due to the potential of the first internal node N1 being set to the low level, the potential of the third internal node N3 and the potential of the fourth internal node N4 are set to the high level, similar to the period P03 in FIG. 9 in the first embodiment.

When writing to the row other than the i-th row is performed, since the pulse of the set signal S is not input to the unit circuit 22(*i*) at the i-th stage, the potential of the first internal node N1, the potential of the second internal node N2, the potential of the output signal Q1, and the potential of the output signal Q2 are maintained at the low level, and the potential of the third internal node N3 and the potential of the fourth internal node N4 are maintained at the high level (see the portion indicated by the arrow denoted by a reference sign 62 in FIG. 40).

1.6.4.3 Operation when Operation Mode is Set to Second Mode

In this case, the unit circuit 22 operates in a similar manner when the operation mode is set to the first mode (see FIG. 40) in the frame period (scanning period) (see FIG. 38) during which image display is performed.

Figure 41:
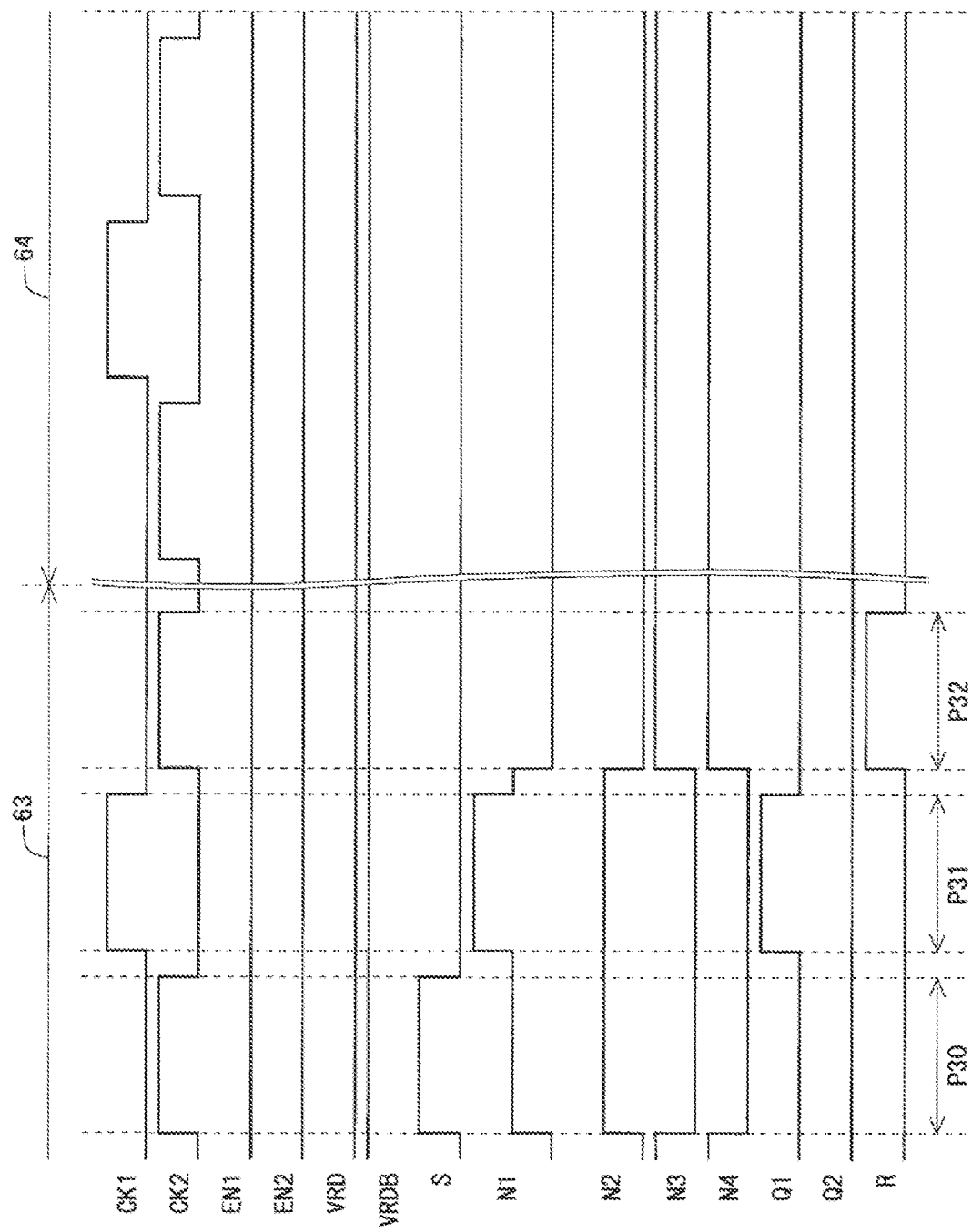
FIG. 41 is a signal waveform diagram for describing an operation of the unit circuit in a pause period when the operation mode is set to the second mode in the modified example of the first embodiment described above.

With reference to FIG. 41, an operation of the unit circuit 22(*i*) at the i-th stage in the pause period in this case will be described. In FIG. 41, a portion indicated by the arrow denoted by a reference sign 63 indicates a waveform of each signal when a shift pulse (a pulse of the set signal S) is applied to the unit circuit 22(*i*) at the i-th stage. In FIG. 41, a portion indicated by the arrow denoted by a reference sign 64 indicates a waveform of each signal in a period during which no shift pulse is applied to the unit circuit 22(*i*) at the i-th stage. Immediately before the start of a period P30, the potential of the first internal node N1 and the potential of the second internal node N2 are at the low level, the potential of the third internal node N3 and the potential of the fourth internal node N4 are at the high level, the stabilization control signal VRD is at the low level, and the stabilization control signal VRDB is at the high level.

When the period P30 starts, the set signal S changes from the low level to the high level. As a result, similar to the period P20 in FIG. 40, the potential of the first internal node N1 and the potential of the second internal node N2 increase, and the potential of the third internal node N3 and the potential of the fourth internal node N4 are set to the low level.

When a period P31 starts, the clock signal CK (the clock signal CK1) changes from the low level to the high level. Thus, similar to the period P21 in FIG. 40, the potential of the output signal Q1 sufficiently increases. In the period P31, the enable signal EN (the enable signal EN1) is maintained at the low level. Thus, the potential of the output signal Q2 is maintained at the low level. When the period P31 ends, the clock signal CK (the clock signal CK1) changes from the high level to the low level. As a result, in a similar manner when the period P21 ends in FIG. 40, the potential of the output terminal 58 (the potential of the output signal Q1) and the potential of the first internal node N1 are decreased.

When a period P32 starts, the reset signal R changes from the low level to the high level. As a result, in a similar manner to the period P22 in FIG. 40, the potential of the first internal node N1 and the potential of the second internal node N2 are set to the low level, and the third internal node N3 and the potential of the fourth internal node N4 are set to the high level.

Note that, in a period in which no shift pulse is applied to the unit circuit 22(*i*) at the i-th stage, in the unit circuit 22(*i*) at the i-th stage, the potential of the first internal node N1, the potential of the second internal node N2, the potential of the output signal Q1, and the potential of the output signal Q2 are maintained at the low level, and the potential of the third internal node N3 and the potential of the fourth internal node N4 are maintained at the high level (see the portion indicated by the arrow denoted by the reference sign 64 in FIG. 41).

1.6.4.4 Operation when Operation Mode is Set to Third Mode

In this case, the unit circuit 22 operates in a similar manner when the operation mode is set to the first mode (see FIG. 40) in a frame period (scanning period) (see FIG. 39) during which image display is performed. In this case, in the period other than the monitoring period of a pause period, the unit circuit 22 operates in a similar manner to that in a pause period when the operation mode is set to the second mode (see FIG. 41).

With reference to FIG. 42 to FIG. 46, an operation of the unit circuit 22(*i*) at the i-th stage in the monitoring period of the pause period in this case will be described. However, it is assumed that the i-th row is the monitoring row, and attention is focused on the operation when the monitoring processing is performed for the i-th row. Immediately before the start of a period P40, the potential of the first internal node N1 and the potential of the second internal node N2 are at the low level, the potential of the third internal node N3 and the potential of the fourth internal node N4 are at the high level, the stabilization control signal VRD is at the low level, and the stabilization control signal VRDB is at the high level.

Figure 43:
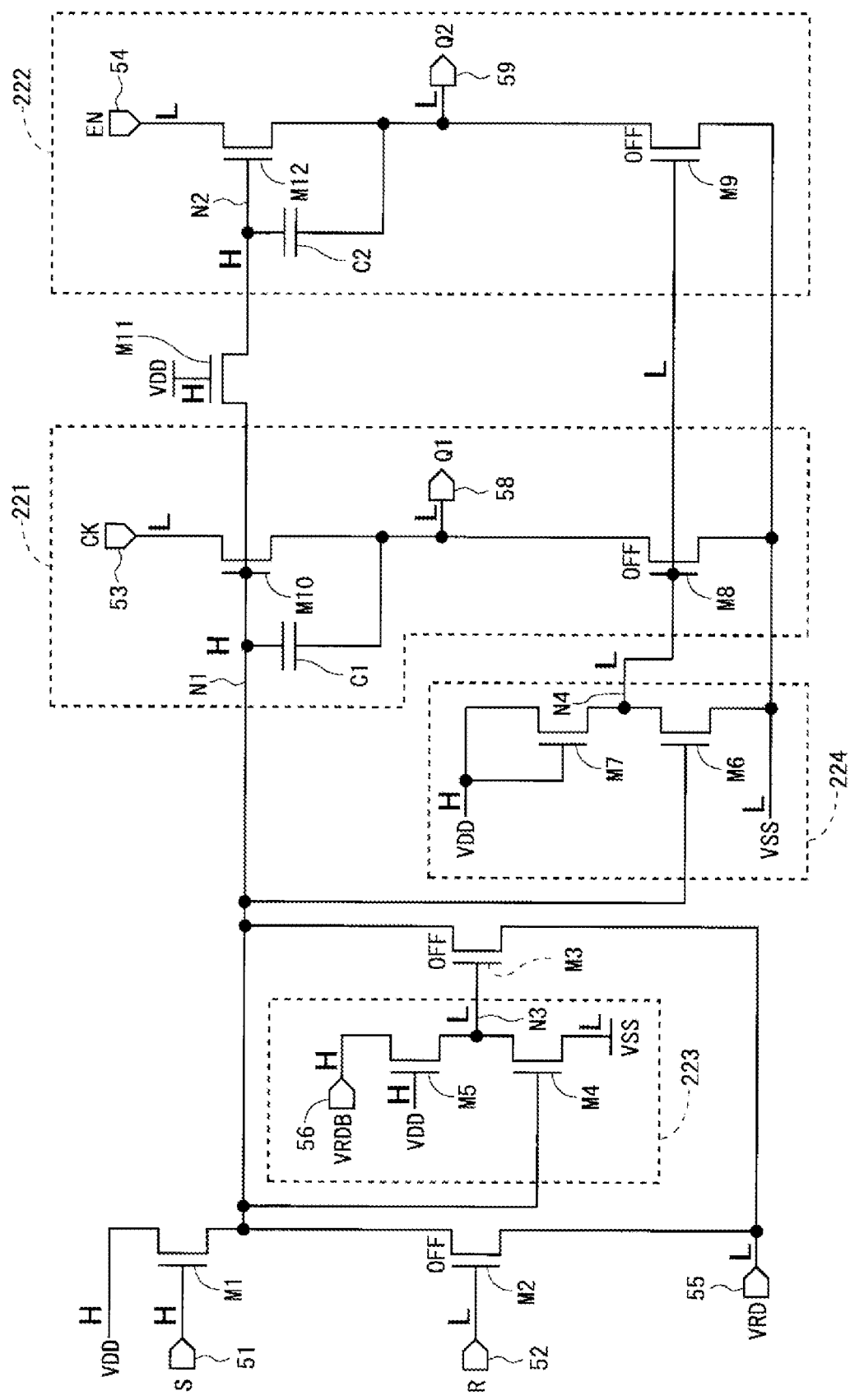
FIG. 43 is a diagram for describing a state of the unit circuit in a monitoring period in the modified example of the first embodiment described above.

FIG. 43 illustrates a state of the unit circuit 22(*i*) in the period P40. When the period P40 starts, the set signal S changes from the low level to the high level. As a result, similar to the period P20 in FIG. 40, the potential of the first internal node N1 and the potential of the second internal node N2 increase, and the potential of the third internal node N3 and the potential of the fourth internal node N4 are set to the low level. When the period P40 ends, the stabilization control signal VRDB changes from the high level to the low level.

Figure 44:
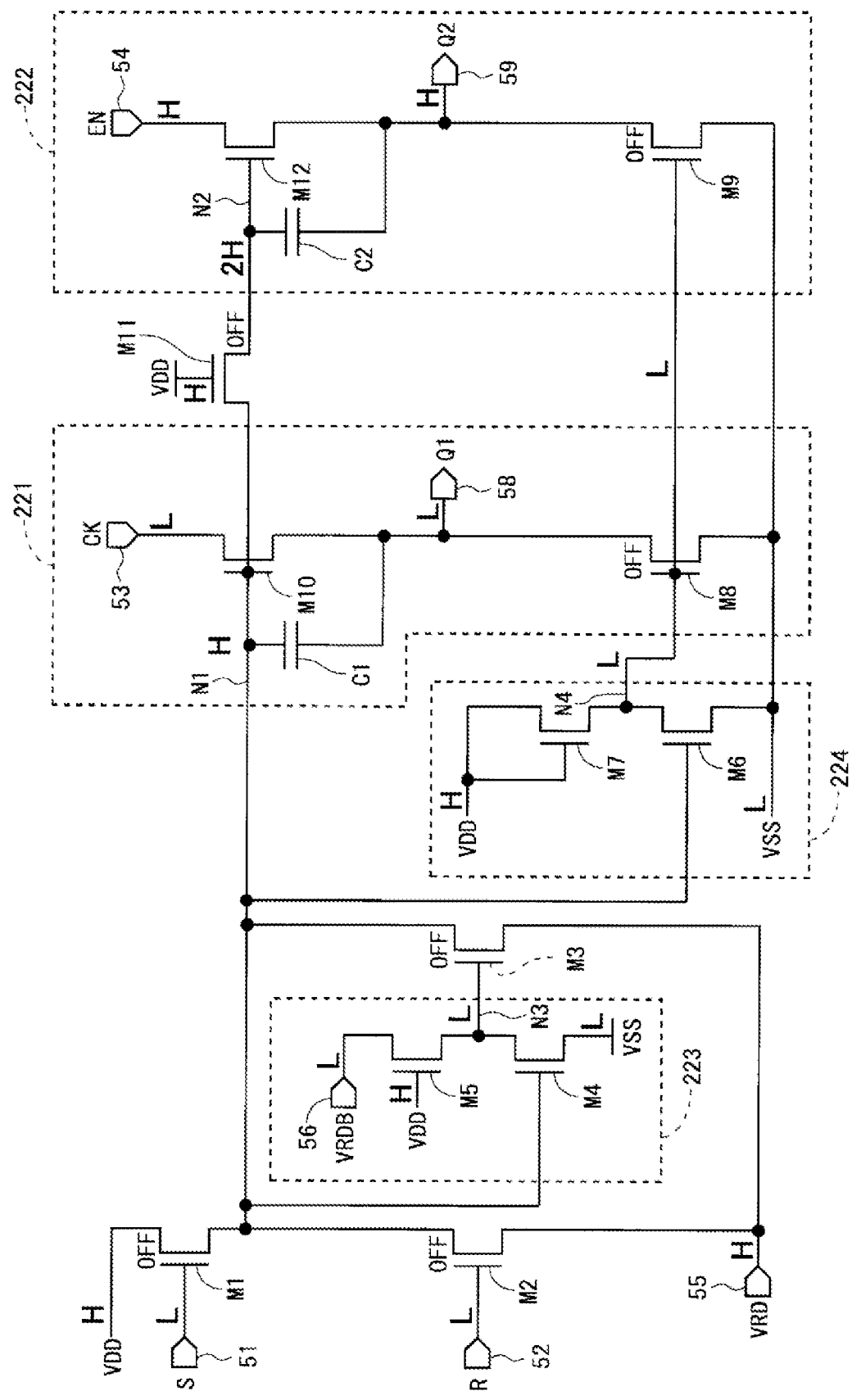
FIG. 44 is a diagram for describing a state of the unit circuit in a monitoring period in the modified example of the first embodiment described above.

FIG. 44 illustrates a state of the unit circuit 22(*i*) in periods P41 to P45. When the period P41 starts, the enable signal EN (the enable signal EN1) changes from the low level to the high level. Due to this, similar to the period P21 in FIG. 40, the potential of the output signal Q2 increases to a level sufficient to cause the writing control transistor T1 being a connection destination of the output terminal 59 and the monitoring control transistor T3 to be in the on state. Additionally, when the period P41 starts, the stabilization control signal VRD changes from the low level to the high level. Thereafter, when the period P45 ends, the stabilization control signal VRD changes from the high level to the low level. As described above, the stabilization control signal VRD is maintained at the high level throughout the periods P41 to P45. Thus, with regard to the transistors M2 and M3, a voltage (drain-source voltage) between the first conduction terminal and the second conduction terminal is reduced. As a result, the reduction in the potentials of the first internal node N1 and the second internal node N2 caused by off-leakage at the transistors M2 and M3 is suppressed throughout the periods P41 to P45.

Figure 45:
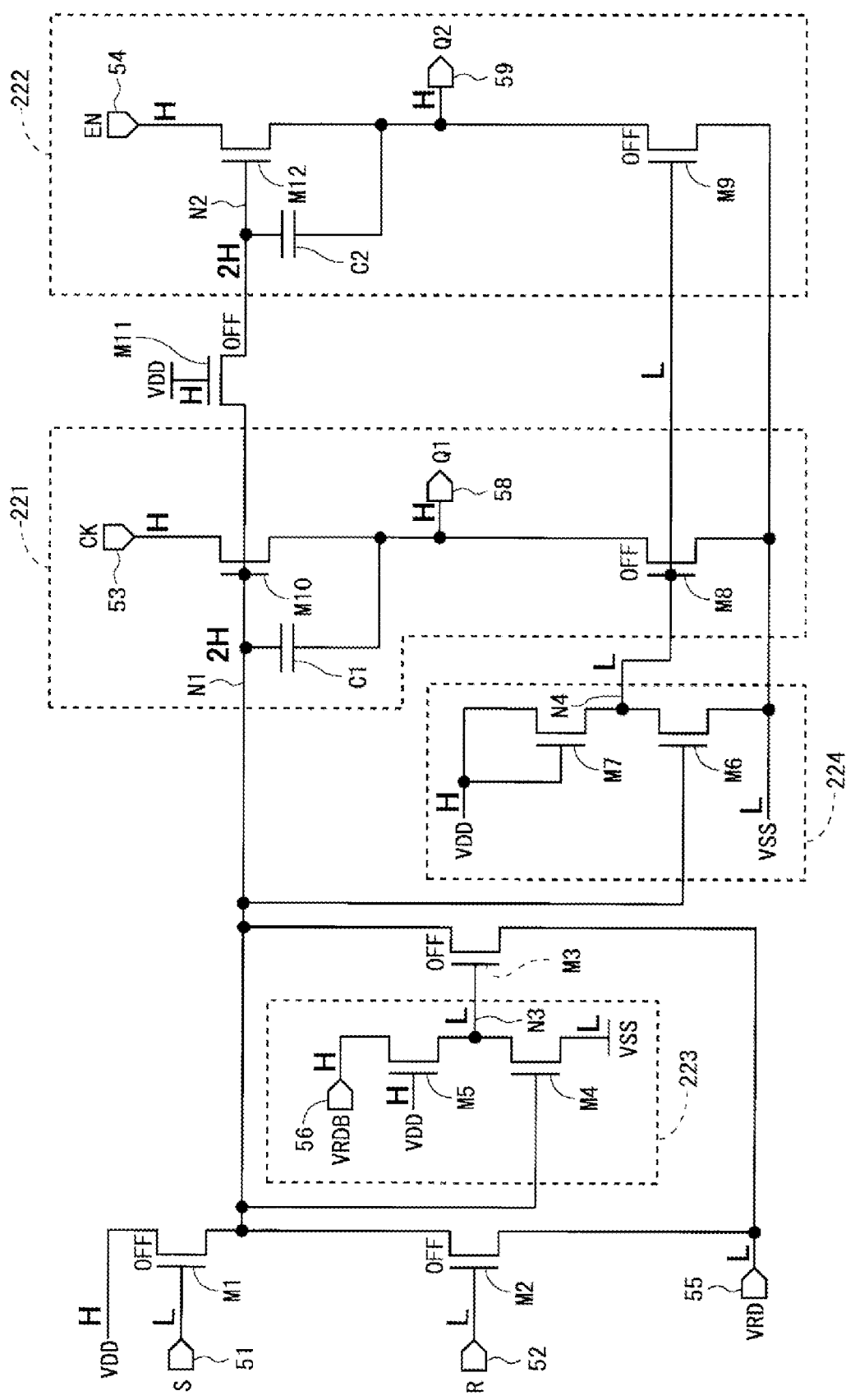
FIG. 45 is a diagram for describing a state of the unit circuit in a monitoring period in the modified example of the first embodiment described above.

FIG. 45 illustrates a state of the unit circuit 22(*i*) in a period P46. When the period P46 starts, the stabilization control signal VRDB changes from the low level to the high level. At this time, since the potential of the first internal node N1 is maintained at the high level, the transistor M4 is maintained in the on state. As a result, the potential of the third internal node N3 is maintained at the low level. Additionally, when the period P46 starts, the clock signal CK (the clock signal CK1) changes from the low level to the high level. Thus, similar to the period P21 in FIG. 40, the potential of the first internal node N1 increases, and the potential of the output signal Q1 sufficiently increases. When the period P46 ends, the clock signal CK (the clock signal CK1) and the enable signal EN (the enable signal EN1) change from the high level to the low level. As a result, in a similar manner when the period P21 ends in FIG. 40, the potential of the output signal Q1 and the potential of the output signal Q2 decrease. According to this, the potential of the first internal node N1 and the potential of the second internal node N2 decrease.

Figure 46:
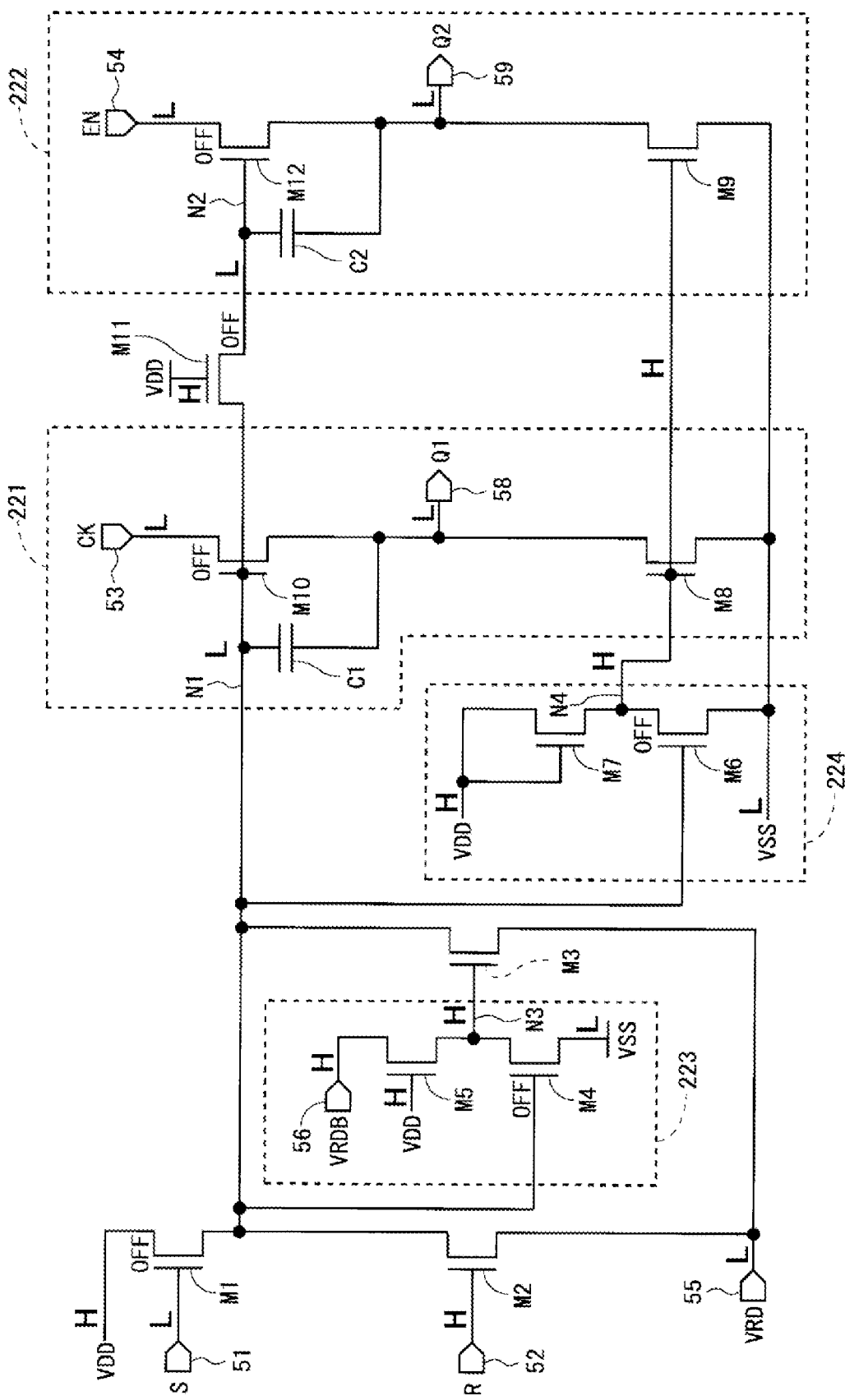
FIG. 46 is a diagram for describing a state of the unit circuit in a monitoring period in the modified example of the first embodiment described above.

FIG. 46 illustrates a state of the unit circuit 22(i) in a period P47. When the period P47 starts, the reset signal R changes from the low level to the high level. As a result, similar to the period P22 in FIG. 40, the potentials of the first internal node N1 and the second internal node N2 are set to the low level, and the potential of the third internal node N3 and the potential of the fourth internal node N4 are set to the high level.

As described above, in the pixel circuit 410 in the i-th row, the writing control transistor T1 and the monitoring control transistor T3 are maintained in the on state in the periods P41 to P46. As a result, in the periods P41 to P46, the monitoring processing is performed in the pixel circuit 410 in the i-th row.

Figure 47:
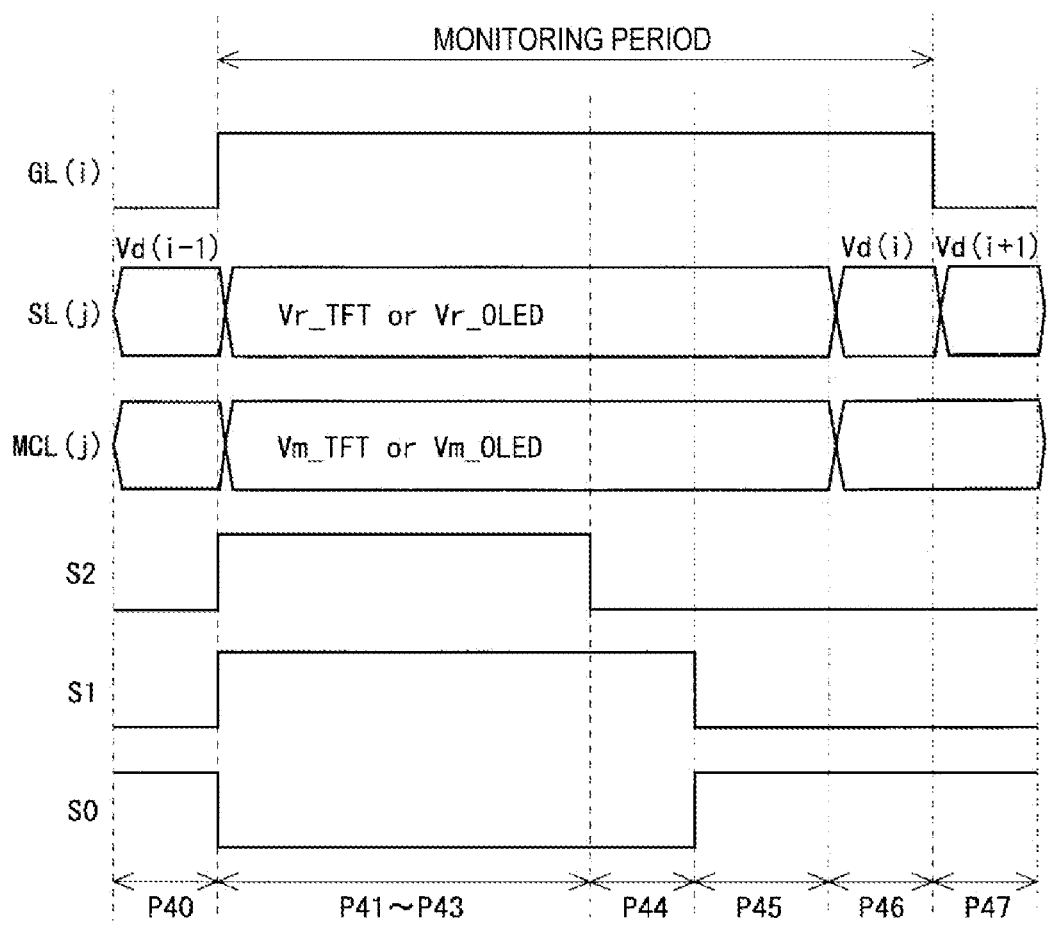
FIG. 47 is a signal waveform diagram for describing operations of the pixel circuit and a current monitoring unit when monitoring processing is performed in the modified example of the first embodiment described above.

Next, the operations of the pixel circuit 410 and the current monitoring unit 320 when the monitoring processing is performed will be described with reference to FIG. 47. Here, attention is focused on the pixel circuit 410 at the i-th row and the j-th column and the current monitoring unit 320 corresponding to the j-th column.

In the period P40, writing is performed based on the data potential Vd(i−1) for image display in the (i−1)-th row. Immediately before the end of the period P40, the scanning signal GL(i) is at the low level. Thus, the writing control transistor T1 and the monitoring control transistor T3 are in the off state. Further, immediately before the end of the period P40, the control signals S2 and S1 are at the low level, and the control signal S0 is at the high level. Thus, the switches 323 and 324 are in the off state and the switch 325 is in the on state. At this time, the current monitoring line MCL(j) and the internal data line Sin(j) are electrically disconnected.

When the period P41 starts, the scanning signal GL(i) changes from the low level to the high level. This causes the writing control transistor T1 and the monitoring control transistor T3 to be set to the on state. In addition, in the period P41, the control signals S2 and S1 change from the low level to the high level, and the control signal S0 changes from the high level to the low level. This causes the switches 323 and 324 to be set to the on state and causes the switch 325 to be set to the off state. As a result, the current monitoring line MCL(j) and the internal data line Sin(j) are electrically connected. In the periods P41 to P43, in the state described above, the characteristic detection potential Vr_TFT or the characteristic detection potential Vr_OLED is applied to the data signal line SL(j), and the current measurement potential Vm_TFT or the current measurement potential Vm_OLED is applied to the current monitoring line MCL(j). The characteristic detection potential Vr_TFT and the current measurement potential Vm_TFT are potentials set so that a current flows into the drive transistor T2 but no current flows into the organic EL element L1. The characteristic detection potential Vr_OLED and the current measurement potential Vm_OLED are potentials set so that a current flows into the organic EL element L1 but no current flows into the drive transistor T2. Note that the periods P41 to P43 are set to have a length sufficient to stabilize a current to be measured that flows through the current monitoring line MCL(j).

When the period P44 starts, the control signal S2 changes from the high level to the low level. This causes the switch 323 to be set to the off state, and the operational amplifier 321 and the capacitor 322 function as an integrator circuit. As a result, the output voltage of the operational amplifier 321 is a voltage corresponding to the current flowing through the current monitoring line MCL(j).

When the period P45 starts, the control signal S1 changes from the high level to the low level, and the control signal S0 changes from the low level to the high level. This causes the switch 324 to be set to the off state, and causes the switch 325 to be set to the on state. When the switch 324 is set to the off state, the current monitoring line MCL(j) and the internal data line Sin(j) are electrically disconnected. In this state, the output voltage of the operational amplifier 321 (a charging voltage of the capacitor 322) is converted to a digital signal by the A/D converter 327. The digital signal is sent to the display control circuit 10 as the monitoring data MO, and is used to correct the input image signal DIN.

When the period P46 starts, the data potential Vd(i) for image display is applied to the data signal line SL(j). At this time, the writing control transistor T1 is in the on state. Thus, the writing is performed based on the data potential Vd(i) in the pixel circuit 410 at the i-th row and the j-th column.

When the period P47 starts, the scanning signal GL(i) changes from the high level to the low level. This causes the writing control transistor T1 and the monitoring control transistor T3 to be set to the off state. Note that, in the period P47, writing is performed based on the data potential Vd(i+1) for image display in the (i+1)-th row. In the period P47 and subsequent periods, the organic EL element L1 emits light, based on the writing in the period P46, in the pixel circuit 410 at the i-th row and the j-th column.

Figure 48:
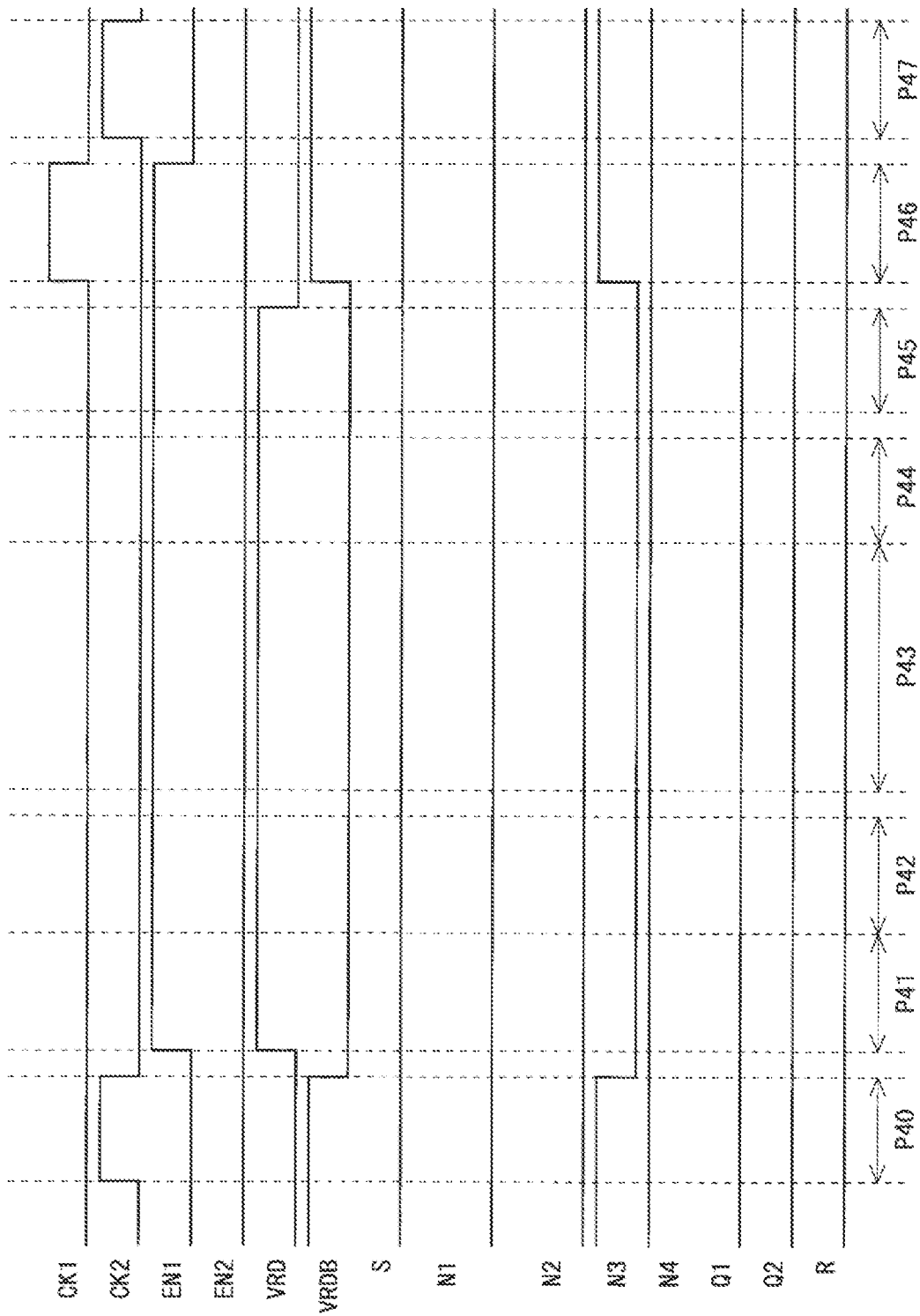
FIG. 48 is a signal waveform diagram for describing an operation of the unit circuit corresponding to a non-monitoring row in a monitoring period in the modified example of the first embodiment described above.

Next, with reference to FIG. 48, an operation of the unit circuit 22(i) at the i-th stage when the i-th row is supposed to be the non-monitoring row will be described. However, it is assumed that the monitoring processing is performed on the monitoring row in a period on which attention is focused here. Immediately before the start of a period P40, the potential of the first internal node N1 and the potential of the second internal node N2 are at the low level, the potential of the third internal node N3 and the potential of the fourth internal node N4 are at the high level, the stabilization control signal VRD is at the low level, and the stabilization control signal VRDB is at the high level.

When the period P40 starts, the clock signal CK2 changes from the low level to the high level, but the clock signal CK2 is not input to the unit circuit 22(i). Due to this, the state of the unit circuit 22(i) is maintained in the state immediately before the start of the period P40. When the period P40 ends, the stabilization control signal VRDB changes from the high level to the low level.

When the period P41 starts, the enable signal EN (the enable signal EN1) changes from the low level to the high level. However, since the potential of the second internal node N2 is maintained at the low level, the potential of the output terminal 59 (the potential of the output signal Q2) is maintained at the low level. Additionally, when the period P41 starts, the stabilization control signal VRD changes from the low level to the high level.

In the periods P42 to P45, the state of the unit circuit 22(i) is maintained in a similar state to that in the period P41. Thus, the potential of the fourth internal node N4 is maintained at the high level. Thus, since the transistor M9 is maintained in the on state, the potential of the output terminal 59 (the potential of the output signal Q2) is maintained at the low level even when off-leakage occurs at the transistor M12. When the period P45 ends, the stabilization control signal VRD changes from the high level to the low level.

When the period P46 starts, the clock signal CK (the clock signal CK1) changes from the low level to the high level. However, since the potential of the first internal node N1 is maintained at the low level, the potential of the output terminal 58 (the potential of the output signal Q1) is maintained at the low level. When the period P46 starts, the stabilization control signal VRDB changes from the low level to the high level. This causes the potential of the third internal node N3 to be at the high level. The period P47 is similar to the period P40.

1.6.5 Effect

According to the present modified example, similar to the first embodiment, the occurrence of off-leakage at the transistor M2 is suppressed in the unit circuit 22 corresponding to the monitoring row, and the output signal Q2 is maintained at the low level even when off-leakage occurs at the transistor M12 in the unit circuit 22 corresponding to the non-monitoring row. In other words, the present modified example also relates to an organic EL display device having an external compensation function, and the occurrence of operational failure caused by off-leakage at the transistor in the unit circuit 22 configuring the gate driver 20 is suppressed.

2. Second Embodiment

2.1 Schematic Configuration

In the first embodiment, the stabilization circuit 223 and the reset circuit 224 are provided in the unit circuit 22 configuring the gate driver 20 as constituent elements for suppressing the occurrence of operational failure caused by off-leakage at the transistor (FIG. 1). In contrast, in the present embodiment, only the stabilization circuit 223, of the stabilization circuit 223 and the reset circuit 224, is provided in the unit circuit 22. The overall configuration is similar to that of the first embodiment (see FIG. 2). The configurations of the pixel circuit 410 and the source driver 30 are similar to those of the first embodiment (see FIG. 4). The configuration illustrated in FIG. 5 may be used for the pixel circuit 410.

2.2 Gate Driver

Figure 49:
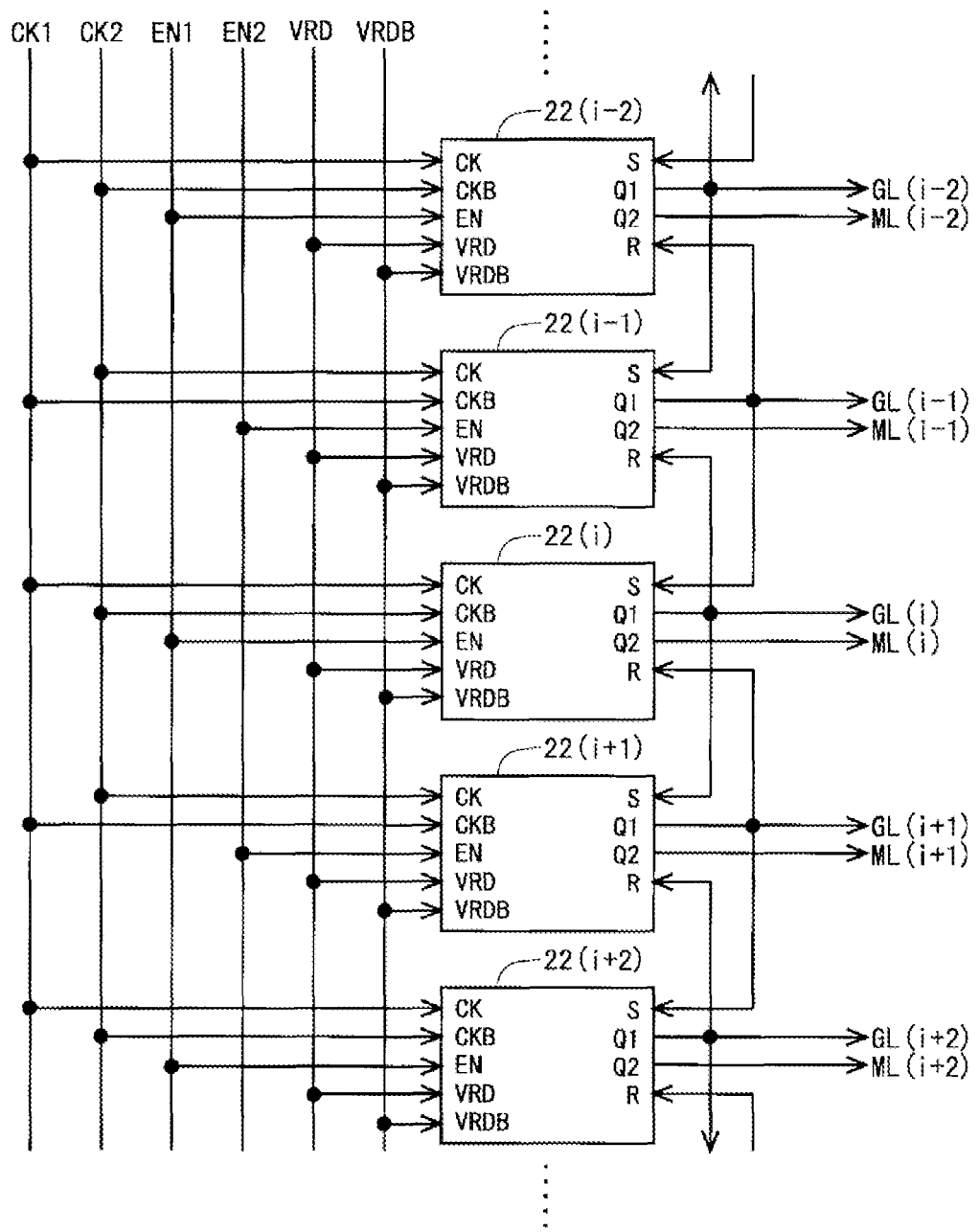
FIG. 49 is a block diagram illustrating a configuration of a shift register having five stages and configuring a gate driver according to a second embodiment.

FIG. 49 is a block diagram illustrating a configuration of a shift register including five stages and configuring the gate driver 20 according to the present embodiment. In addition to the input terminals provided in the first embodiment (see FIG. 6), each unit circuit 22 includes an input terminal configured to receive a clock signal CKB. As for the unit circuit 22 at the odd-numbered stage, the clock signal CK1 is provided as the clock signal CK, and the clock signal CK2 is provided as the clock signal CKB. As for the unit circuit 22 at the even-numbered stage, the clock signal CK2 is provided as the clock signal CK, and the clock signal CK1 is provided as the clock signal CKB.

Figure 50:
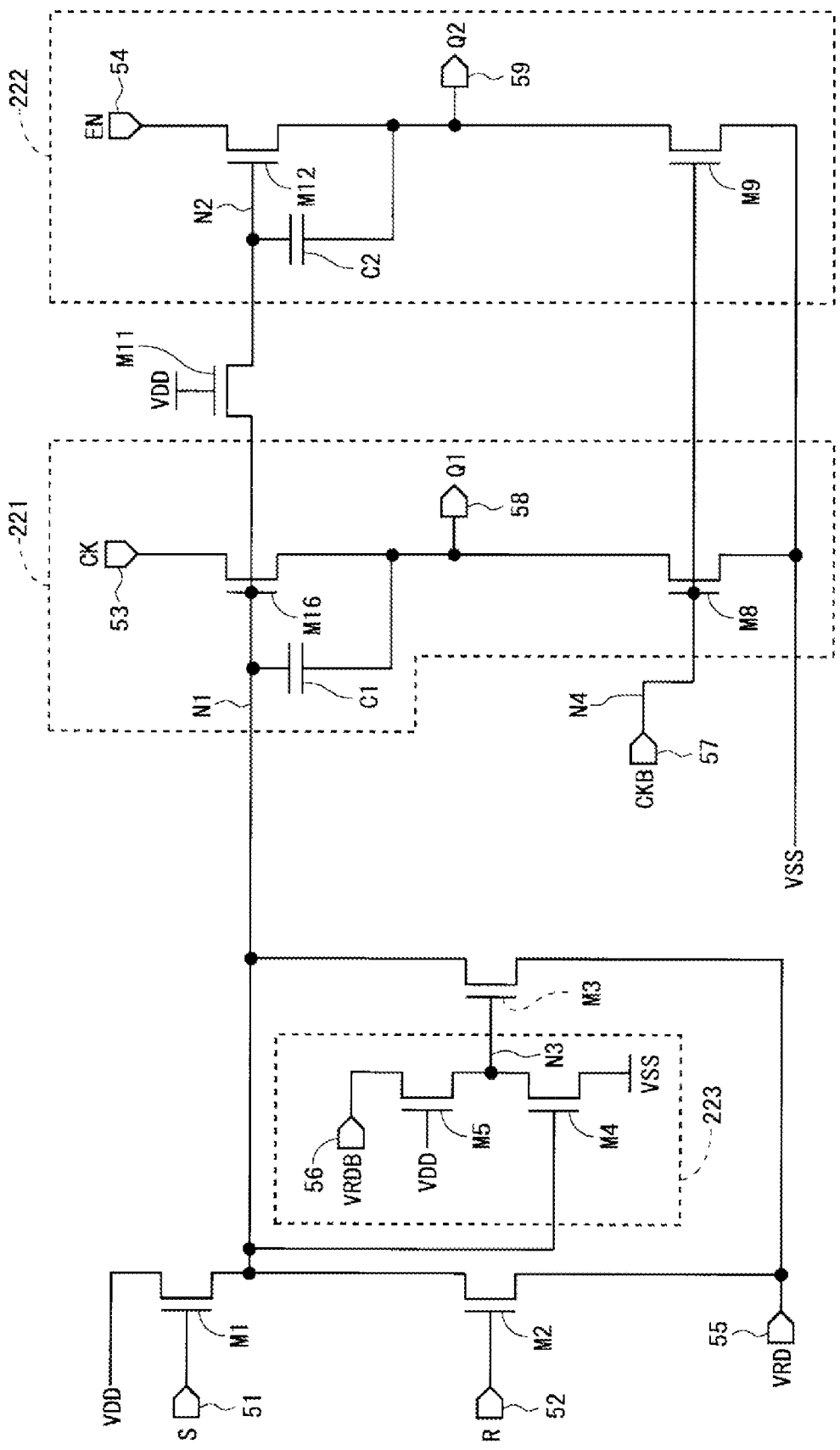
FIG. 50 is a circuit diagram illustrating a configuration of a unit circuit in the gate driver according to the second embodiment described above.

FIG. 50 is a circuit diagram illustrating a configuration of the unit circuit 22 according to the present embodiment. In FIG. 50, the input terminal configured to receive the clock signal CKB is denoted by a reference sign 57. The unit circuit 22 according to the present embodiment has a configuration in which the reset circuit 224 is removed from the configuration of the unit circuit 22 (see FIG. 1) according to the first embodiment. Note that in the present embodiment, a region (wiring line) where the input terminal 57, the control terminal of the transistor M8, and the control terminal of the transistor M9 are connected to one another is referred to as a "fourth internal node".

2.3 Driving Method

A method for driving according to the present embodiment will be described. Note that the presence or absence of the reset circuit 224 does not affect the operation of the unit circuit 22 when the operation mode is set to the non-monitoring mode, in view of suppressing the occurrence of operational failure caused by off-leakage at the transistor when the monitoring processing is performed. Thus, only an operation when the operation mode is set to the monitoring mode will be described here.

Figure 51:
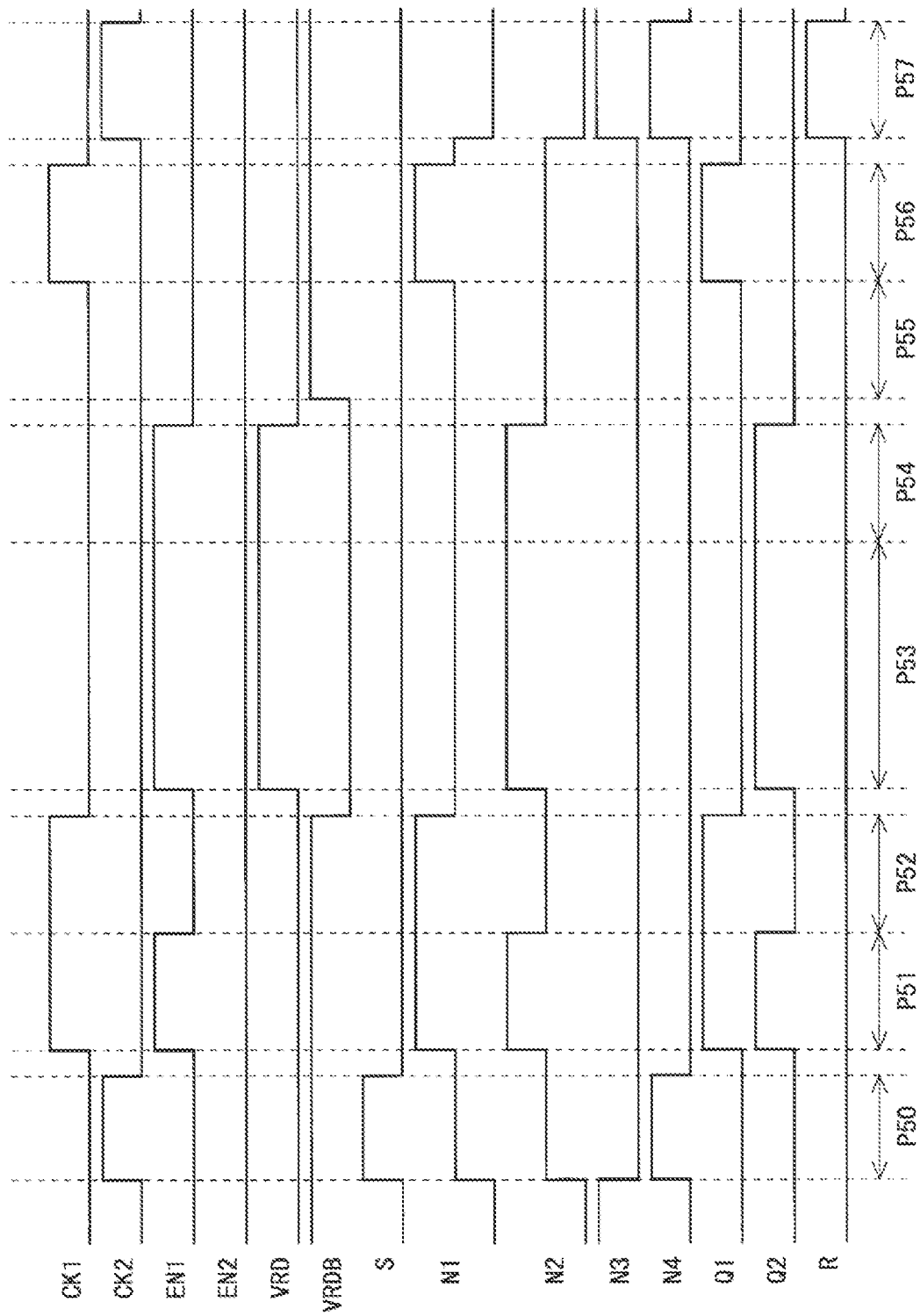
FIG. 51 is a signal waveform diagram for describing an operation of the unit circuit corresponding to a monitoring row when an operation mode is set to a monitoring mode in the second embodiment described above.

With reference to FIG. 51, an operation of the unit circuit 22($i$) at the i-th stage when the operation mode is set to the monitoring mode will be described. However, it is assumed that the i-th row is the monitoring row, and attention is focused on the operation when the monitoring processing is performed for the i-th row. Periods P50 to P57 in the present embodiment correspond to the periods P10 to P17 in the first embodiment. Immediately before the start of the period P50, the potential of the first internal node N1, the potential of the second internal node N2, and the potential of the fourth internal node N4 are at the low level, the potential of the third internal node N3 is at the high level, the stabilization control signal VRD is at the low level, and the stabilization control signal VRDB is at the high level. That is, the potential of the fourth internal node N4 is different from that in the first embodiment.

When the period P50 starts, the clock signal CK2 changes from the low level to the high level. The clock signal CK2 is provided as the clock signal CKB to the unit circuit 22($i$) at the i-th stage. Thus, in the unit circuit 22($i$) at the i-th stage, when the period P50 starts, the potential of the fourth internal node N4 is set to the high level. Due to this, the transistors M8 and M9 are set to the on state. Further, when the period P50 starts, the set signal S changes from the low level to the high level. According to this, the potential of the first internal node N1 and the potential of the second internal node N2 increase. Also, as the potential of the first internal node N1 increases, the transistor M4 is turned on, and the potential of the third internal node N3 is set to the low level. When the period P50 ends, the clock signal CKB (the clock signal CK2) changes from the high level to the low level. As a result, the potential of the fourth internal node N4 is set to the low level, and the transistors M8 and M9 are turned off. As described above, in the present embodiment, although the transistors M8 and M9 are in the on state in the period P50, since the period P50 is a period in which the output signals Q1 and Q2 are to be maintained at the low level, the fact that the transistors M8 and M9 are turned on does not affect the monitoring processing.

Figure 16:
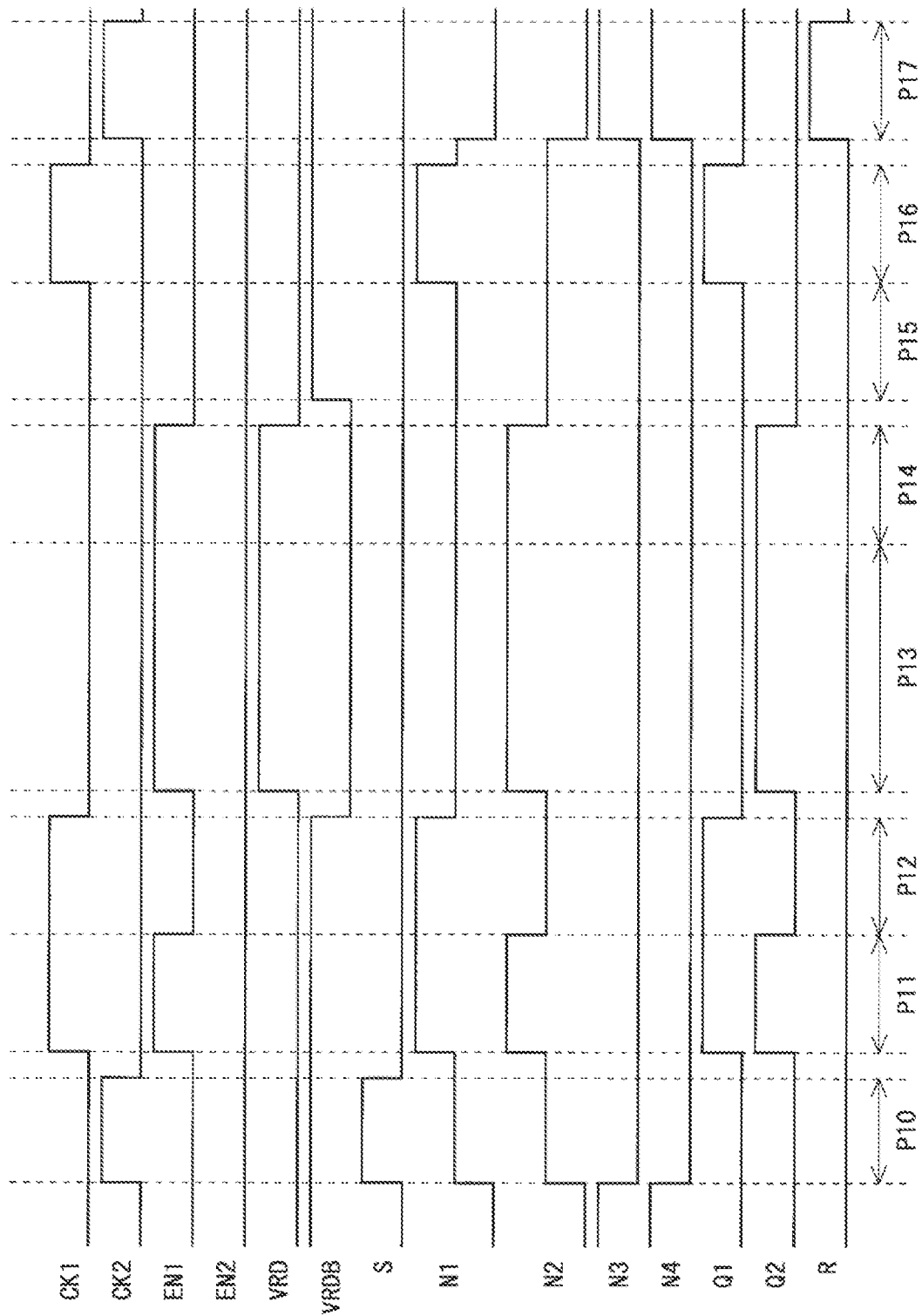
FIG. 16 is a signal waveform diagram for describing an operation of the unit circuit corresponding to a monitoring row when the operation mode is set to the monitoring mode in the first embodiment described above.

In the periods P51 to P57, similar operations to those of the first embodiment are performed in the unit circuits 22($i$) at the i-th stage (see FIG. 16). Thus, the reduction in the potentials of the first internal node N1 and the second internal node N2 caused by off-leakage at the transistors M2 and M3 is suppressed throughout the periods P53 to P54.

Figure 52:
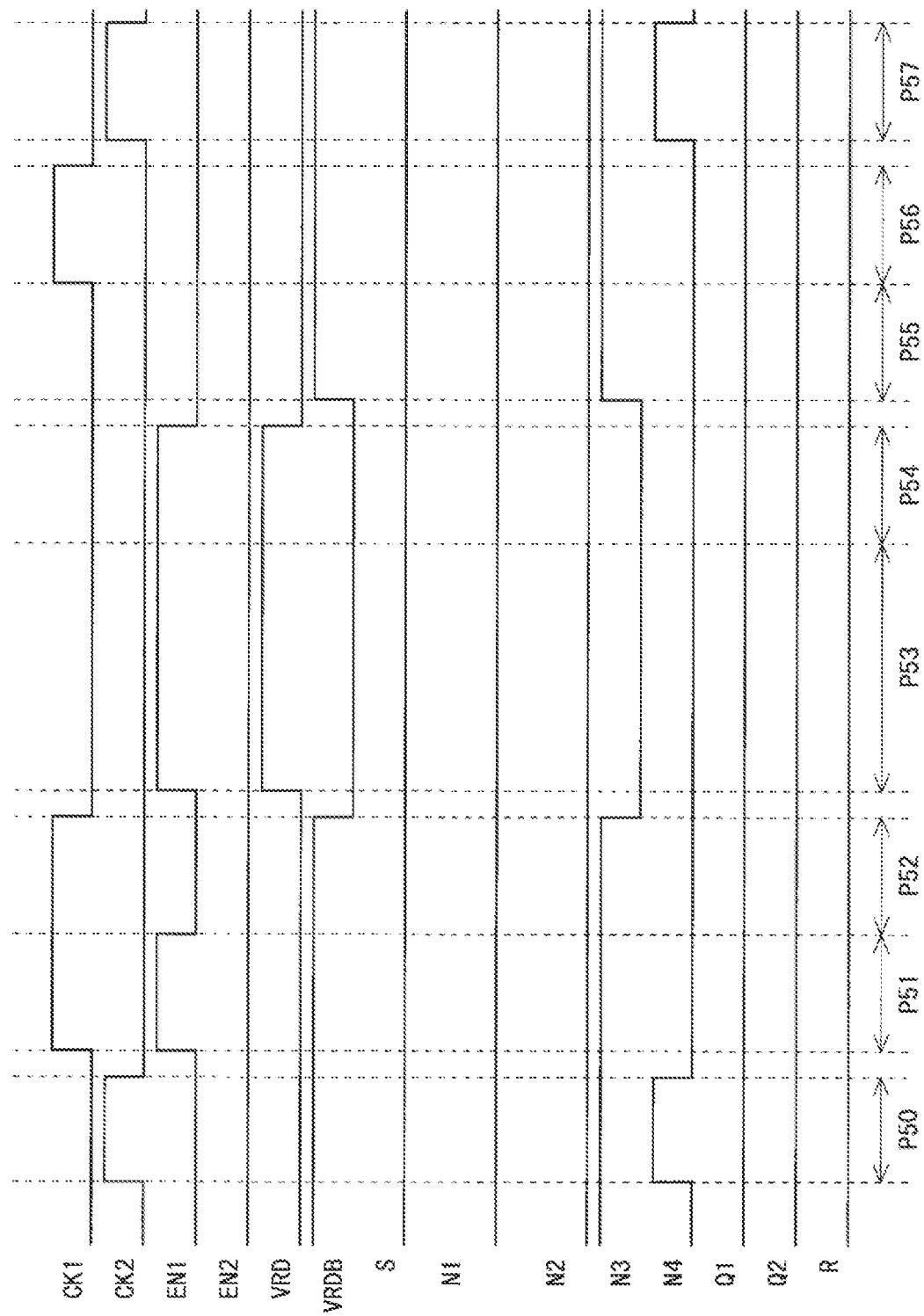
FIG. 52 is a signal waveform diagram for describing an operation of the unit circuit corresponding to a non-monitoring row when the operation mode is set to the monitoring mode in the second embodiment described above.

Next, with reference to FIG. 52, an operation of the unit circuit 22(i) at the i-th stage when the i-th row is supposed to be the non-monitoring row will be described. However, it is assumed that the monitoring processing is performed on the monitoring row in a period on which attention is focused here. Immediately before the start of the period P50, the potential of the first internal node N1, the potential of the second internal node N2, and the potential of the fourth internal node N4 are at the low level, the potential of the third internal node N3 is at the high level, the stabilization control signal VRD is at the low level, and the stabilization control signal VRDB is at the high level.

When the period P50 starts, the clock signal CKB (the clock signal CK2) changes from the low level to the high level. Thus, the potential of the fourth internal node N4 is set to the high level, and the transistors M8 and M9 are turned on. When the period P50 ends, the clock signal CKB (the clock signal CK2) changes from the high level to the low level. As a result, the potential of the fourth internal node N4 is set to the low level, and the transistors M8 and M9 are turned off.

The periods P51 to P56 are similar to the corresponding periods of the first embodiment (see FIG. 25) except that the potential of the fourth internal node N4 is maintained at the low level. In the present embodiment, since the potential of the fourth internal node N4 is maintained at the low level throughout the periods P51 to P56, the transistors M8 and M9 are maintained in the off state. Thus, unlike the first embodiment, the effect of suppressing the occurrence of operational failure in a case where off-leakage occurs at the transistor M12 in the unit circuit 22 corresponding to the non-monitoring row in the periods P53 to P54 cannot be obtained. The period P57 is similar to the period P50.

2.4 Effect

According to the present embodiment, in the unit circuit 22 corresponding to the monitoring row, the occurrence of off-leakage at the transistor M2 is suppressed. In other words, with regard to the organic EL display device having the external compensation function, compared with that of the known, the occurrence of operational failure caused by off-leakage at the transistor in the unit circuit 22 configuring the gate driver 20 is suppressed.

2.5 Modified Example

2.5.1 Schematic Configuration

A modified example of the second embodiment will be described. An organic EL display device according to the present modified example is a display device capable of pause driving, similar to the modified example of the first embodiment. The overall configuration is similar to that in the modified example of the first embodiment (see FIG. 33). The configurations of the pixel circuit 410 and the source driver 30 are also similar to those in the modified example of the first embodiment (see FIG. 34). The configuration illustrated in FIG. 35 may be used for the pixel circuit 410.

2.5.2 Gate Driver

Figure 53:
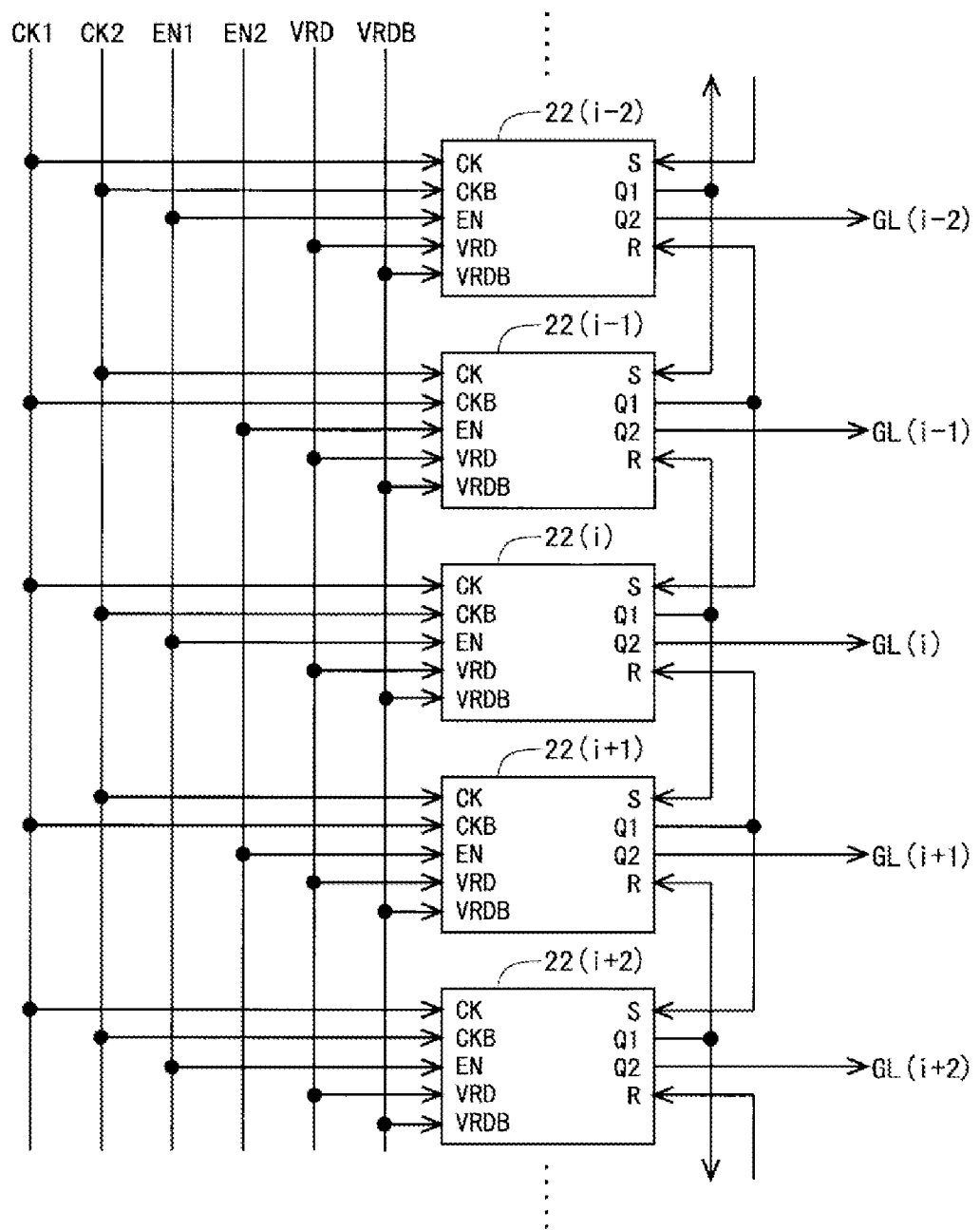
FIG. 53 is a block diagram illustrating a configuration of a shift register having five stages and configuring a gate driver according to a modified example of the second embodiment described above.

FIG. 53 is a block diagram illustrating a configuration of a shift register including five stages and configuring the gate driver 20 according to the present modified example. In addition to the input terminals provided in the modified example of the first embodiment (see FIG. 36), each unit circuit 22 includes an input terminal configured to receive the clock signal CKB. As for the unit circuit 22 at the odd-numbered stage, the clock signal CK1 is provided as the clock signal CK, and the clock signal CK2 is provided as the clock signal CKB. As for the unit circuit 22 at the even-numbered stage, the clock signal CK2 is provided as the clock signal CK, and the clock signal CK1 is provided as the clock signal CKB. In a similar manner to that in the modified example of the first embodiment, the output signal Q1 from the unit circuit 22 at each stage is provided as the reset signal R to the unit circuit 22 at the previous stage, and is provided as the set signal S to the unit circuit 22 at the next stage, and the output signal Q2 from the unit circuit 22 at each stage is provided as a scanning signal to the corresponding scanning signal line GL.

The configuration of the unit circuit 22 is similar to that of the second embodiment (see FIG. 50). In other words, of the stabilization circuit 223 and the reset circuit 224, only the stabilization circuit 223 is provided in the unit circuit 22.

2.5.3 Driving Method

A method for driving according to the present modified example will be described. The operation modes prepared in the present modified example are identical to those in the modified example of the first embodiment. Here, an operation of the unit circuit 22(i) at the i-th stage in the monitoring period of a pause period will be described. Note that periods P60 to P67 in the present modified example correspond to the periods P40 to P47 in the modified example of the first embodiment.

Figure 54:
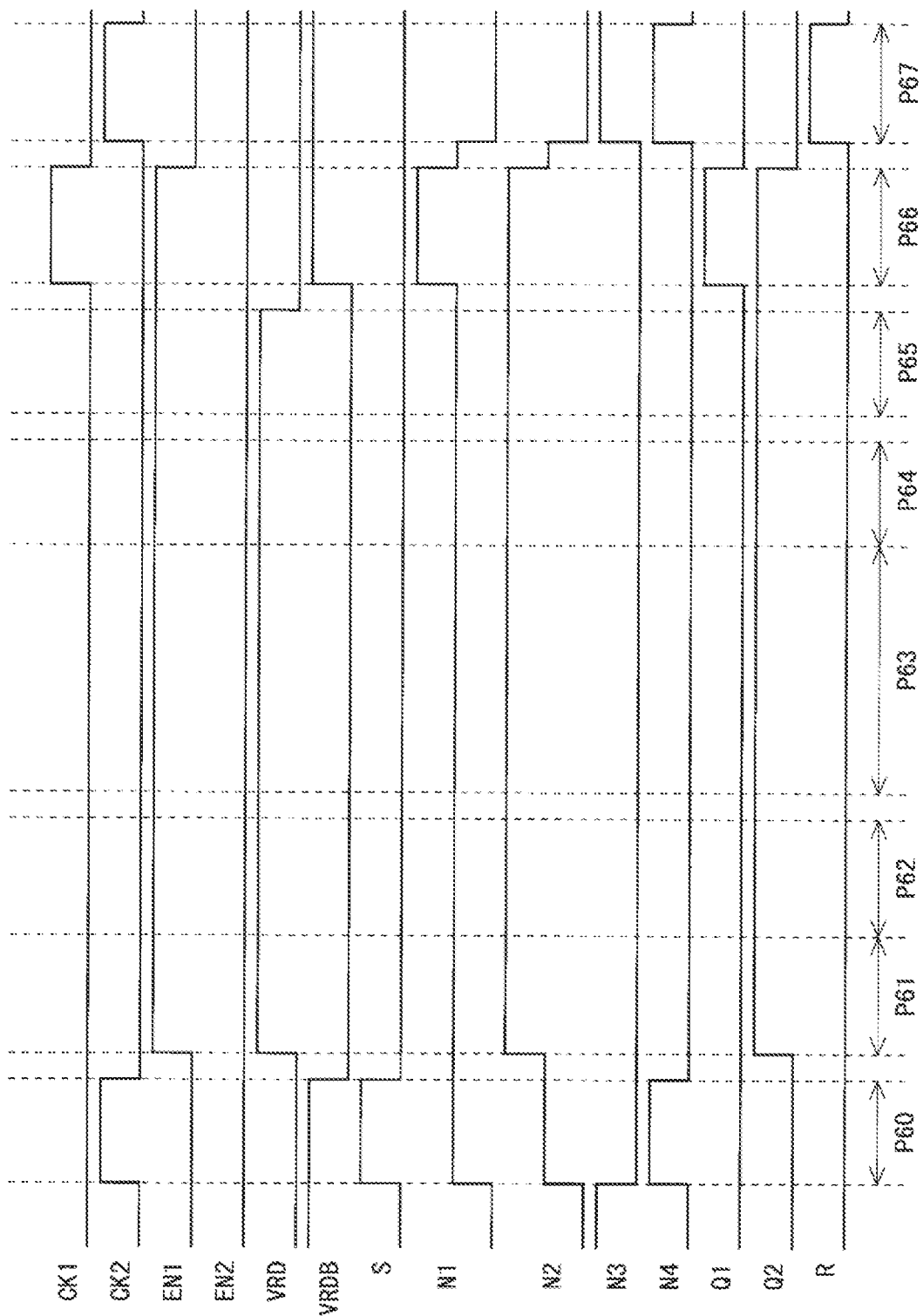
FIG. 54 is a signal waveform diagram for describing an operation of a unit circuit corresponding to a monitoring row in a monitoring period in the modified example of the second embodiment described above.

With reference to FIG. 54, an operation of the unit circuit 22(i) at the i-th stage when the i-th row is supposed to be the monitoring row will be described. Immediately before the start of the period P60, the potential of the first internal node N1, the potential of the second internal node N2, and the potential of the fourth internal node N4 are at the low level, the potential of the third internal node N3 is at the high level, the stabilization control signal VRD is at the low level, and the stabilization control signal VRDB is at the high level. That is, the potential of the fourth internal node N4 is different from that in the modified example of the first embodiment.

When the period P60 starts, the clock signal CKB (the clock signal CK2) changes from the low level to the high level. When the period P60 ends, the clock signal CKB (the clock signal CK2) changes from the high level to the low level. Thus, in the period P60, similar to the period P50 in FIG. 51 in the second embodiment, the potential of the fourth internal node N4 is set to the high level, and the transistors M8 and M9 are in the on state. However, since the period P60 is a period in which the output signals Q1 and Q2 are to be maintained at the low level, the fact that the transistors M8 and M9 are turned on does not affect the monitoring processing. Further, when the period P60 starts, the set signal S changes from the low level to the high level. According to this, the potential of the first internal node N1 and the potential of the second internal node N2 increase. Also, as the potential of the first internal node N1 increases, the transistor M4 is turned on, and the potential of the third internal node N3 is set to the low level.

Figure 42:
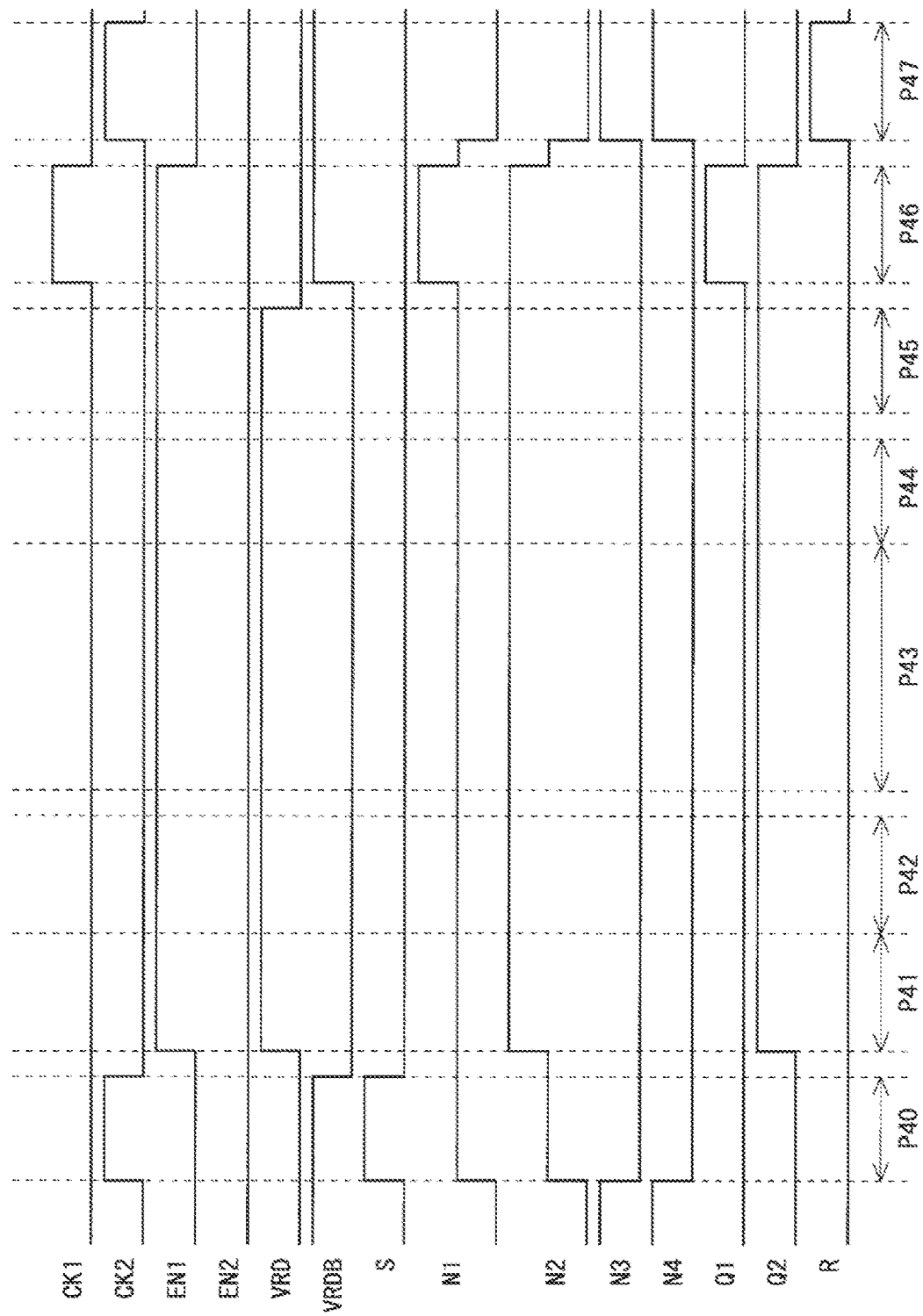
FIG. 42 is a signal waveform diagram for describing an operation of the unit circuit corresponding to a monitoring row in a monitoring period in the modified example of the first embodiment described above.

In the periods P61 to P67, in the unit circuits 22(i) at the i-th stage, operations similar to those in the modified example of the first embodiment are performed (see FIG. 42). Thus, the reduction in the potentials of the first internal node N1 and the second internal node N2 caused by off-leakage at the transistors M2 and M3 is suppressed throughout the periods P61 to P65.

Figure 55:
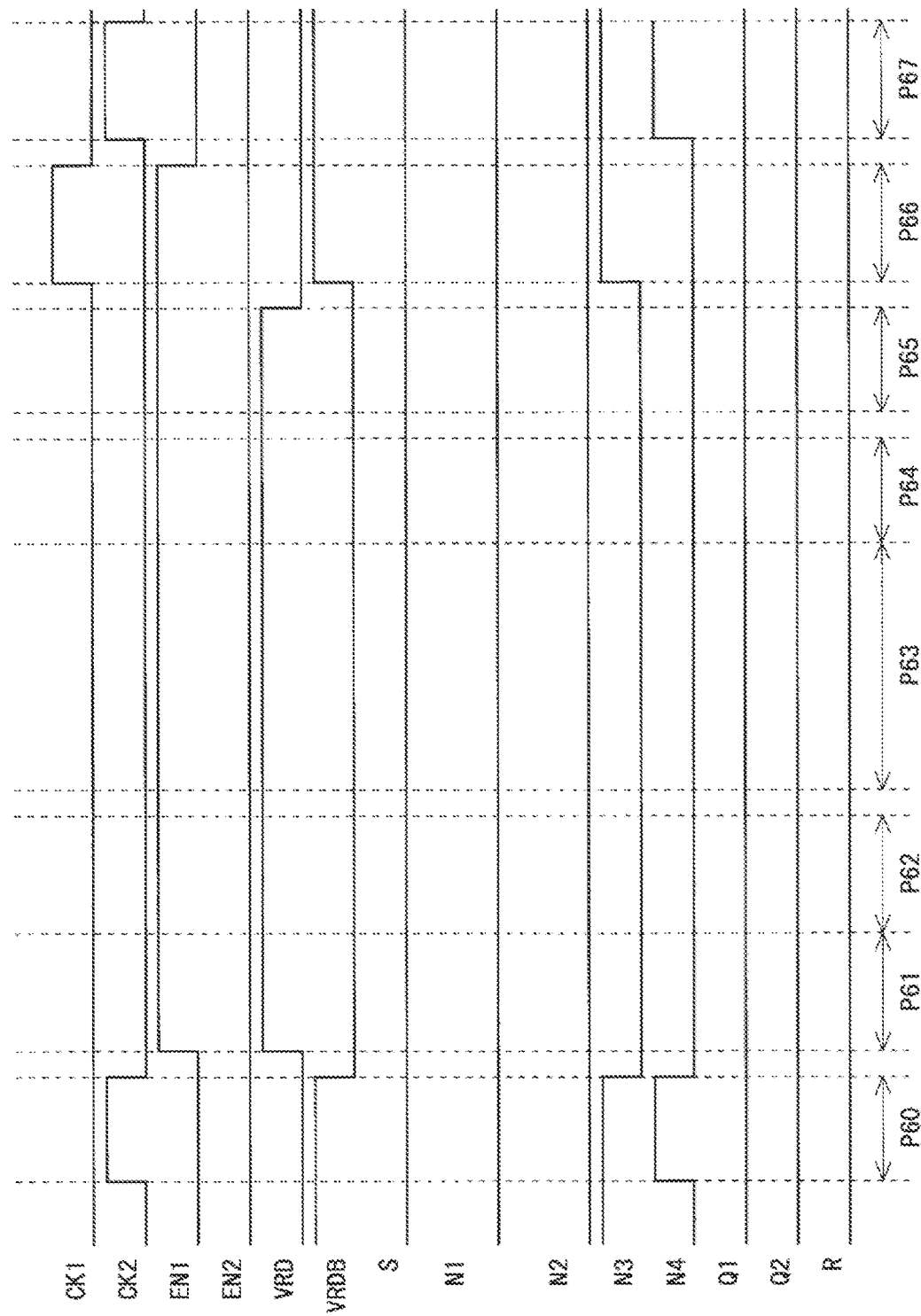
FIG. 55 is a signal waveform diagram for describing an operation of the unit circuit corresponding to a non-monitoring row in the monitoring period in the modified example of the second embodiment described above.

Next, with reference to FIG. 55, an operation of the unit circuit 22(i) at the i-th stage when the i-th row is supposed to be the non-monitoring row will be described. Immediately before the start of the period P60, the potential of the first internal node N1, the potential of the second internal node N2, and the potential of the fourth internal node N4 are at the low level, the potential of the third internal node N3 is at the high level, the stabilization control signal VRD is at the low level, and the stabilization control signal VRDB is at the high level.

When the period P60 starts, the clock signal CKB (the clock signal CK2) changes from the low level to the high level. Thus, the potential of the fourth internal node N4 is set to the high level, and the transistors M8 and M9 are turned on. When the period P60 ends, the clock signal CKB (the clock signal CK2) changes from the high level to the low level. As a result, the potential of the fourth internal node N4 is set to the low level, and the transistors M8 and M9 are turned off.

The periods P61 to P66 are similar to those in the modified example of the first embodiment (see FIG. 48) except that the potential of the fourth internal node N4 is maintained at the low level. In the present modified example, the potential of the fourth internal node N4 is maintained at the low level throughout the periods P61 to P66, and thus, the transistors M8 and M9 are maintained in the off state. Thus, unlike the modified example of the first embodiment, the effect of suppressing the occurrence of operational failure in a case where off-leakage occurs at the transistor M12 in the unit circuit 22 corresponding to the non-monitoring row in the periods P63 to P64 cannot be obtained. The period P67 is similar to the period P60.

2.5.4 Effect

According to the present modified example, as is the case with the second embodiment, in the unit circuit 22 corresponding to the monitoring row, the occurrence of off-leakage at the transistor M2 is suppressed. In other words, with regard to the organic EL display device having the external compensation function, compared with that of the known one, the occurrence of operational failure caused by off-leakage at the transistor in the unit circuit 22 configuring the gate driver 20 is suppressed.

3. Third Embodiment

3.1 Schematic Configuration

In the first embodiment, the stabilization circuit 223 and the reset circuit 224 are provided in the unit circuit 22 configuring the gate driver 20 as constituent elements for suppressing the occurrence of operational failure caused by off-leakage at the transistor (FIG. 1). In contrast, in the present embodiment, only the reset circuit 224, of the stabilization circuit 223 and the reset circuit 224, is provided in the unit circuit 22. The overall configuration is similar to that of the first embodiment (see FIG. 2). The configurations of the pixel circuit 410 and the source driver 30 are similar to those of the first embodiment (see FIG. 4). The configuration illustrated in FIG. 5 may be used for the pixel circuit 410.

3.2 Gate Driver

Figure 56:
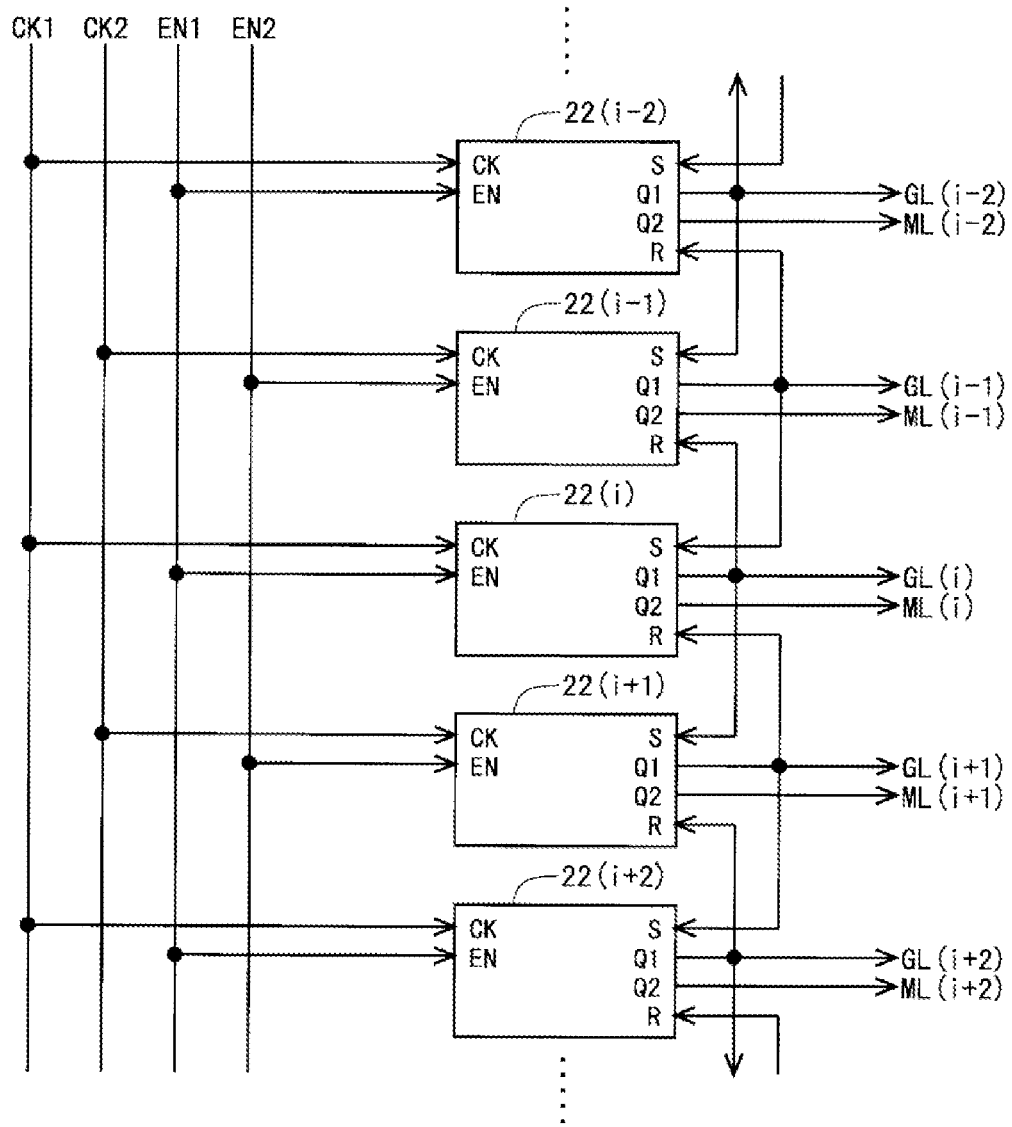
FIG. 56 is a block diagram illustrating a configuration of a shift register including five stages and configuring a gate driver according to a third embodiment.

FIG. 56 is a block diagram illustrating a configuration of a shift register including five stages and configuring the gate driver 20 according to the present embodiment. As can be seen from FIG. 56, in the present embodiment, the stabilization control signals VRD and VRDB are not used. Thus, each unit circuit 22 is not provided with the input terminal configured to receive the stabilization control signal VRD and the input terminal configured to receive the stabilization control signal VRDB, among the input terminals provided in the first embodiment (see FIG. 6). The other configurations are the same as those of the first embodiment.

Figure 57:
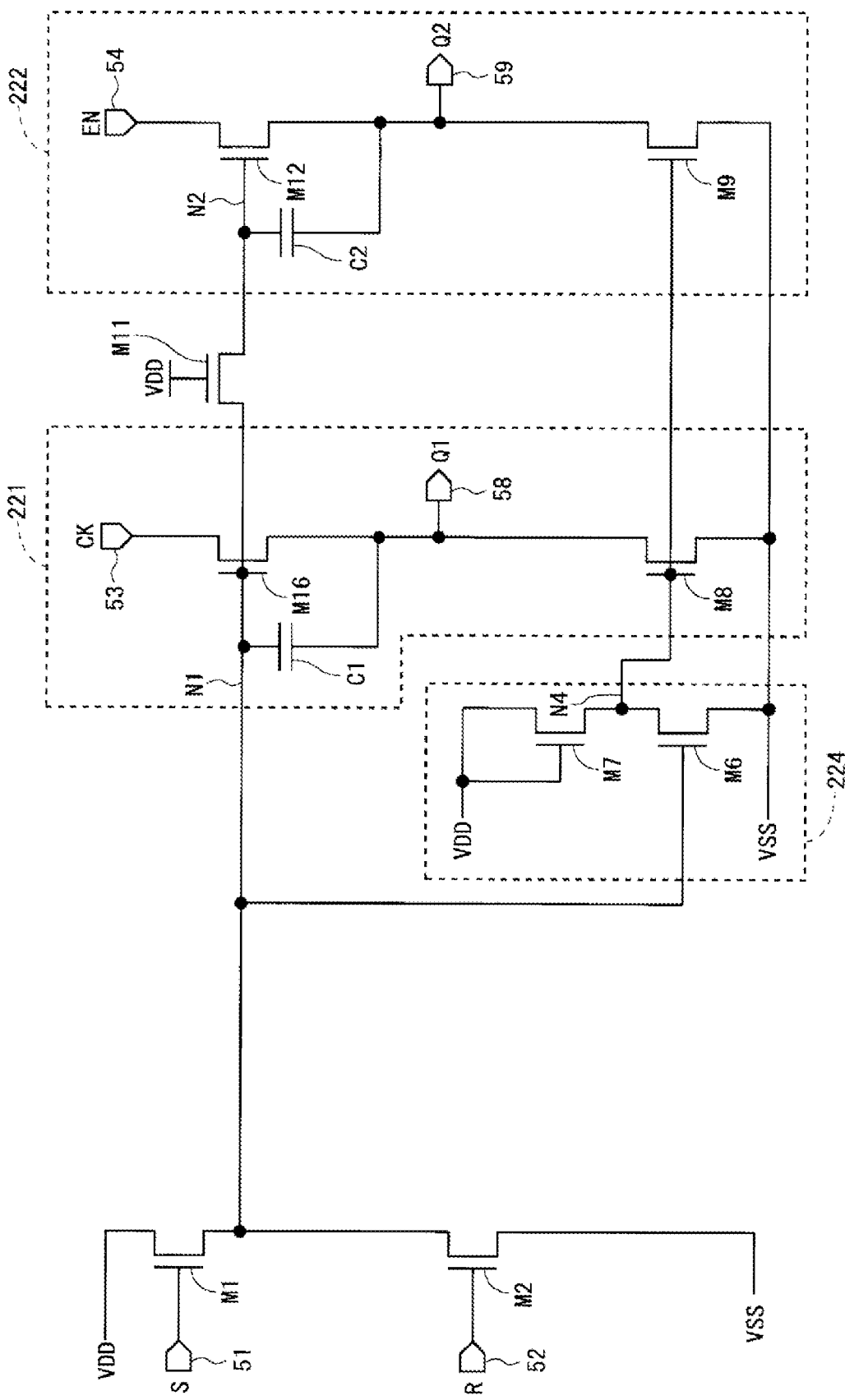
FIG. 57 is a circuit diagram illustrating a configuration of a unit circuit in the gate driver according to the third embodiment described above.

FIG. 57 is a circuit diagram illustrating a configuration of the unit circuit 22 according to the present embodiment. The unit circuit 22 according to the present embodiment has a configuration in which the stabilization circuit 223 is removed from the configuration of the unit circuit 22 (see FIG. 1) according to the first embodiment. However, the second conduction terminal of the transistor M2 is connected to the first reference potential line (the power source line provided with the low-level potential VSS).

3.3 Driving Method

A method for driving according to the present embodiment will be described. Note that the presence or absence of the stabilization circuit 223 does not affect the operation of the unit circuit 22 when the operation mode is set to the non-monitoring mode, in view of suppressing the occurrence of operational failure caused by off-leakage at the transistor when the monitoring processing is performed. Thus, only an operation when the operation mode is set to the monitoring mode will be described here.

Figure 58:
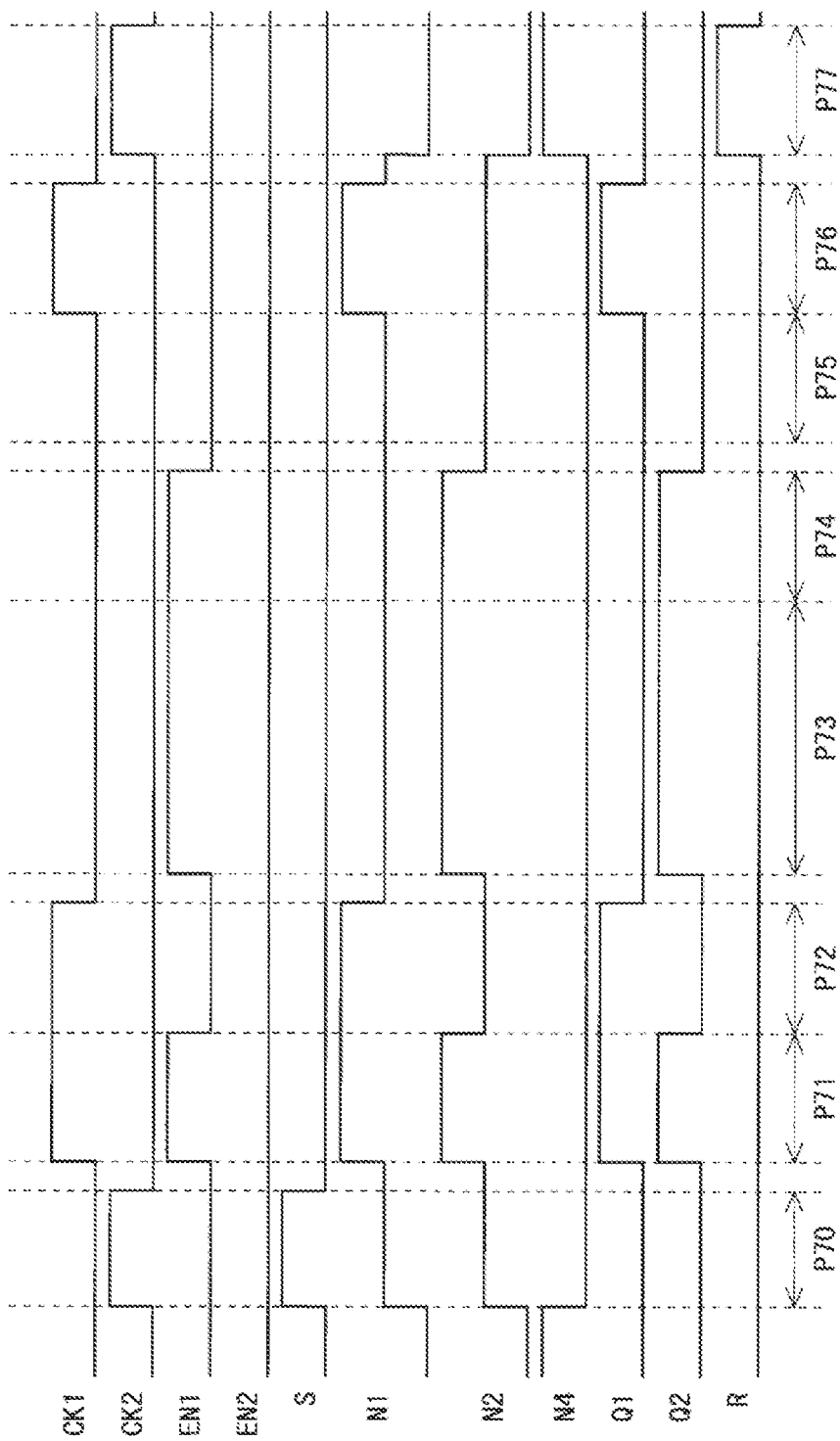
FIG. 58 is a signal waveform diagram for describing an operation of the unit circuit corresponding to a monitoring row when an operation mode is set to a monitoring mode in the third embodiment described above.

With reference to FIG. 58, an operation of the unit circuit 22(i) at the i-th stage when the operation mode is set to the monitoring mode will be described. However, it is assumed that the i-th row is the monitoring row, and attention is focused on the operation when the monitoring processing is performed for the i-th row. Periods P70 to P77 in the present embodiment correspond to the periods P10 to P17 in the first embodiment.

As can be seen from FIG. 16 and FIG. 58, in the unit circuit 22(i) at the i-th stage, similar operations to those in the first embodiment are performed throughout the periods P70 to P77. However, since the stabilization circuit 223 is not provided in the unit circuit 22(i), the effect of suppressing the reduction in the potential of the first internal node N1 caused by off-leakage at the transistor M2 cannot be obtained. In other words, the effect of suppressing the occurrence of operational failure in a case where off-leakage occurs at the transistor M2 in the periods P73 to P74 cannot be obtained.

Next, with reference to FIG. 59, an operation of the unit circuit 22(i) at the i-th stage when the i-th row is supposed to be the non-monitoring row will be described. However, it is assumed that the monitoring processing is performed on the monitoring row in a period on which attention is focused here.

Figure 59:
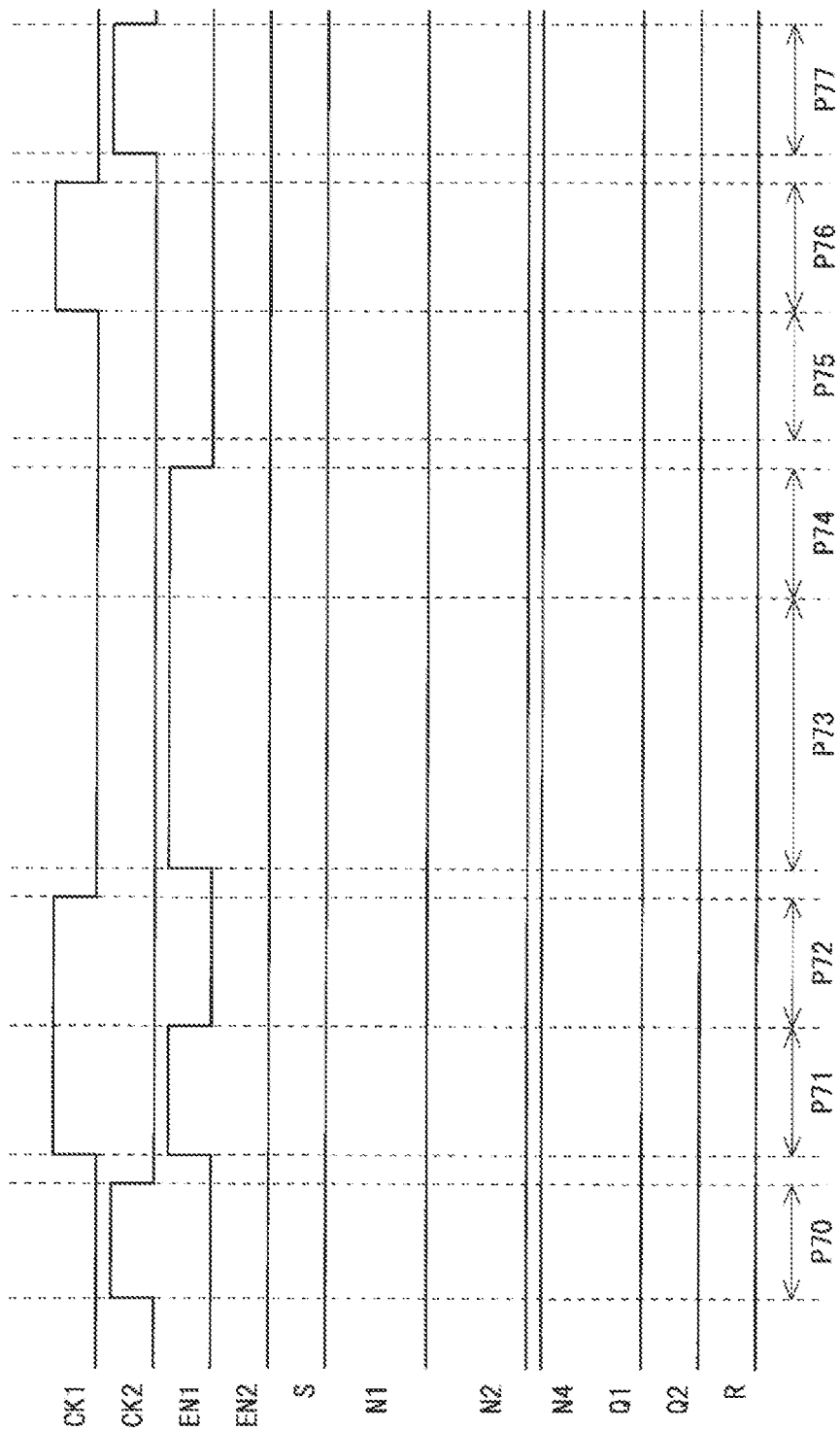
FIG. 59 is a signal waveform diagram for describing an operation of the unit circuit corresponding to a non-monitoring row when the operation mode is set to the monitoring mode in the third embodiment described above.

As can be seen from FIG. 25 and FIG. 59, in the unit circuit 22(i) at the i-th stage, similar operations to those in the first embodiment are performed throughout the periods P70 to P77. That is, the potential of the fourth internal node N4 is maintained at the high level throughout the periods P70 to P77. Thus, since the transistor M9 is maintained in the on state, as is the case with the first embodiment, the potential of the output terminal 59 (the potential of the output signal Q2) is maintained at the low level even when off-leakage occurs at the transistor M12 in the periods P73 to P74.

3.4 Effect

According to the present embodiment, in the unit circuit 22 corresponding to the non-monitoring row, even when off-leakage occurs at the transistor M12, the output signal Q2 is maintained at the low level. In other words, with regard to the organic EL display device having the external compensation function, compared with that of the known one, the occurrence of operational failure caused by off-leakage at the transistor in the unit circuit 22 configuring the gate driver 20 is suppressed.

3.5 Modified Example

3.5.1 Schematic Configuration

A modified example of the third embodiment will be described. An organic EL display device according to the present modified example is a display device capable of pause driving, similar to the modified example of the first embodiment. The overall configuration is similar to that in the modified example of the first embodiment (see FIG. 33). The configurations of the pixel circuit 410 and the source driver 30 are also similar to those in the modified example of the first embodiment (see FIG. 34). The configuration illustrated in FIG. 35 may be used for the pixel circuit 410.

3.5.2 Gate Driver

Figure 60:
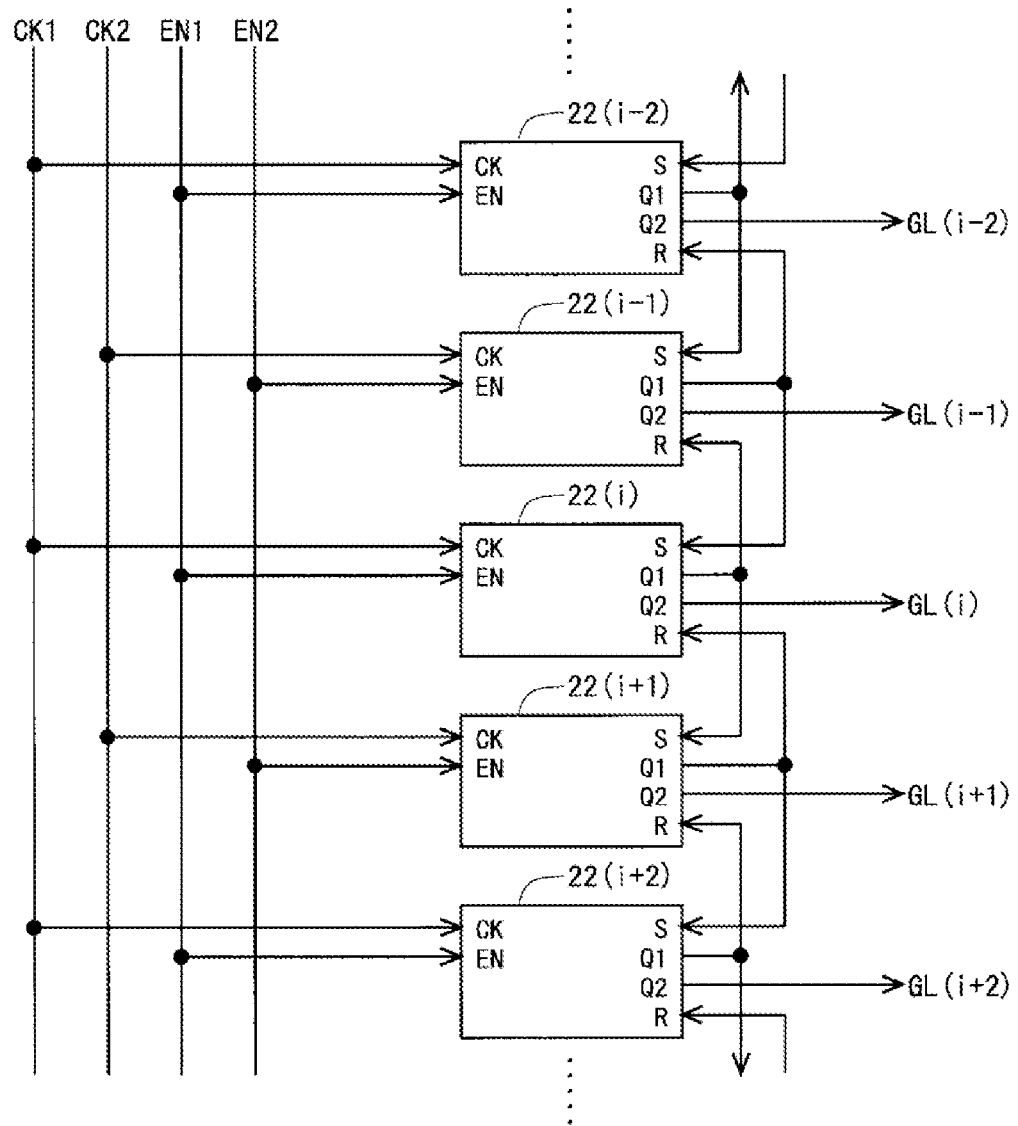
FIG. 60 is a block diagram illustrating a configuration of a shift register having five stages and configuring a gate driver according to a modified example of the third embodiment described above.

FIG. 60 is a block diagram illustrating a configuration of a shift register including five stages and configuring the gate driver 20 according to the present modified example. In each unit circuit 22, the input terminal configured to receive the stabilization control signal VRD and the input terminal configured to receive the stabilization control signal VRDB are not provided, among the input terminals provided in the modified example of the first embodiment (see FIG. 36). The other configurations are the same as those in the modified example of the first embodiment.

The configuration of the unit circuit 22 is the same as that of the third embodiment (see FIG. 57). In other words, only the reset circuit 224, of the stabilization circuit 223 and the reset circuit 224, is provided in the unit circuit 22.

3.5.3 Driving Method

A method for driving according to the present modified example will be described. The operation modes prepared in the present modified example are identical to those in the modified example of the first embodiment. Here, an operation of the unit circuit 22(i) at the i-th stage in the monitoring period of a pause period will be described. Note that periods P80 to P87 in the present modified example correspond to the periods P40 to P47 in the modified example of the first embodiment.

Figure 61:
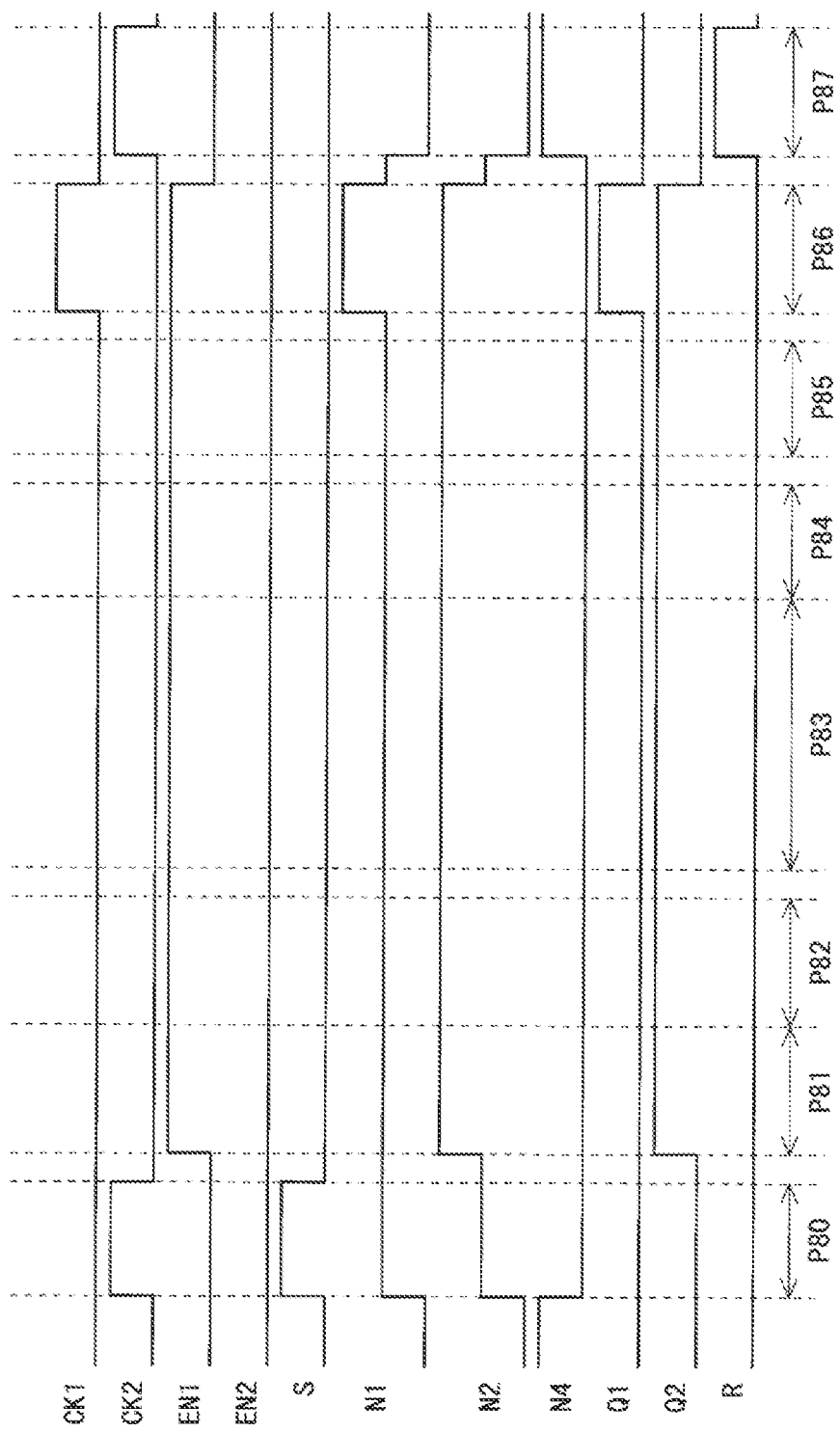
FIG. 61 is a signal waveform diagram for describing an operation of a unit circuit corresponding to a monitoring row in a monitoring period in the modified example of the third embodiment described above.

With reference to FIG. 61, an operation of the unit circuit 22(i) at the i-th stage when the i-th row is supposed to be the monitoring row will be described. As can be seen from FIG. 42 and FIG. 61, in the unit circuit 22(i) at the i-th stage, similar operations to those in the modified example of the first embodiment are performed throughout the periods P80 to P87. However, since the stabilization circuit 223 is not provided in the unit circuit 22(i), the effect of suppressing the reduction in the potential of the first internal node N1 caused by off-leakage at the transistor M2 cannot be obtained. In other words, the effect of suppressing the occurrence of operational failure in a case where off-leakage occurs at the transistor M2 in the monitoring period cannot be obtained.

Figure 62:
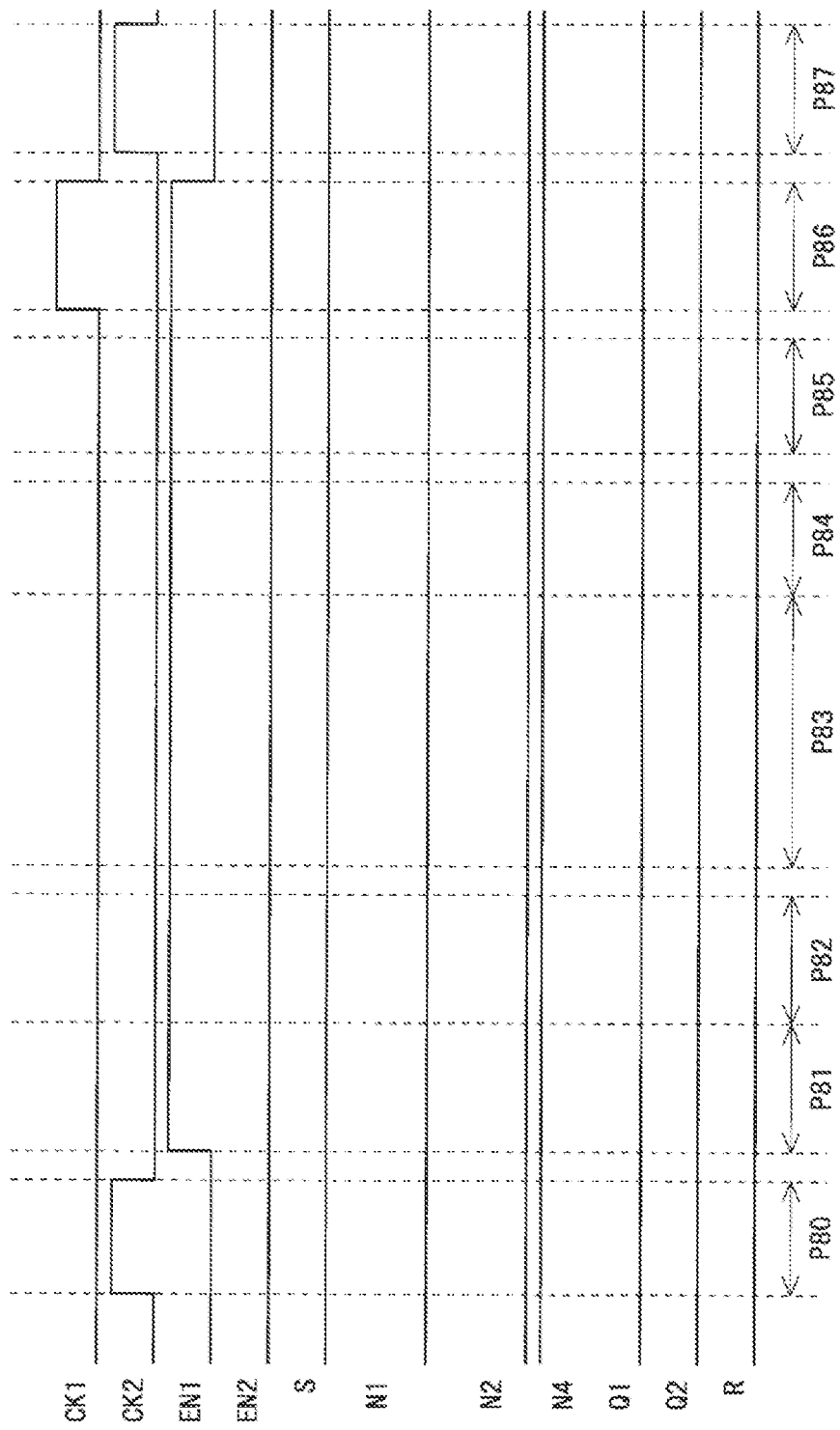
FIG. 62 is a signal waveform diagram for describing an operation of the unit circuit corresponding to a non-monitoring row in the monitoring period in the modified example of the third embodiment described above.
Figure 63:
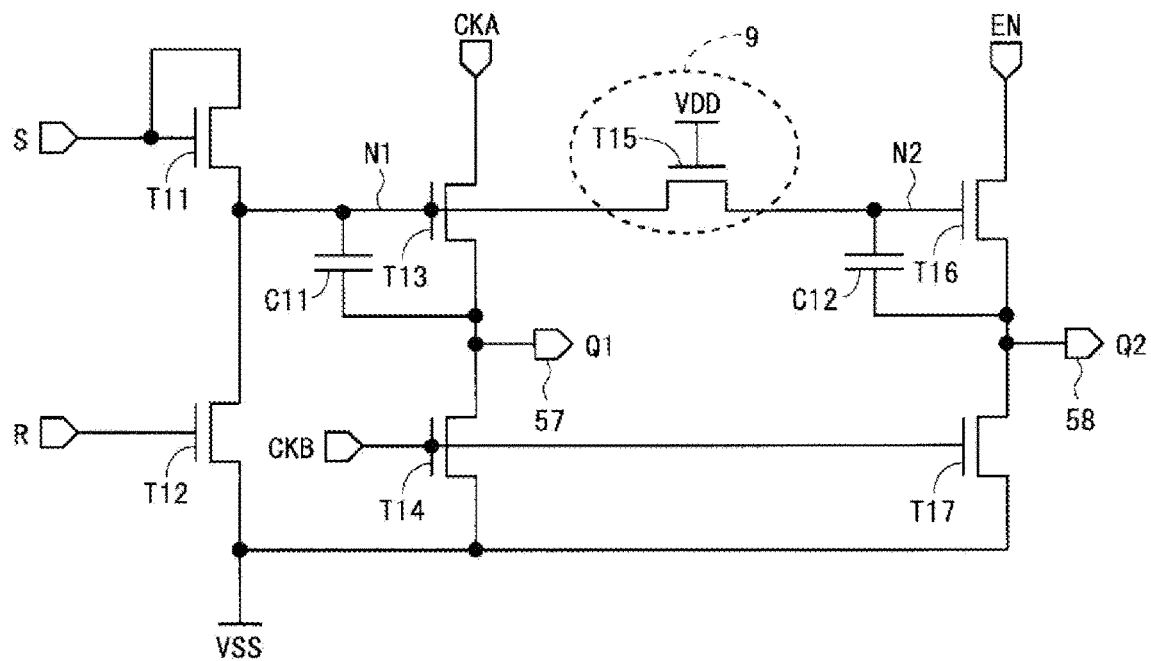
FIG. 63 is a circuit diagram illustrating a configuration of a unit circuit in a gate driver according to a known example.
Figure 64:
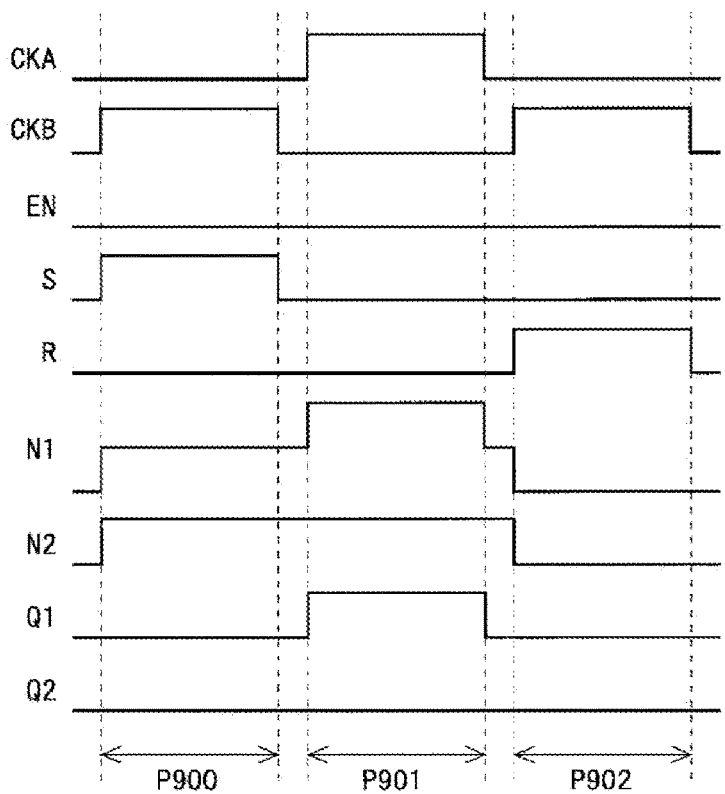
FIG. 64 is a signal waveform diagram for describing an operation of the unit circuit when writing for image display is performed according to the known example.
Figure 65:
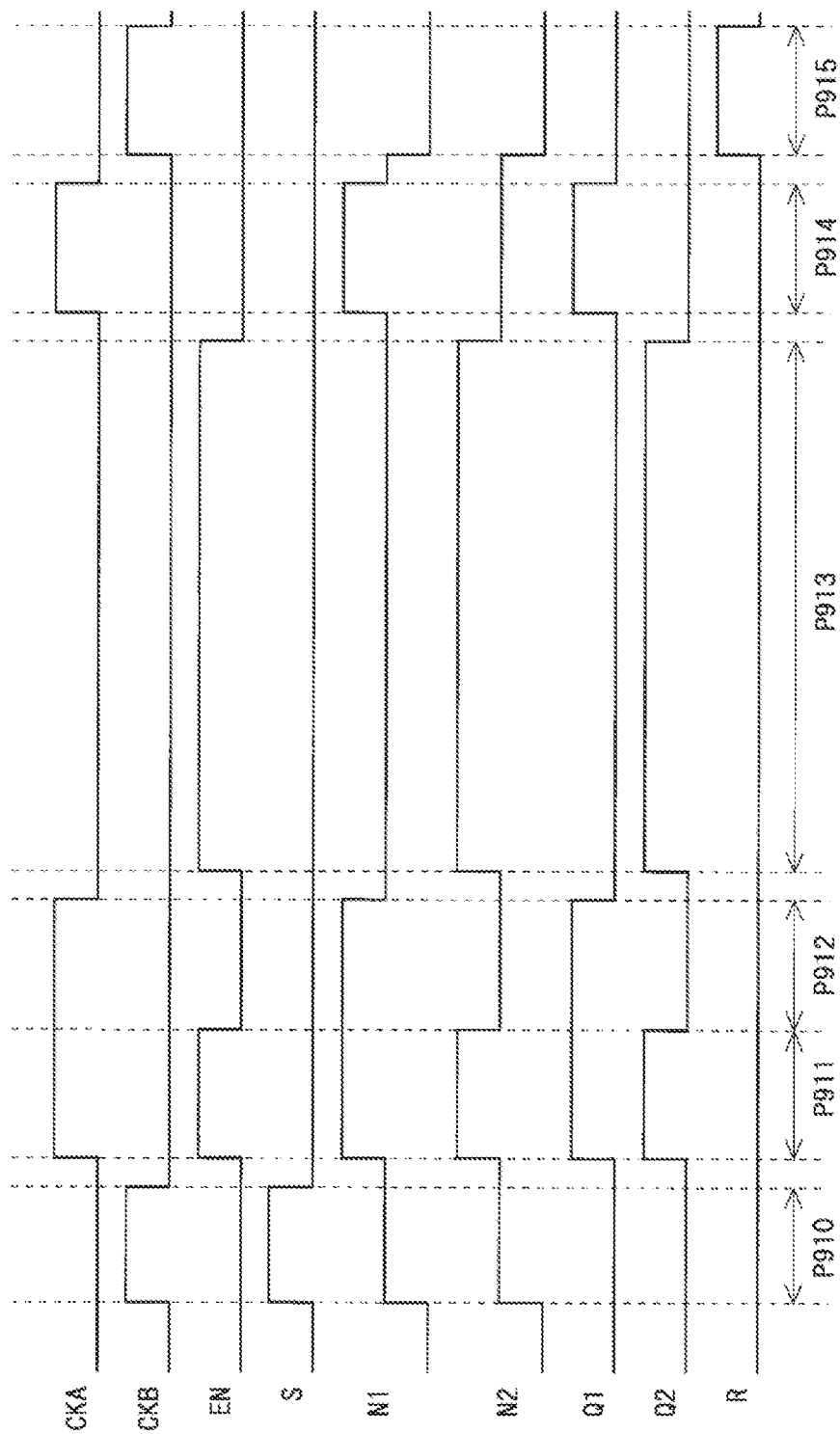
FIG. 65 is a signal waveform diagram for describing the operation of the unit circuit when monitoring processing is performed according to the known example.
Figure 66:
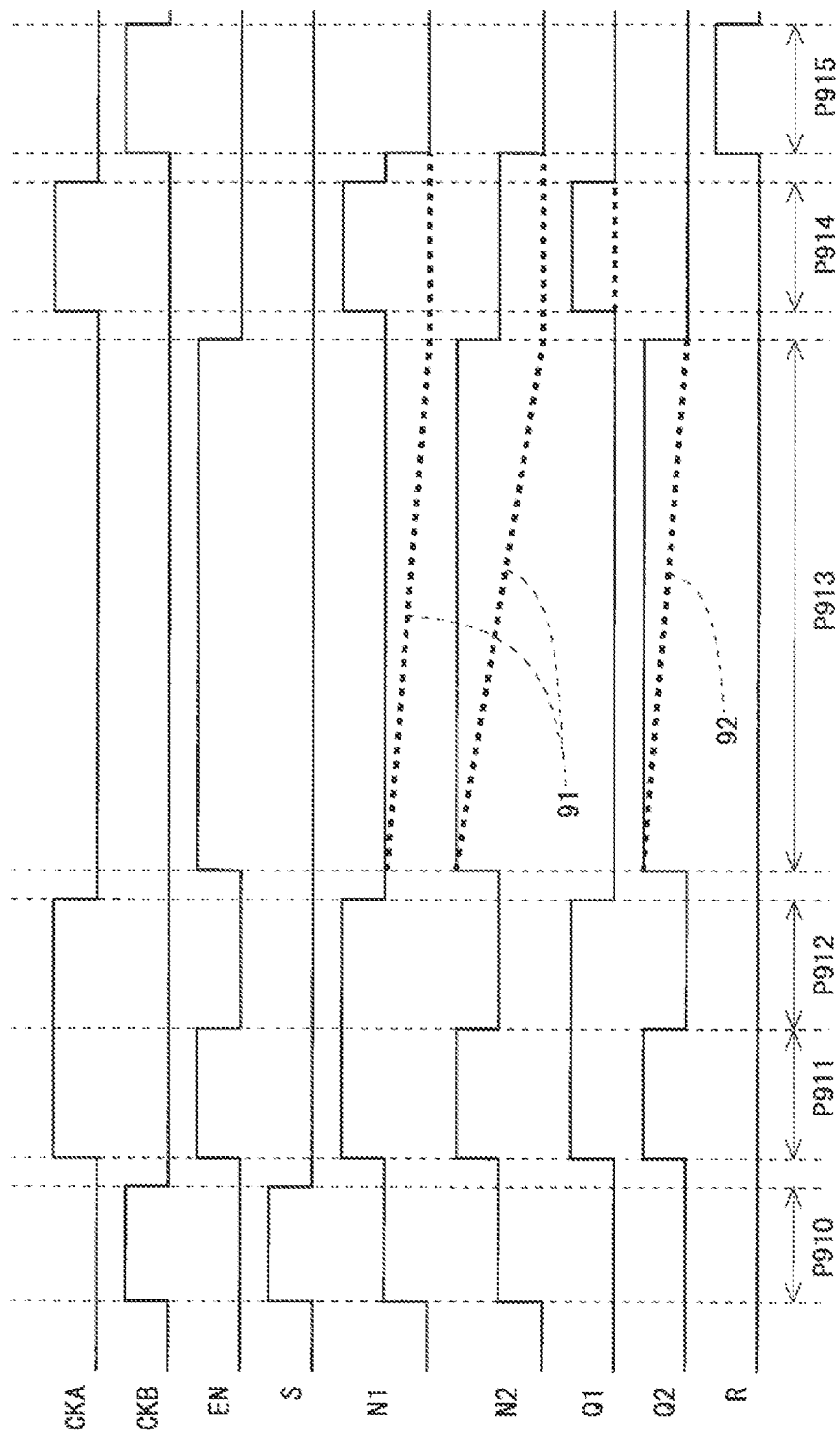
FIG. 66 is a diagram illustrating operational failure caused by off-leakage at a transistor in the known example.
Figure 67:
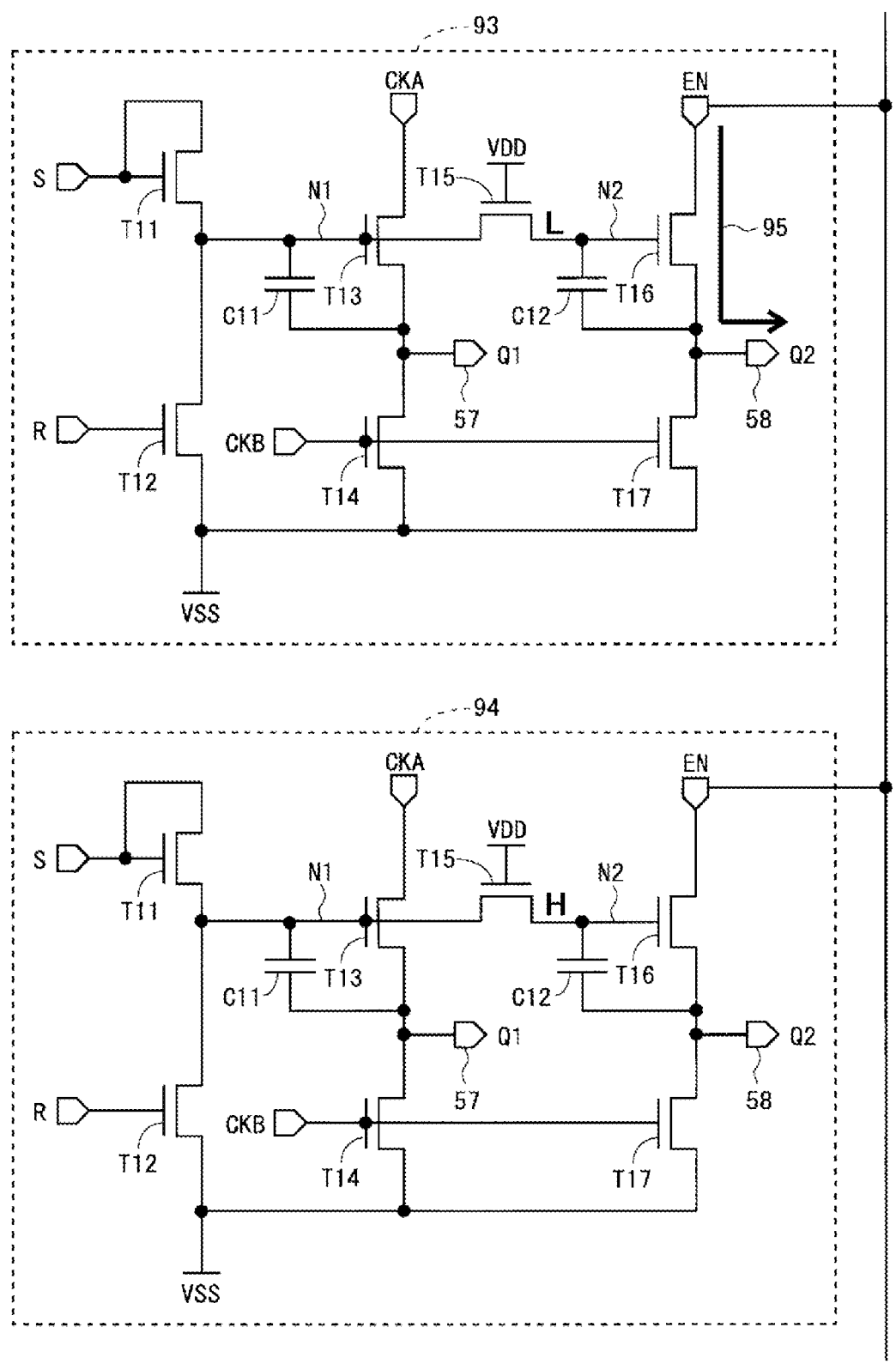
FIG. 67 is a diagram illustrating operational failure caused by off-leakage at a transistor in the known example.
Figure 68:
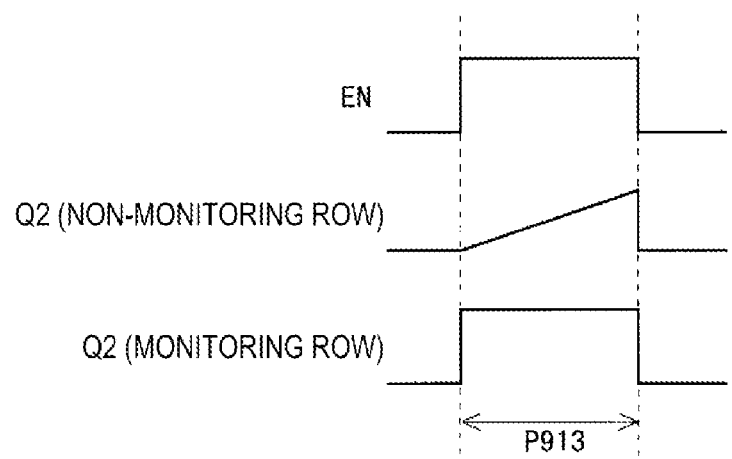
FIG. 68 is a diagram illustrating operational failure caused by off-leakage at a transistor in the known example.

Next, with reference to FIG. 62, an operation of the unit circuit 22(i) at the i-th stage when the i-th row is supposed to be the non-monitoring row will be described. As can be seen from FIG. 48 and FIG. 62, in the unit circuit 22(i) at the i-th stage, similar operations to those in the modified example of the first embodiment are performed throughout the periods P80 to P87. That is, the potential of the fourth internal node N4 is maintained at the high level throughout the periods P80 to P87. Thus, since the transistor M9 is maintained in the on state, as is the case with the modified example of the first embodiment, the potential of the output terminal 59 (the potential of the output signal Q2) is maintained at the low level even when off-leakage occurs at the transistor M12.

3.5.4 Effect

According to the present modified example, similar to the third embodiment, in the unit circuit 22 corresponding to the non-monitoring row, the output signal Q2 is maintained at the low level even when off-leakage occurs at the transistor M12. In other words, with regard to the organic EL display device having the external compensation function, compared with that of the known one, the occurrence of operational failure caused by off-leakage at the transistor in the unit circuit 22 configuring the gate driver 20 is suppressed.

4. Others

Note that the above description is based on the assumption that the monitoring row is sequentially shifted one by one row from the first row to the n-th row, but the disclosure is not limited to this. The monitoring row may be randomly shifted.

Although the above-described respective embodiments (including the modified examples) have been described with the organic EL display devices having been exemplified, the disclosure is not limited to these devices. The disclosure can also be applied to display devices as long as the display devices include display elements to be driven by a current (display elements whose luminance or transmittance is controlled by a current). For example, the disclosure can also be applied to inorganic EL display devices including inorganic light emitting diodes, Quantum dot Light Emitting Diode (QLED) display devices including QLEDs, and the like.

REFERENCE SIGNS LIST

10 Display control circuit
20 Gate driver
22 Unit circuit
30 Source driver
40 Display portion
221 First output control circuit
222 Second output control circuit
223 Stabilization circuit
224 Reset circuit
320 Current monitoring unit
410 Pixel circuit
GL, GL(1) to GL(i) Scanning signal line
ML, ML(1) to ML(n) Monitoring control line
SL, SL(1) to SL(m) Data signal line
MCL, MCL(1) to MCL(m) Current monitoring line
L1 Organic EL element T1 Writing control transistor
T2 Drive transistor
T3 Monitoring control transistor
M1 to M12 Transistor in unit circuit
N1 to N4 First to fourth internal nodes
VRD, VRDB Stabilization control signal

The invention claimed is:

1. A display device comprising a pixel circuit that includes a display element configured to be driven by a current and a drive transistor configured to control a drive current of the display element, the display device having a function of performing monitoring processing that is a series of processes of measuring a current flowing in the pixel circuit outside the pixel circuit to compensate for deterioration of the drive transistor or the display element, the display device further comprising:
   a display portion including:
      a pixel matrix that includes n rows and m columns, the pixel matrix including n×m number of pixel circuits, where each of n and m is an integer being larger than or equal to two,
      a scanning signal line corresponding to each of the rows of the pixel matrix, and
      a data signal line corresponding to each of the columns of the pixel matrix;
   a data signal line drive circuit configured to apply a data signal to the data signal line;
   a scanning signal line drive circuit configured to apply a scanning signal to the scanning signal line;
   a first control signal line;
   a control circuit configured to control a potential of the first control signal line; and
   a first reference potential line configured to supply a first reference potential,
   wherein the scanning signal line drive circuit comprises a shift register that includes a plurality of unit circuits each connected to a corresponding scanning signal line, and
   each of the plurality of unit circuits includes:
   a first output control circuit including:
      a first internal node,
      a first output terminal connected to another unit circuit of the plurality of unit circuits, and
      a first output control transistor including a control terminal connected to the first internal node, a first conduction terminal, and a second conduction terminal connected to the first output terminal,
   a second output control circuit including:
      a second internal node to be applied with a potential having a logical level identical to a logical level of the first internal node,
      a second output terminal configured to output an on level signal for at least a part of a monitoring period for which the monitoring processing is performed, and
      a second output control transistor including a control terminal connected to the second internal node, a first conduction terminal, and a second conduction terminal connected to the second output terminal,
   a first internal node control transistor including:
      a control terminal to be supplied with a signal for causing a potential of the first internal node to be at an off level,
      a first conduction terminal connected to the first internal node, and
      a second conduction terminal connected to the first control signal line, a stabilization transistor including:
      a control terminal,
      a first conduction terminal connected to the first internal node, and
      a second conduction terminal connected to the first control signal line,
   a stabilization circuit configured to control a potential of the control terminal of the stabilization transistor based on the potential of the first internal node,
   a first reset transistor including:
      a control terminal,
      a first conduction terminal connected to the second output terminal, and
      a second conduction terminal connected to the first reference potential line, and
   a reset circuit connected to the first reference potential line and configured to control a potential of the control terminal of the first reset transistor based on the potential of the first internal node or a potential of the second internal node.

2. A display device comprising a pixel circuit that includes a display element configured to be driven by a current and a drive transistor configured to control a drive current of the display element, the display device having a function of performing monitoring processing that is a series of processes of measuring a current flowing in the pixel circuit outside the pixel circuit to compensate for deterioration of the drive transistor or the display element, the display device further comprising:
   a display portion including:
      a pixel matrix that includes n rows and m columns, the pixel matrix including n×m number of pixel circuits, where each of n and m is an integer being larger than or equal to two,
      a scanning signal line corresponding to each of the rows of the pixel matrix, and
      a data signal line corresponding to each of the columns of the pixel matrix;
   a data signal line drive circuit configured to apply a data signal to the data signal line;
   a scanning signal line drive circuit configured to apply a scanning signal to the scanning signal line;
   a first control signal line;
   a control circuit configured to control a potential of the first control signal line; and
   a first reference potential line configured to supply a first reference potential,
   wherein the scanning signal line drive circuit comprises a shift register that includes a plurality of unit circuits each connected to a corresponding scanning signal line, and
   each of the plurality of unit circuits includes:
   a first output control circuit including:
      a first internal node,
      a first output terminal connected to another unit circuit of the plurality of unit circuits, and
      a first output control transistor including a control terminal connected to the first internal node, a first conduction terminal, and a second conduction terminal connected to the first output terminal,
   a second output control circuit including:
      a second internal node to be applied with a potential having a logical level identical to a logical level of the first internal node, a second output terminal configured to output an on level signal for at least a part of a monitoring period for which the monitoring processing is performed, and a second output control transistor including a control terminal connected to the second internal node, a first conduction terminal, and a second conduction terminal connected to the second output terminal, a first internal node control transistor including:
  a control terminal to be supplied with a signal for causing a potential of the first internal node to be at an off level,
  a first conduction terminal connected to the first internal node, and
  a second conduction terminal connected to the first control signal line, a stabilization transistor including:
  a control terminal,
  a first conduction terminal connected to the first internal node, and
  a second conduction terminal connected to the first control signal line, and
a stabilization circuit configured to control a potential of the control terminal of the stabilization transistor based on the potential of the first internal node.

3. The display device according to claim 1,
wherein the monitoring period includes a writing period for measurement in which a data signal for causing a current depending on characteristics of the drive transistor or the display element to flow is written to the pixel circuit and a measurement period in which a current is measured outside the pixel circuit, and
the control circuit is configured to apply an on level potential to the first control signal line for at least a period from an end of the writing period for the measurement to an end of the measurement period.

4. The display device according to claim 3,
wherein the on level potential to be applied to the first control signal line is a potential for causing the first output control transistor to be turned on in a case where the potential is applied to the first internal node.

5. The display device according to claim 1,
wherein in a case where an on level potential is applied to the first control signal line in the monitoring period,
  in a unit circuit corresponding to a row being a target of the monitoring processing, the potential of the first internal node is a potential for causing the first output control transistor to be turned on, and the stabilization circuit is configured to output a potential for causing the stabilization transistor to be turned off, and
  in a unit circuit corresponding to a row not being a target of the monitoring processing, the potential of the first internal node is a potential for causing the first output control transistor to be turned off, and the stabilization circuit is configured to output a potential for causing the stabilization transistor to be turned off, and
in a case where an off level potential is applied to the first control signal line in the monitoring period,
  in a unit circuit corresponding to a row being a target of the monitoring processing, the potential of the first internal node is a potential for causing the first output control transistor to be turned on, and the stabilization circuit is configured to output a potential for causing the stabilization transistor to be turned off, and
  in a unit circuit corresponding to a row not being a target of the monitoring processing, the potential of the first internal node is a potential for causing the first output control transistor to be turned off, and the stabilization circuit is configured to output a potential for causing the stabilization transistor to be turned on.

6. The display device according to claim 1,
wherein the control circuit is configured to apply an off level potential to the first control signal line throughout a scanning period in which scanning of the scanning signal line is performed for image display, and
in the scanning period,
  in a unit circuit corresponding to a row to be selected, in a case where the potential of the first internal node is a potential for causing the first output control transistor to be turned on, the stabilization circuit is configured to output a potential for causing the stabilization transistor to be turned off, and in a case where the potential of the first internal node is a potential for causing the first output control transistor to be turned off, the stabilization circuit is configured to output a potential for causing the stabilization transistor to be turned on, and
  in a unit circuit corresponding to a row to be unselected, the potential of the first internal node is a potential for causing the first output control transistor to be turned off, and the stabilization circuit is configured to output a potential for causing the stabilization transistor to be turned on.

7. The display device according to claim 1, further comprising:
  a second control signal line; and
  a second reference potential line configured to supply a second reference potential,
wherein the control circuit is configured to further control a potential of the second control signal line,
the stabilization circuit includes:
  a third internal node connected to a control terminal of the stabilization transistor,
  a first stabilization control transistor including a control terminal connected to the first internal node, a first conduction terminal connected to the third internal node, and a second conduction terminal connected to the first reference potential line, and
  a second stabilization control transistor including a control terminal connected to the second reference potential line, a first conduction terminal connected to the second control signal line, and a second conduction terminal connected to the third internal node, and
the second reference potential is a potential for causing the second stabilization control transistor to be turned on.

8. The display device according to claim 7,
wherein an on current of the first stabilization control transistor is larger than an on current of the second stabilization control transistor.

9. The display device according to claim 7,
wherein the first control signal line is configured to apply a common potential to the plurality of unit circuits, and
the second control signal line is configured to apply a common potential to the plurality of unit circuits.

10. The display device according to claim 1,
wherein in the monitoring period,
  in a unit circuit corresponding to a row being a target of the monitoring processing, the potential of the first internal node is a potential for causing the first output control transistor to be turned on, and the reset circuit is configured to output a potential for causing the first reset transistor to be turned off, and in a unit circuit corresponding to a row not being a target of the monitoring processing, the potential of the first internal node is a potential for causing the first output control transistor to be turned off, and the reset circuit is configured to output a potential for causing the first reset transistor to be turned on.

11. The display device according to claim 1,
wherein in a scanning period in which scanning of the scanning signal line is performed for image display,
in a unit circuit corresponding to a row to be selected, in a case where the potential of the first internal node is a potential for causing the first output control transistor to be turned on, the reset circuit is configured to output a potential for causing the first reset transistor to be turned off, and in a case where the potential of the first internal node is a potential for causing the first output control transistor to be turned off, the reset circuit is configured to output a potential for causing the first reset transistor to be turned on, and in a unit circuit corresponding to a row to be unselected, the potential of the first internal node is a potential for causing the first output control transistor to be turned off, and the reset circuit is configured to output a potential for causing the first reset transistor to be turned on.

12. The display device according to claim 1, further comprising:
a second reference potential line configured to supply a second reference potential,
wherein the reset circuit includes:
a fourth internal node connected to the control terminal of the first reset transistor,
a first reset control transistor including a control terminal connected to the first internal node, a first conduction terminal connected to the fourth internal node, and a second conduction terminal connected to the first reference potential line, and
a second reset control transistor including a control terminal connected to the second reference potential line, a first conduction terminal connected to the second reference potential line, and a second conduction terminal connected to the fourth internal node, and
the second reference potential is a potential for causing the second reset control transistor to be turned on.

13. The display device according to claim 1,
wherein each of the plurality of unit circuits comprises a second reset transistor that includes a control terminal connected to the reset circuit, a first conduction terminal connected to the first output terminal, and a second conduction terminal connected to the first reference potential line.

14. The display device according to claim 1,
wherein a monitoring mode in which the monitoring processing is performed at any time and a non-monitoring mode in which the monitoring processing is not performed are prepared as an operation mode related to the monitoring processing, and
in a case where the operation mode is set to the monitoring mode, the control circuit is configured to apply an on level potential to the first control signal line for at least a part of the monitoring period and to apply an off level potential to the first control signal line for the other period.

15. The display device according to claim 14,
wherein the monitoring period includes a writing period for measurement in which a data signal for causing a current depending on characteristics of the drive transistor or the display element to flow is written to the pixel circuit and a measurement period in which a current is measured outside the pixel circuit, and
the control circuit is configured to apply the on level potential to the first control signal line for at least a period from an end of the writing period for the measurement to an end of the measurement period and to apply the off level potential to the first control signal line for the other period.

16. The display device according to claim 14,
wherein the control circuit is configured to apply the off level potential to the first control signal line throughout a period in which the operation mode is set to the non-monitoring mode.

17. The display device according to claim 1,
wherein pause driving is performable in which an operation of writing the data signal to the pixel circuit is intermittently performed,
a first mode in which the pause driving is not performed, a second mode in which the pause driving is performed and the monitoring processing is not performed, and a third mode in which the pause driving is performed and the monitoring processing is performed are prepared as an operation mode, and
the control circuit is
configured to apply an off level potential to the first control signal line throughout a period in which the operation mode is set to the first mode,
configured to apply an off level potential to the first control signal line throughout a period in which the operation mode is set to the second mode, and
configured to apply an on level potential to the first control signal line for at least a part of the monitoring period in a case where the operation mode is set to the third mode, and to apply an off level potential to the first control signal line for the other period.

18. The display device according to claim 17,
wherein the monitoring period includes at least an initialization period in which the pixel circuit is initialized, a writing period for measurement in which a data signal for causing a current depending on characteristics of the drive transistor or the display element to flow is written to the pixel circuit, and a measurement period in which a current is measured outside the pixel circuit, and
the control circuit is configured to apply an on level potential to the first control signal line throughout at least a period from a start of the initialization period to an end of the measurement period.

19. The display device according to claim 1,
wherein the display portion further includes a current monitoring line provided corresponding to each of the columns of the pixel matrix,
the data signal line drive circuit has a function of measuring a current flowing in the current monitoring line,
each of the plurality of pixel circuits includes:
the display element including a first terminal and a second terminal, the drive transistor including a control terminal, a first conduction terminal, and a second conduction terminal,
a writing control transistor including a control terminal connected to the scanning signal line, a first conduction terminal connected to the data signal line, and a second conduction terminal connected to the control terminal of the drive transistor,
a monitoring control transistor including a control terminal connected to the scanning signal line, a first conduction terminal connected to the second conduction terminal of the drive transistor and the first terminal of the display element, and a second conduction terminal connected to the current monitoring line, and
a capacitance element connected, at one end, to the control terminal of the drive transistor and configured to hold a potential of the control terminal of the drive transistor, and the second output terminal is connected to the corresponding scanning signal line.

\* \* \* \* \*